United States Patent
Hamaguchi et al.

(10) Patent No.: US 11,728,625 B2
(45) Date of Patent: Aug. 15, 2023

(54) LIGHT EMITTING ELEMENT

(71) Applicant: Sony Corporation, Tokyo (JP)

(72) Inventors: Tatsushi Hamaguchi, Kanagawa (JP); Jugo Mitomo, Kanagawa (JP); Rintaro Koda, Tokyo (JP)

(73) Assignee: Sony Corporation, Tokyo (JP)

( * ) Notice: Subject to any disclaimer, the term of this patent is extended or adjusted under 35 U.S.C. 154(b) by 386 days.

(21) Appl. No.: 16/956,376

(22) PCT Filed: Dec. 11, 2018

(86) PCT No.: PCT/JP2018/045490
§ 371 (c)(1),
(2) Date: Jun. 19, 2020

(87) PCT Pub. No.: WO2019/124163
PCT Pub. Date: Jun. 27, 2019

(65) Prior Publication Data
US 2020/0343694 A1  Oct. 29, 2020

(30) Foreign Application Priority Data
Dec. 22, 2017 (JP) .................. 2017-245998

(51) Int. Cl.
*H01S 5/183* (2006.01)
*H01S 5/343* (2006.01)
(Continued)

(52) U.S. Cl.
CPC ........ *H01S 5/34333* (2013.01); *H01S 5/0206* (2013.01); *H01S 5/0207* (2013.01);
(Continued)

(58) Field of Classification Search
CPC .. H01S 5/34333; H01S 5/0206; H01S 5/0207; H01S 5/0208; H01S 5/04257; H01S 5/18361
See application file for complete search history.

(56) References Cited

U.S. PATENT DOCUMENTS

| 5,309,468 A | * | 5/1994 | Makiuchi | ............. H01S 3/0933 372/50.23 |
| 6,026,111 A | | 2/2000 | Jiang | |

(Continued)

FOREIGN PATENT DOCUMENTS

| JP | H0883929 A | 3/1996 |
| JP | H11191636 A | 7/1999 |

(Continued)

OTHER PUBLICATIONS

International Search Report issued in Application No. PCT/JP2018/045490, dated Mar. 5, 2019.

*Primary Examiner* — Yuanda Zhang
(74) *Attorney, Agent, or Firm* — K&L Gates LLP

(57) ABSTRACT

A light emitting element of the present disclosure includes a compound semiconductor substrate 11, a stacked structure 20 including a GaN-based compound semiconductor, a first light reflection layer 41, and a second light reflection layer 42. The stacked structure 20 includes, in a stacked state a first compound semiconductor layer 21, an active layer 23, and a second compound semiconductor layer 22. The first light reflection layer 41 is disposed on the compound semiconductor substrate 11 and has a concave mirror section 43. The second light reflection layer 42 is disposed on a second surface side of the second compound semiconductor layer 22 and has a flat shape. The compound semiconductor substrate 11 includes a low impurity concentration com- (Continued)

pound semiconductor substrate or a semi-insulating compound semiconductor substrate.

8 Claims, 39 Drawing Sheets

(51) Int. Cl.
*H01S 5/02* (2006.01)
*H01S 5/042* (2006.01)
(52) U.S. Cl.
CPC ........ *H01S 5/0208* (2013.01); *H01S 5/04257* (2019.08); *H01S 5/18361* (2013.01)

(56) References Cited

U.S. PATENT DOCUMENTS

| | | | |
|---|---|---|---|
| 6,611,003 B1 | 8/2003 | Hatakoshi et al. | |
| 2002/0105988 A1* | 8/2002 | Park | H01S 5/18388 |
| | | | 372/45.01 |
| 2002/0181536 A1 | 12/2002 | Jeon | |
| 2005/0012109 A1 | 1/2005 | Kohno et al. | |
| 2006/0083283 A1 | 4/2006 | Kondo | |
| 2007/0280320 A1* | 12/2007 | Feezell | H01S 5/18341 |
| | | | 372/46.01 |
| 2017/0214218 A1* | 7/2017 | Tan | H01S 5/0267 |
| 2018/0366906 A1 | 12/2018 | Hamaguchi et al. | |
| 2019/0181615 A1* | 6/2019 | Choi | H01S 5/18397 |

FOREIGN PATENT DOCUMENTS

| | | |
|---|---|---|
| JP | 2000-022277 | 1/2000 |
| JP | 2000022277 A | 1/2000 |
| JP | 2002-237653 | 8/2002 |
| JP | 2002237653 A | 8/2002 |
| JP | 2002-368333 | 12/2002 |
| JP | 2002368333 A | 12/2002 |
| JP | 2003-124570 | 4/2003 |
| JP | 2003124570 A | 4/2003 |
| JP | 2005217147 A | 8/2005 |
| JP | 2006-114753 | 4/2006 |
| JP | 2006114753 A | 4/2006 |
| JP | 2007-157889 | 6/2007 |
| JP | 2007157889 A | 6/2007 |
| JP | 2017050308 A | 3/2017 |
| WO | 03/044872 | 5/2003 |
| WO | 03/044872 A1 | 5/2003 |
| WO | 2017/018017 | 2/2017 |
| WO | 2017018017 A1 | 2/2017 |
| WO | WO-2017018017 A | 2/2017 |

\* cited by examiner

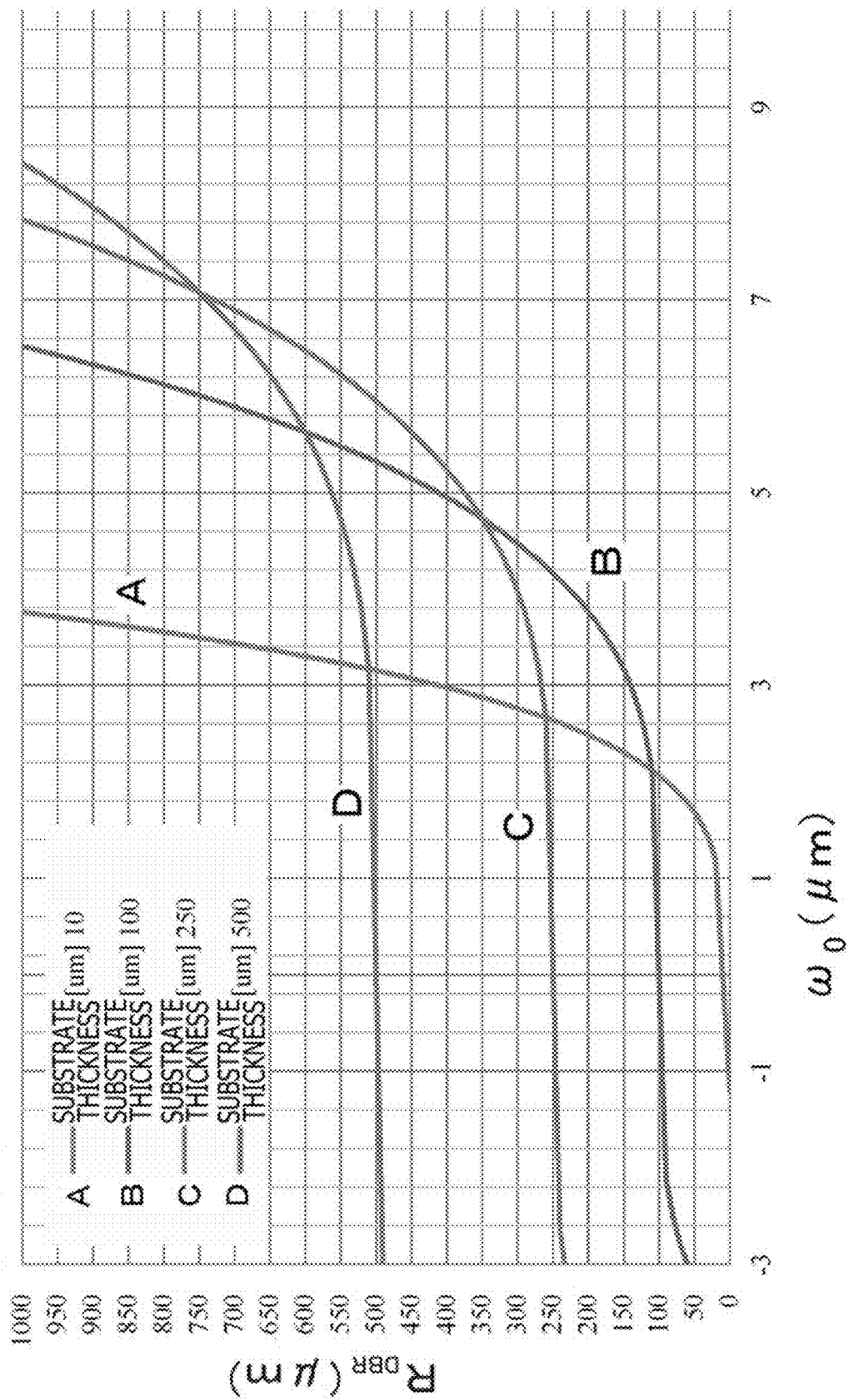

[FIRST LIGHT REFLECTION LAYER]

[FIRST LIGHT REFLECTION LAYER]

LIGHT EMITTING ELEMENT

TECHNICAL FIELD

The present disclosure relates to a light emitting element (specifically, a surface emitting laser element also called a vertical cavity laser, or VCSEL).

BACKGROUND ART

In a light emitting element including a surface emitting laser element (VCSEL), in general, laser light is resonated between two light reflection layers (Distributed Bragg Reflector layers, DBR layers), whereby laser oscillation is generated. In a surface emitting laser element having a stacked structure in which an n-type compound semiconductor layer, an active layer (light emitting layer) including a compound semiconductor, and a p-type compound semiconductor layer are stacked, in general, a second electrode including a transparent conductive material is formed on the p-type compound semiconductor layer, and a second light reflection layer including a stacked structure of an insulating material is formed on the second electrode. Besides, a first electrode and a first light reflection layer including a stacked structure of an insulating material are formed on the n-type compound semiconductor layer (in the case where an n-type compound semiconductor layer is formed on a conductive substrate, on an exposed surface of the substrate). Note that an axis passing through a center of a resonator including the two light reflection layers is referred to as a Z axis, and a virtual plane orthogonal to the Z axis is referred to as an XY plane, for convenience' sake.

CITATION LIST

Patent Literature

[PTL 1]
JP 2006-114753A
[PTL 2]
JP 2000-022277A

SUMMARY

Technical Problem

Incidentally, in the case where the stacked structure includes a GaAs-based compound semiconductor, the cavity length $L_{OR}$ is on the order of 1 μm. On the other hand, in the case where the stacked structure includes a GaN-based compound semiconductor, a cavity length $L_{OR}$ is as long as a several times the wavelength of the laser light emitted from the surface emitting laser element. Specifically, the cavity length $L_{OR}$ is much longer than 1 μm. When the cavity length $L_{OR}$ becomes thus long, laser oscillation becomes difficult to achieve because diffraction loss (described later) increases, unlike in the case of the conventional GaAs-based surface emitting laser element adopting a cavity length $L_{OR}$ on the order of 1 μm. In order to solve such a problem, there has been a technique of imparting a function as a concave mirror to the light reflection layer, as disclosed, for example, in JP 2006-114753A and JP 2000-022277A. However, these patent publications contain no mention with respect to the problem which is to be solved by the light emitting element of the present disclosure, such as an increased in diffraction loss due to an increase in cavity length $L_{OR}$.

Accordingly, it is an object of the present disclosure to provide a light emitting element having a configuration and structure with which it is possible to solve the problem of an increase in diffraction loss due to an increase in cavity length $L_{OR}$.

Solution to Problem

A light emitting element according to a first mode of the present disclosure for achieving the above object includes:
   a compound semiconductor substrate;
   a stacked structure including a GaN-based compound semiconductor;
   a first light reflection layer; and
   a second light reflection layer,
   in which the stacked structure includes, in a stacked state
      a first compound semiconductor layer that is formed on the compound semiconductor substrate and that has a first surface and a second surface opposite to the first surface,
      an active layer facing the second surface of the first compound semiconductor layer, and
      a second compound semiconductor layer that has a first surface facing the active layer and a second surface opposite to the first surface,
   the first light reflection layer is disposed on the compound semiconductor substrate and has a concave mirror section,
   the second light reflection layer is disposed on the second surface side of the second compound semiconductor layer and has a flat shape, and
   the compound semiconductor substrate includes a low impurity concentration compound semiconductor substrate or a semi-insulating compound semiconductor substrate.

A light emitting element according to a second mode of the present disclosure for achieving the above object includes:
   a stacked structure including a GaN-based compound semiconductor;
   a first light reflection layer; and
   a second light reflection layer,
   in which the stacked structure includes, in a stacked state
      a first compound semiconductor layer that has a first surface and a second surface opposite to the second surface,
      an active layer facing the second surface of the first compound semiconductor layer, and
      a second compound semiconductor layer that has a first surface facing the active layer and a second surface opposite to the first surface,
   the first light reflection layer is disposed on the first surface of the first compound semiconductor layer and has a concave mirror section,
   the second light reflection layer is disposed on the second surface side of the second compound semiconductor layer and has a flat shape, and
   the first compound semiconductor layer has an impurity concentration of equal to or less than $5 \times 10^{17}/cm^3$.

A light emitting element according to a third mode of the present disclosure for achieving the above object includes:
   a stacked structure including a GaN-based compound semiconductor;
   a first light reflection layer; and
   a second light reflection layer,
   in which the stacked structure includes, in a stacked state
      a first compound semiconductor layer that has a first surface and a second surface opposite to the first surface, an active layer facing the second surface of the first compound semiconductor layer, and a second compound semiconductor layer that has a first surface facing the active layer and a second surface opposite to the first surface, the first light reflection layer is disposed on the first surface side of the first compound semiconductor layer and has a concave mirror section, the second light reflection layer is disposed on the second surface side of the second compound semiconductor layer and has a flat shape, and the first compound semiconductor layer is formed with at least one low-resistance layer in parallel to a virtual plane occupied by the active layer.

BRIEF DESCRIPTION OF DRAWINGS

FIG. 37 is a graph depicting the relation between the value of $\omega_0$, the value of cavity length $L_{OR}$, and the value of radius of curvature $R_{DBR}$ of the concave mirror section of the first light reflection layer.

DESCRIPTION OF EMBODIMENTS

Figure 1:
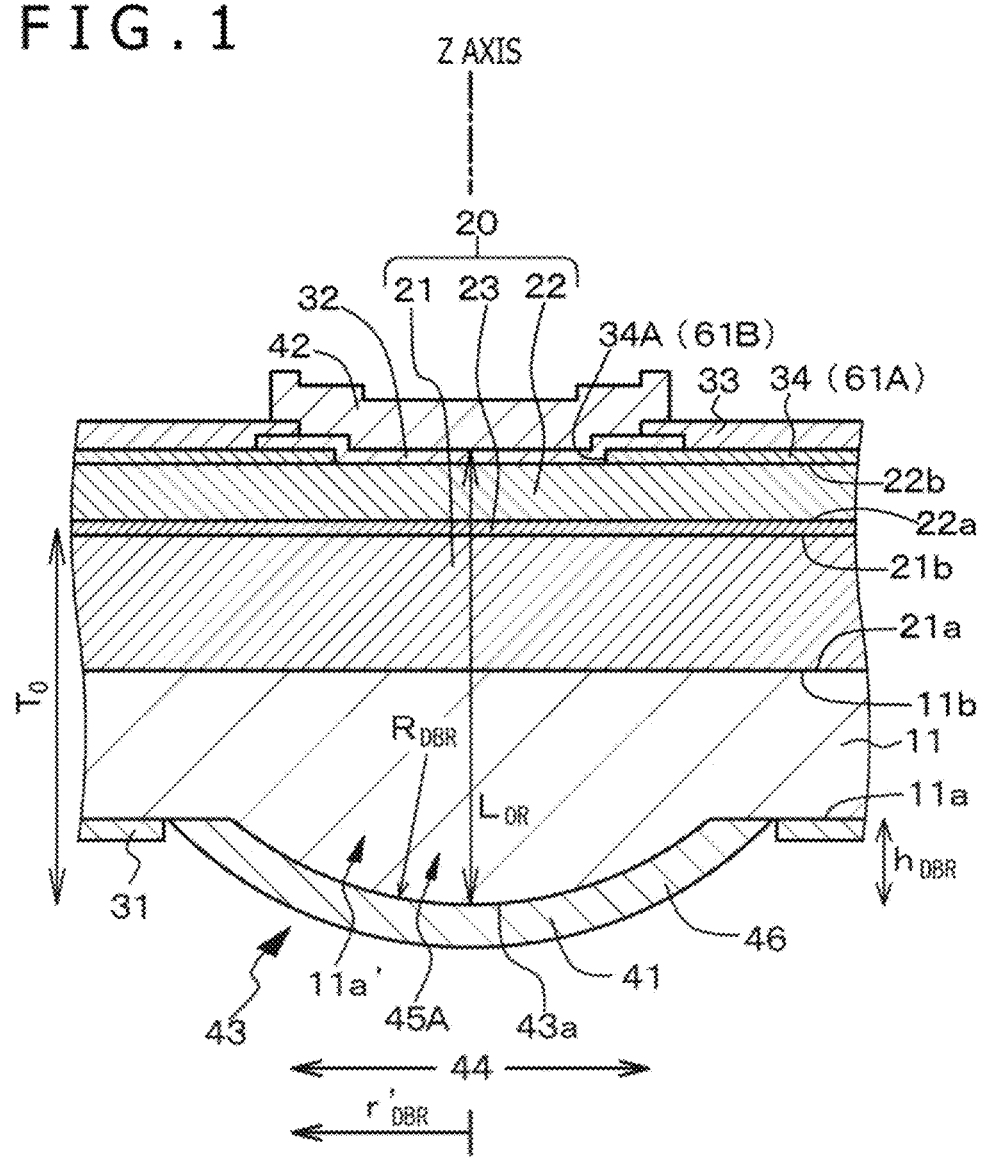
FIG. 1 is a schematic partial end view of a light emitting element of Embodiment 1.

The present disclosure will be described below based on embodiments thereof and referring to the drawings, but the present disclosure is not limited to the embodiments, and various numerical values and materials in the embodiments are merely illustrative. Note that the descriptions will be made in the following order.

1. General description of light emitting elements according to first to third modes of the present disclosure
2. Embodiment 1 (Light emitting element according to first mode of the present disclosure, light emitting element of (5-A)th configuration)
3. Embodiment 2 (Modification of Embodiment 1)
4. Embodiment 3 (Modifications of Embodiments 1 and 2, light emitting element of (5-B)th configuration)
5. Embodiment 4 (Light emitting element according to second mode of the present disclosure, light emitting element of sixth configuration)
6. Embodiment 5 (Modification of Embodiment 4)
7. Embodiment 6 (Third mode of the present disclosure, light emitting element according to (3-A)th mode)
8. Embodiment 7 (Modification of Embodiment 6, light emitting element according to (3-B)th mode)
9. Embodiment 8 (Modifications of Embodiments 6 and 7)
10. Embodiment 9 (Modifications of Embodiments 1 to 8, light emitting element of first configuration)
11. Embodiment 10 (Modifications of Embodiments 1 to 9, light emitting element of (2-A)th configuration)
12. Embodiment 11 (Modification of Embodiment 10, light emitting element of (2-B)th configuration)
13. Embodiment 12 (Modifications of Embodiments 10 and 11, light emitting element of (2-C)th configuration)
14. Embodiment 13 (Modifications of Embodiments 10 to 12, light emitting element of (2-D)th configuration)
15. Embodiment 14 (Modifications of Embodiments 10 to 13)
16. Embodiment 15 (Modifications of Embodiment 1 to 14, light emitting element of (3-A)th configuration, light emitting element of (3-B)th configuration, light emitting element of (3-C)th configuration, and light emitting element of (3-D)th configuration)
17. Embodiment 16 (Modifications of Embodiments 1 to 15, light emitting element of fourth configuration)
18. Embodiment 17 (Modification of Embodiment 16)
19. Embodiment 18 (Another modification of Embodiment 16)
20. Embodiment 19 (Modifications of Embodiments 16 to 18)
21. Others <General Description of Light Emitting Elements According to First to Third Modes of the Present Disclosure>

In regard of an n-type GaN-based compound semiconductor layer which is a main member constituting a resonator, it is known that a doping amount and light absorption have a clear correlation (for example, Journal of Crystal Growth, 312, 2010, 3569-3573), and a smaller doping amount is better. In a GaN-based compound semiconductor layer, it is a general practice to add a dopant thereto, in order to improve conductivity. For example, in the above-mentioned literature, only a doping amount of $1 \times 10^{18}/cm^3$ or more is mentioned, and there is no mention about a doping amount on the order of $1 \times 10^{16}/cm^3$. An effect of such a reduction in the doping amount for a substrate has not been paid attention to, also in regard of other light emitting elements than surface emitting laser.

In a light emitting element according to a first mode of the present disclosure, a impurity concentration of a low impurity concentration compound semiconductor substrate may be equal to or less than $5 \times 10^{17}/cm^3$; in such a mode, the low impurity concentration compound semiconductor substrate may include a GaN substrate. Alternatively, in the light emitting element according to the first mode of the present disclosure, a semi-insulating compound semiconductor substrate may be an indium-phosphorous (InP) substrate that contains iron atoms.

In the light emitting element according to the first mode of the present disclosure including the above-mentioned various preferred forms, a impurity concentration of the first compound semiconductor layer may be equal to or less than $5 \times 10^{17}/cm^3$. Alternatively, an average impurity concentration of the impurity concentration of the low impurity concentration compound semiconductor substrate and the impurity concentration of the first compound semiconductor layer may be equal to or less than $5 \times 10^{17}/cm^3$. In these configurations, let a sheet resistance of the first compound semiconductor layer be $R_1$, let a sheet resistance of the second compound semiconductor layer be $R_2$, and let a sheet resistance of a second electrode be $R_{EL-2}$, then $R_1 < R_2$ and $R_{EL-2} < R_2$ may be satisfied, a thickness of the first compound semiconductor layer may be equal to or more than $1 \times 10^{-5}$ m, a thickness of the second compound semiconductor layer may be equal to or less than $1 \times 10^{-5}$ m, an impurity concentration of the second compound semiconductor layer may be equal to or more than $5 \times 10^{17}/cm^3$, and, in this case, the second compound semiconductor layer may be doped with at least one impurity selected from the group consisting of magnesium and zinc. Further, in these configurations, the first compound semiconductor layer may be doped with at least one impurity selected from the group consisting of silicon, germanium, oxygen, and carbon.

In a light emitting element according to a second mode of the present disclosure, let the sheet resistance of the first compound semiconductor layer be $R_1$, let the sheet resistance of the second compound semiconductor layer be $R_2$, and let the sheet resistance of the second electrode be $R_{EL-2}$, then $R_1 < R_2$ and $R_{EL-2} < R_2$ may be satisfied.

In the light emitting element according to the second mode of the present disclosure including such a preferred form, the thickness of the first compound semiconductor layer may be equal to or more than $1 \times 10^{-5}$ m.

Further, in the light emitting element according to the second mode of the present disclosure including these preferred forms, the thickness of the second compound semiconductor layer may be equal to or less than $1 \times 10^{-5}$ m, the impurity concentration of the second compound semiconductor layer may be equal to or more than $5 \times 10^{17}/cm^3$, and, in this case, the second compound semiconductor layer may be doped with at least one impurity selected from the group consisting of magnesium and zinc.

Furthermore, in the light emitting element according to the second mode of the present disclosure including the above-mentioned preferred forms, the first compound semiconductor layer may be doped with at least one impurity selected from the group consisting of silicon, germanium, oxygen, and carbon.

In a light emitting element according to a third mode of the present disclosure, though depending on the configuration and structure of the light emitting element, a first light reflection layer is disposed on a compound semiconductor substrate, or, alternatively, has a concave mirror section and is disposed on a first surface of the first compound semiconductor layer.

The light emitting element according to the third mode of the present disclosure may further include:

a first electrode and a second electrode, in which the second electrode may be formed between the second light reflection layer and the second light reflection layer, the first compound semiconductor layer may be formed with an opening that reaches a low-resistance layer, and the first electrode in contact with the low-resistance layer is formed in the opening. Note that the light emitting element according to the third mode of the present disclosure in such a mode will be referred to as "the light emitting element according to the (3-A)th mode of the present disclosure" for convenience' sake.

In the light emitting element according to the (3-A)th mode of the present disclosure, the first electrode may be in contact with the low-resistance layer at a bottom portion of the opening, the bottom portion of the opening has a rugged shape, and when a base line that connects an axis passing through a center point of the first light reflection layer and a center point of the second light reflection layer with a center point of the bottom portion of the opening is drawn on the low-resistance layer, then an angle formed between the base line and a direction in which a recessed portion and a projected portion of the rugged shape extend may be 0 to 45 degrees.

With the bottom portion of the opening thus having a rugged shape, an increase in an area of contact with the low-resistance layer can be realized, and a reduction in the contact resistance between the low-resistance layer and the first electrode can be achieved. Moreover, by setting the angle formed between the base line and the direction in which the recessed portion and the projected portion of the rugged shape to a value of 0 to 45 degrees, the flow of a current flowing between the first electrode and the second electrode can be made smooth. Similar effects can be obtained also in a light emitting element according to a (3-B)th mode of the present disclosure to be described later.

Further, in the light emitting element according to the (3-A)th mode of the present disclosure including the above-mentioned preferred forms, a thickness of the low-resistance layer may be equal to or less than $1\times10^{-5}$ m.

Furthermore, in the light emitting element according to the (3-A)th mode of the present disclosure including these preferred forms, an impurity concentration of the low-resistance layer may be higher than the impurity concentration of the first compound semiconductor layer; in this case, the impurity concentration of the low-resistance layer may be equal to or more than $1\times10^{18}/cm^3$, and the impurity concentration of the first compound semiconductor layer may be equal to or less than $5\times10^{17}/cm^3$. Further, in these configurations, the low-resistance layer may be doped with at least one impurity selected from the group consisting of silicon, germanium, oxygen, and carbon.

Alternatively, in the light emitting element according to the (3-A)th mode of the present disclosure including these preferred forms, the first compound semiconductor layer may be formed on the compound semiconductor substrate, and the impurity concentration of the low-resistance layer may be higher than an average impurity concentration of the first compound semiconductor layer and the compound semiconductor substrate; in this case, the impurity concentration of the low-resistance layer may be equal to or more than $1\times10^{18}/cm^3$, and the average impurity concentration of the first compound semiconductor layer and the compound semiconductor substrate may be equal to or less than $5\times10^{17}/cm^3$. Further, in these configurations, the low-resistance layer, the first compound semiconductor layer, and the compound semiconductor substrate may be doped with at least one impurity selected from the group consisting of silicon, germanium, oxygen, and carbon.

Alternatively, in the light emitting element according to the (3-A)th mode of the present disclosure including these preferred forms, the low-resistance layer may include a GaN-based compound semiconductor material, and the GaN-based compound semiconductor material constituting the first compound semiconductor layer and the GaN-based compound semiconductor material constituting the low-resistance layer may be different in composition. In this case, bandgap of the GaN-based compound semiconductor material constituting the low-resistance layer may be narrower than bandgap of the GaN-based compound semiconductor material constituting the first compound semiconductor layer.

Alternatively, the light emitting element according to the third mode of the present disclosure further include:

a first electrode and a second electrode, in which the first compound semiconductor layer may be formed with at least two low-resistance layers, the first compound semiconductor layer may be formed with an opening ranging over the at least two low-resistance layers, and the first electrode in contact with the at least two low-resistance layers is formed in the opening. Note that the light emitting element according to the third mode of the present disclosure in such a mode will be referred to as "the light emitting element according to the (3-B)th mode of the present disclosure" for convenience' sake.

In the light emitting element according to the (3-B)th mode of the present disclosure, the first electrode may be in contact with one layer of the low-resistance layers at a bottom portion of the opening, the first electrode may be in contact with the other layer of the low-resistance layers at a side surface of the opening, the bottom portion of the opening may have a rugged shape, and when a base line that connects an axis passing through a center point of the first light reflection layer and a center point of the second light reflection layer with a center point of the bottom portion of the opening is drawn on the low-resistance layer, the angle formed between the base line and a direction in which a recessed portion and a projected portion of the rugged shape extend may be 0 to 45 degrees.

Further, in the light emitting element according to the (3-B)th mode including the above-mentioned preferred forms, let an oscillation wavelength be $\lambda_0$, let an equivalent refractive index of the plurality of low-resistance layers and that part of the first compound semiconductor layer which is located between the low-resistance layer and the low-resistance layer be $n_{1\text{-}eq}$, then the thickness of the low-resistance layer may be equal to or less than $\lambda_0/(4\cdot n_{1\text{-}eq})$. The equivalent refractive index will be described in detail later.

Further, in the light emitting element according to the (3-B)th mode of the present disclosure including these preferred forms, let a distance between the low-resistance layer and the low-resistance layer be $L_{HCL}$, then $$0.9\times\{(m\cdot\lambda_0)/(2\cdot n_{1\text{-}eq})\}\leq L_{HCL}\leq 1.1\times\{(m\cdot\lambda_0)/(2\cdot n_{1\text{-}eq})\}$$

may be satisfied, where m is 1, or 2 or more any integer including 1.

Furthermore, in the light emitting element according to the (3-B)th mode of the present disclosure including these preferred forms, the thickness of the low-resistance layer may be equal to or less than $1\times10^{-5}$ m, the impurity concentration of the low-resistance layer may be higher than the impurity concentration of the first compound semiconductor layer, and, in this case, the impurity concentration of the low-resistance layer may be equal to or more than $1\times10^{18}/cm^3$, and the impurity concentration of the first compound semiconductor layer may be equal to or less than $5\times10^{17}/cm^3$. Further, in these configurations, the low-resistance layer (and the first compound semiconductor layer) may be doped with at least one impurity selected from the group consisting of silicon, germanium, oxygen, and carbon.

Alternatively, in the light emitting element according to the (3-B)th mode of the present disclosure including these preferred forms, the first compound semiconductor layer may be formed on the compound semiconductor substrate, the impurity concentration of the low-resistance layer may be higher than an average impurity concentration of the first compound semiconductor layer and the compound semiconductor substrate, in this case, the impurity concentration of the low-resistance layer may be equal to or more than $1\times10^{18}/cm^3$, while the average impurity concentration of the first compound semiconductor layer and the compound semiconductor substrate may be equal to or less than $5\times10^{17}/cm^3$, and in these cases, the low-resistance layer, the first compound semiconductor layer, and the compound semiconductor substrate may be doped with at least one impurity selected from the group consisting of silicon, germanium, oxygen, and carbon.

Alternatively, in the light emitting element according to the (3-B)th mode of the present disclosure including these preferred forms, the low-resistance layer may include a GaN-based compound semiconductor material, the GaN-based compound semiconductor material constituting the first compound semiconductor layer and the GaN-based compound semiconductor material constituting the low-resistance layer may be different in composition, and, in this case, the bandgap of the GaN-based compound semiconductor material constituting the low-resistance layer may be narrower than the bandgap of the GaN-based compound semiconductor material constituting the first compound semiconductor layer.

Further, in the light emitting element according to the third mode of the present disclosure including these preferred forms and configurations, at least one low-resistance layer may be located at a minimum amplitude portion generated in a standing wave of light formed inside the stacked structure. In addition, the active layer may be located in a maximum amplitude portion generated in the standing wave of light formed inside the stacked structure.

The light emitting element according to the third mode of the present disclosure including the above-mentioned preferred forms and configurations may be combined with the light emitting element according to the first mode of the present disclosure, the light emitting element according to the third mode of the present disclosure including the above-mentioned preferred forms and configurations may be combined with the light emitting element according to the second mode of the present disclosure, and the light emitting element according to the third mode of the present disclosure including the above-mentioned preferred forms and configurations may be combined with the light emitting element according to the first mode of the present disclosure and the light emitting element according to the second mode of the present disclosure. In other words, for example, let the sheet resistance of the first compound semiconductor layer be $R_1$, let the sheet resistance of the second compound semiconductor layer be $R_2$, and let the sheet resistance of the second electrode be $R_{EL\text{-}2}$, then $R_1<R_2$ and $R_{EL\text{-}2}<R_2$ may be satisfied, the thickness of the first compound semiconductor layer may be equal to or more than $1\times10^{-5}$ m, the thickness of the second compound semiconductor layer may be equal to or less than $1\times10^{-5}$ m, the impurity concentration of the second compound semiconductor layer may be equal to or more than $5\times10^{17}/cm^3$, and the second compound semiconductor layer may be doped with at least one impurity selected from the group consisting of magnesium and zinc.

Further, in the light emitting elements according to the first to third modes of the present disclosure including the above-mentioned preferred forms and configurations (hereinafter these will be referred to generically as "the light emitting element or the like of the present disclosure"), let the cavity length be $L_{OR}$, then $1\times10^{-5}$ m$\leq L_{OR}$ may be satisfied.

In addition, in the light emitting element or the like of the present disclosure including the above-mentioned preferred configuration, a figure drawn by an interface, with the first compound semiconductor layer or the compound semiconductor substrate, of a part or the whole of the concave mirror section when the concave mirror section is cut along a virtual plane including the stacking direction of the stacked structure may be a part of a circle or a part of a parabola. The figure may not strictly a part of a circle or may not strictly be a part of a parabola. In other words, the cases where the figure is substantially a part of a circle or is substantially a part of a parabola are included in the case of "the figure is a part of a circle or a part of a parabola." Such a part (region) of the first light reflection layer that is a part of a circle or a part of a parabola may be referred to as "an effective region of the concave mirror section of the first light reflection layer." The figure drawn by the interface of a part of the concave mirror section that faces the stacked structure can be obtained by measuring the shape of the interface by a measuring instrument and analyzing the obtained data based on the least squares method.

Further, in the light emitting element or the like of the present disclosure including the above-mentioned various preferred configurations, the second compound semiconductor layer may be provided with a current injection region and a current non-injection region surrounding the current injection region, and a shortest distance $D_{CI}$ from an area center of gravity of the current injection region to an interface between the current injection region and the current non-injection region may satisfy the following formula. Here, a light emitting element of such a configuration is referred to as a "light emitting element of the first configuration" for convenience' sake. For the deduction of the following formula, see, for example, H. Kogelnik and T. Li, "Laser Beams and Resonators," Applied Optics/Vol. 5, No. 10/October 1966. In addition, $\omega_0$ is referred to also as beam waist radius.

$$D_{CI} \geq \omega_0/2 \tag{1-1}$$

provided that $$\omega_0^2 = (\lambda_0/\pi)\{L_{OR}(R_{DBR}-L_{OR})\}^{1/2} \tag{1-2}$$

where $\lambda_0$: wavelength (oscillation wavelength) of light mainly emitted from light emitting element $L_{OR}$: cavity length $R_{DBR}$: radius of curvature of concave mirror section of first light reflection layer.

Figure 35:
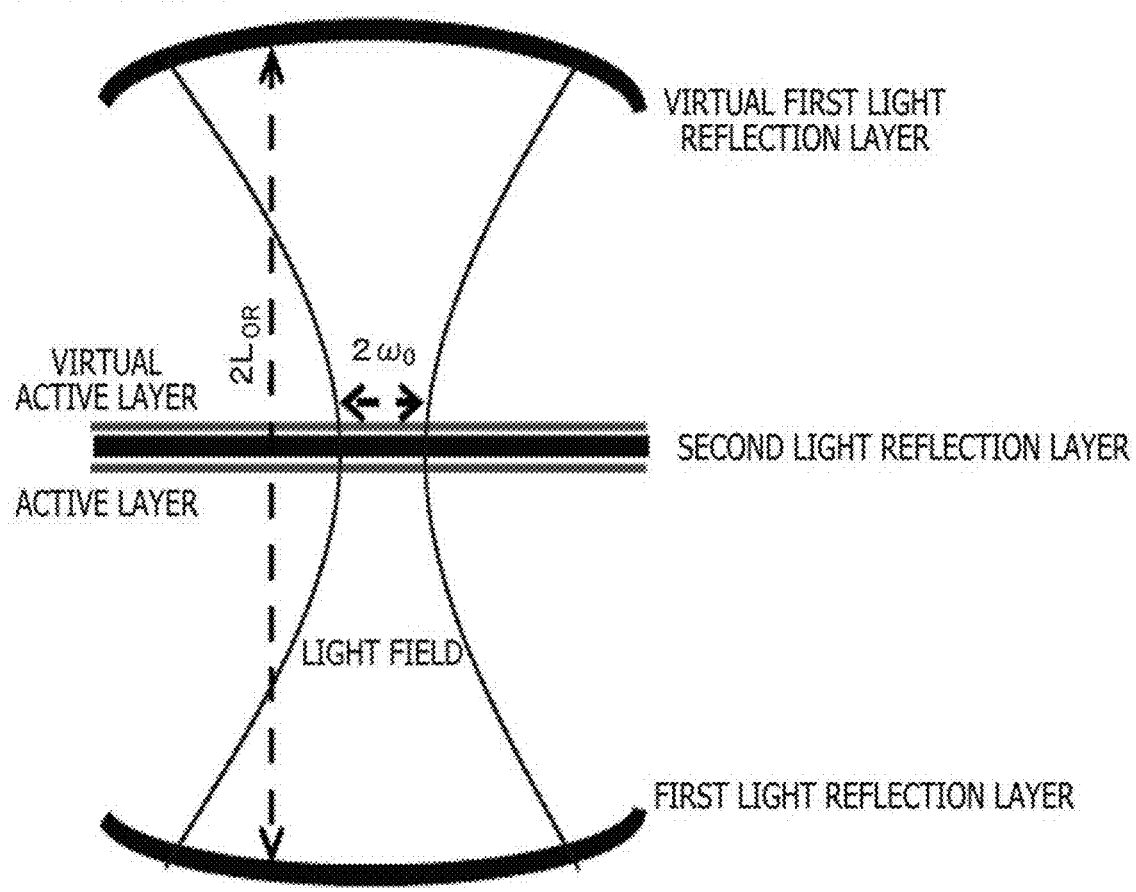
FIG. 35 is a conceptual diagram when a Fabry-Perot resonator sandwiched between two concave mirror sections having the same radius of curvature is assumed.
Figure 36:
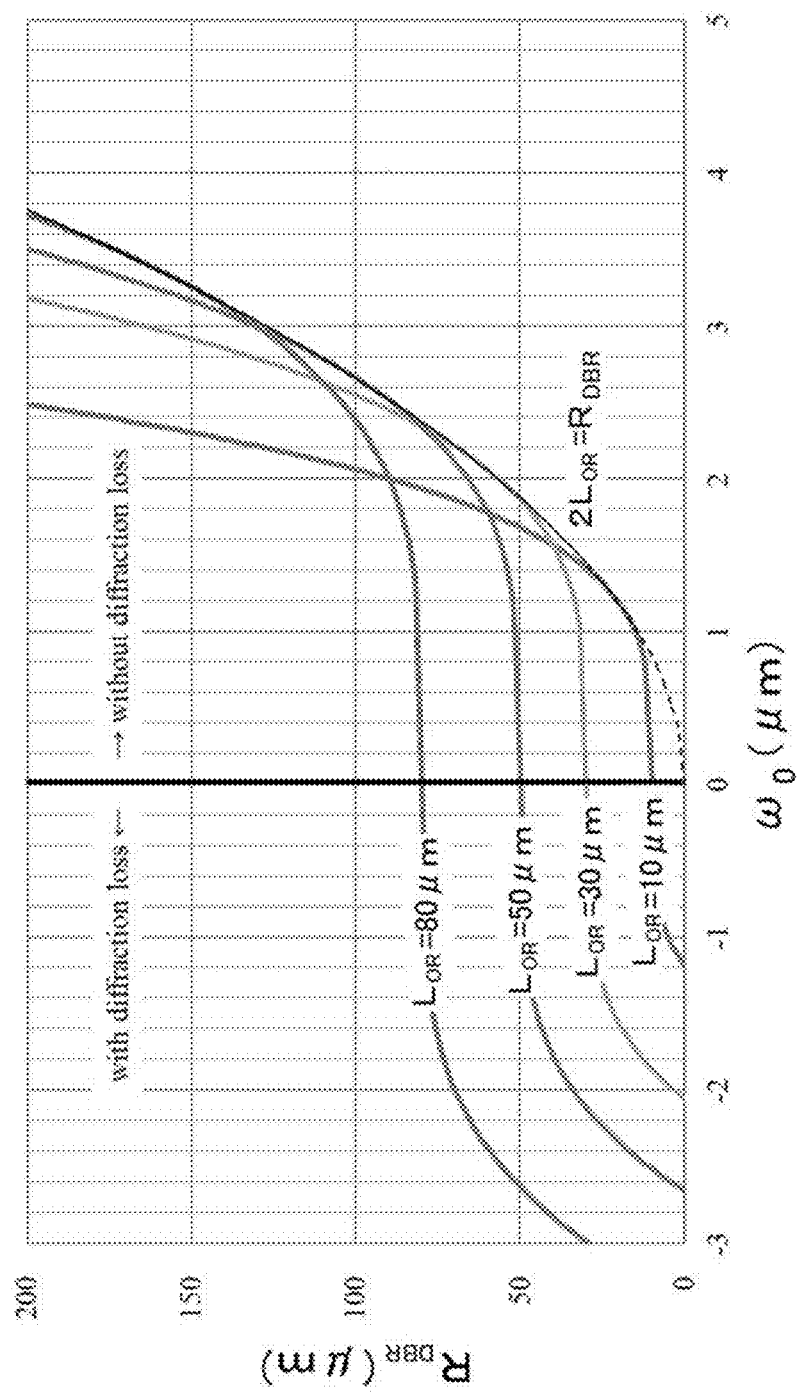
FIG. 36 is a graph depicting a relation between a value of $\omega_0$, a value of cavity length $L_{OR}$, and a value of radius of curvature $R_{DBR}$ of a concave mirror section of a first light reflection layer.
Figure 38A:
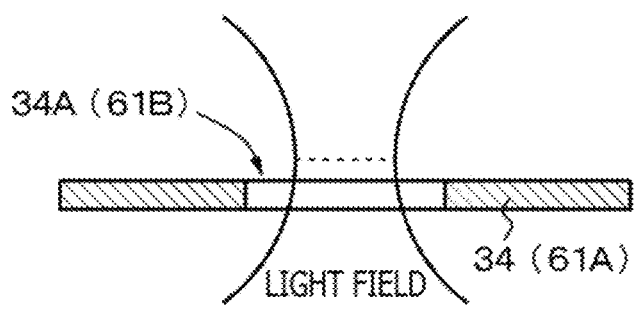
FIGS. 38A and 38B are a diagram depicting schematically a concentrated state of laser light when the value of $\omega_0$ is "positive," and a diagram depicting schematically a concentrated state of laser light when the value of $\omega_0$ is "negative," respectively.
Figure 38B:
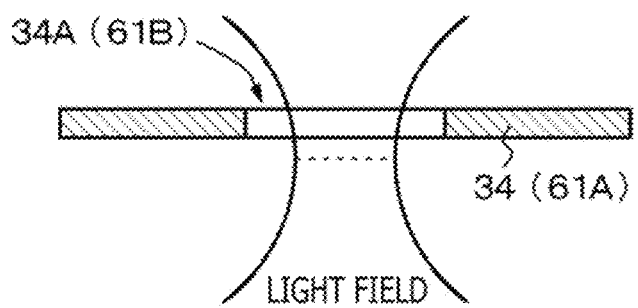

While the light emitting element or the like of the present disclosure has the concave mirror section only in the first light reflection layer, in consideration of the symmetry of the second light reflection layer with respect to a flat plate mirror, the resonator can be extended to a Fabry-Perot resonator sandwiched between two concave mirror sections having the same radius of curvature (see the schematic diagram of FIG. 35). In this instance, the cavity length of a virtual Fabry-Perot resonator is twice the cavity length $L_{OR}$. Graphs depicting the relation between the value of $\omega_0$ and the value of cavity length $L_{OR}$ and the value of the radius of curvature $R_{DBR}$ of the concave mirror section of the first light reflection layer are depicted in FIGS. 36 and 37. That the value of $\omega_0$ is "positive" means that the laser light is schematically in the state of FIG. 38A, and that the value of $\omega_0$ is "negative" means that the laser light is schematically in the state of FIG. 38B. The state of the laser light may be the state depicted in FIG. 38A, or may be the state depicted in FIG. 38B. It is to be noted, however, that the virtual Fabry-Perot resonator having the two concave mirror sections, when the radius of curvature $R_{DBR}$ becomes smaller than the cavity length $L_{OR}$, is brought into the state depicted in FIG. 38B, so that confinement becomes excessive and a diffraction loss is generated. Here, the "diffraction loss" refers to a phenomenon in which, since light generally tends to spread due to a diffraction effect, the laser light reciprocating in the resonator gradually comes to disperse to the outside of the resonator. Therefore, the state depicted in FIG. 38A is preferred in which the radius of curvature $R_{DBR}$ is greater than the cavity length $L_{OR}$. When the active layer is disposed close to the flat light reflection layer of the two light reflection layers, specifically, the second light reflection layer, the light field is concentrated more in the active layer. In other words, confinement of the light field in the active layer is strengthened, and laser oscillation is facilitated. The position of the active layer, that is, the distance from that surface of the second light reflection layer which faces the second compound semiconductor layer to the active layer, may be, for example, $\lambda_0/2$ to $10\lambda_0$, which is not limitative.

Incidentally, in the case where a region into which the light reflected by the first light reflection layer is concentrated is not included in a current injection region corresponding to a region in which the active layer has a gain owing to current injection, induction release of light from a carrier may be hindered, and, eventually, laser oscillation may be hindered. With the above-mentioned formulas (1-1) and (1-2) satisfied, it is ensured that the region into which the light reflected by the first light reflection layer is concentrated is included in the current injection region, and laser oscillation can be achieved securely.

The light emitting element of the first configuration may further include:

a mode loss action part that is provided on the second surface of the second compound semiconductor layer and that constitutes a mode loss action region acting on variation in oscillation mode loss;

a second electrode formed over a range of a position on the second surface of the second compound semiconductor layer to a position on the mode loss action part; and a first electrode electrically connected to the first compound semiconductor layer, in which the second light reflection layer is formed on the second electrode, the stacked structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

In the light emitting element of the first configuration including such a preferred configuration, a radius $r'_{DBR}$ of the effective region in the concave mirror section of the first light reflection layer may satisfy $\omega_0 \le r'_{DBR} \le 20 \cdot \omega_0$, preferably $\omega_0 \le r'_{DBR} \le 10 \cdot \omega_0$. Alternatively, a value of $r'_{DBR}$ may be, for example, $r'_{DBR} \le 1 \times 10^{-4}$ m, preferably $r'_{DBR} \le 5 \times 10^{-5}$ m. In addition, a height $h_{DBR}$ of a base section which will be described later may be, for example, $h_{DBR} \le 5 \times 10^{-5}$ m. Further, in the light emitting element of the first configuration including such a preferred configuration, $D_{CI} \ge \omega_0$ may be satisfied. Furthermore, in the light emitting element of the first configuration including such a preferred configuration, $R_{DBR} \le 1 \times 10^{-3}$ m, preferably $1 \times 10^{-5}$ m $\le R_{DBR} \le 1 \times 10^{-3}$ m, more preferably $1 \times 10^{-5}$ m $\le R_{DBR} \le 1 \times 10^{-4}$ m may be satisfied.

Besides, the light emitting element or the like of the present disclosure including the above-mentioned preferred forms may further include:

a mode loss action part that is provided on the second surface of the second compound semiconductor layer and that constitutes a mode loss action region acting on variation in oscillation mode loss;

a second electrode formed over a range of a position on the second surface of the second compound semiconductor layer to a position on the mode loss action part; and a first electrode electrically connected to the first compound semiconductor layer, in which the second light reflection layer may be formed on the second electrode, the stacked structure may be formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region may overlap with each other. Here, a light emitting element of such a configuration is referred to as a "light emitting element of the second configuration" for convenience' sake.

Alternatively, the light emitting element or the like of the present disclosure including the above-mentioned preferred forms may further include:

a second electrode formed on the second surface of the second compound semiconductor layer;

a second light reflection layer formed on the second electrode;

a mode loss action part that is provided on the first surface of the first compound semiconductor layer and that constitutes a mode loss action region acting on variation in oscillation mode loss; and a first electrode electrically connected to the first compound semiconductor layer, in which the first light reflection layer may be formed over a range of a position on the first surface of the first compound semiconductor layer to a position on the mode loss action part, the stacked structure may be formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region may overlap with each other. Here, a light emitting element of such a configuration is referred to as a "light emitting element of the third configuration" for convenience' sake. The prescription for the light emitting element of the third configuration may be applied to the light emitting element of the first configuration.

In the light emitting element of the second configuration or the light emitting element of the third configuration, the stacked structure is formed with the current non-injection region (a generic name for the current non-injection inside region and the current non-injection outside region), and, in this case, specifically, in the thickness direction, the current non-injection region may be formed in a region on the second electrode side of the second compound semiconductor layer, may be formed on the whole part of the second compound semiconductor layer, may be formed on the second compound semiconductor layer and the active layer, or may be formed over a range of the second compound semiconductor layer to a part of the first compound semiconductor layer. The orthogonal projection image of the mode loss action region and the orthogonal projection image of the current non-injection outside region overlap with each other, but, in a region sufficiently remote from the current injection region, the orthogonal projection image of the mode loss action region and the orthogonal projection image of the current non-injection outside region may not overlap with each other.

In the light emitting element of the second configuration, the current non-injection outside region may be located on a lower side of the mode loss action region.

In the light emitting element of the second configuration including the above-mentioned preferred configurations, let an area of the orthogonal projection image of the current injection region be $S_1$ and let an area of the orthogonal projection image of the current non-injection inside region be $S_2$, then $$0.01 \le S_1/(S_1+S_2) \le 0.7$$

may be satisfied. In addition, in the light emitting element of the third configuration, let an area of the orthogonal projection image of the current injection region be $S_1'$ and let an area of the orthogonal projection image of the current non-injection inside region be $S_2'$, then $$0.01 \le S_1'/(S_1'+S_2') \le 0.7$$

may be satisfied. It is to be noted, however, that a range of $S_1/(S_1'+S_2)$ and a range of $S_1'/(S_1'+S_2')$ are not restricted or limited to the above-mentioned ranges.

In the light emitting element of the second configuration or the light emitting element of the third configuration including the above-mentioned configurations, the current non-injection inside region and the current non-injection outside region may be formed by ion injection into the stacked structure. The light emitting element of such a configuration will be referred to as a "light emitting element of the (2-A)th configuration" or a "light emitting element of the (3-A)th configuration" for convenience' sake. In this case, ion species may be at least one kind of ion (i.e., one kind of ion or two or more kinds of ions) selected from the group consisting of boron, proton, phosphorus, arsenide, carbon, nitrogen, fluorine, oxygen, germanium, and silicon.

Alternatively, in the light emitting element of the second configuration or the light emitting element of the third configuration including the above-mentioned preferred configuration, the current non-injection inside region and the current non-injection outside region may be formed by irradiation with plasma of the second surface of the second compound semiconductor layer, or an ashing treatment of the second surface of the second compound semiconductor layer, or a reactive ion etching treatment of the second surface of the second compound semiconductor layer. A light emitting element of such a configuration will be referred to as a "light emitting element of the (2-B)th configuration" or a "light emitting element of the (3-B)th configuration" for convenience' sake. In these treatments, the current non-injection inside region and the current non-injection outside region are exposed to plasma particles, and, therefore, deterioration of the conductivity of the second compound semiconductor layer is generated, and the current non-injection inside region and the current non-injection outside region are brought to a high-resistance state. In other words, the current non-injection inside region and the current non-injection outside region may be formed by exposure of the second surface of the second compound semiconductor layer to the plasma particles. Specific examples of the plasma particles include argon, oxygen, and nitrogen.

Alternatively, in the light emitting element of the second configuration or the light emitting element of the third configuration including the above-mentioned preferred configurations, the second light reflection layer may have a region that reflects or scatters the light from the first light reflection layer toward an outside of a resonator structure including the first light reflection layer and the second light reflection layer. A light emitting element of such a configuration will be referred to as a "light emitting element of the (2-C)th configuration" or a "light emitting element of the (3-C)th configuration" for convenience' sake. Specifically, that region of the second light reflection layer which is located on an upper side of a side wall of the mode loss action part (a side wall of an opening provided in the mode loss action part) has an inclination of a normally tapered form or a region curved to be protuberant toward the first light reflection layer. Alternatively, in the light emitting element of the second configuration or the light emitting element of the third configuration including the above-mentioned preferred configurations, the first light reflection layer may have a region that reflects or scatters the light from the second light reflection layer toward the outside of the resonator structure including the first light reflection layer and the second light reflection layer. Specifically, a partial region of the first light reflection layer is only required to form with an inclination of a normally tapered form or with a curved portion protuberant toward the second light reflection layer, or, alternatively, that region of the first light reflection layer which is located on an upper side of a side wall of the mode loss action part (a side wall of an opening provided in the mode loss action part) is only required to form with an inclination of a normally tapered form or with a region curved to be protuberant toward the second light reflection layer. In addition, a configuration in which light is scattered toward the outside of the resonator structure including the first light reflection layer and the second light reflection layer may be adopted by scattering the light at a boundary (side wall edge portion) between a top surface of the mode loss action part and a side wall of an opening provided in the mode loss action part.

In the light emitting element of the (2-A)th configuration, the light emitting element of the (2-B)th configuration or the light emitting element of the (2-C)th configuration described above, let an optical distance from the active layer in the current injection region to the second surface of the second compound semiconductor layer be $L_2$ and let an optical distance from the active layer in the mode loss action region to a top surface of the mode loss action part be $L_0$, then $$L_0 > L_2$$

may be satisfied. In addition, in the light emitting element of the (3-A)th configuration, the light emitting element of the (3-B)th configuration, or the light emitting element of the (3-C)th configuration described above, let an optical distance from the active layer in the current injection region to the first surface of the first compound semiconductor layer be $L_1'$ and let an optical distance from the active layer in the mode loss action region to the top surface of the mode loss action part be $L_0'$, then $$L_0' > L_1'$$

may be satisfied. Further, in the light emitting element of the (2-A)th configuration, the light emitting element of the (3-A)th configuration, the light emitting element of the (2-B)th configuration, the light emitting element of the (3-B)th configuration, the light emitting element of the (2-C)th configuration, or the light emitting element of the (3-C)th configuration described above including these configurations, light having a higher order mode generated may be dissipated by the mode loss action region toward the outside of the resonator structure including the first light reflection layer and the second light reflection layer, whereby oscillation mode loss may be increased. In other words, the light field intensity of a fundamental mode and a higher order mode generated is reduced more in going away from a Z axis in the orthogonal projection image of the mode loss action region by the presence of the mode loss action region acting on variation in oscillation mode loss. In this case, the mode loss in the higher order mode is greater than the reduction in the light field intensity in the fundamental mode, so that the fundamental mode can be further stabilized, and the mode loss can be suppressed as compared to the case where the current injection inside region is absent; accordingly, a lowering in a threshold current can be realized.

In addition, in the light emitting element of the (2-A)th configuration, the light emitting element of the (3-A)th configuration, the light emitting element of the (2-B)th configuration, the light emitting element of the (3-B)th configuration, the light emitting element of the (2-C)th configuration, or the light emitting element of the (3-C)th configuration described above, the mode loss action part may include a dielectric material, a metallic material, or an alloy material. Examples of the dielectric material include $SiO_X$, $SiN_X$, $AlN_X$, $AlO_X$, $TaO_X$, and $ZrO_X$, and examples of the metallic material and alloy material include titanium, gold, platinum, and alloys thereof, but these materials are not limitative. By the mode loss action part including any of these materials, light can be absorbed and mode loss can be increased. Alternatively, the mode loss can be controlled by disturbing phase, without directly absorbing light. In this case, the mode loss action part may include a dielectric material, and an optical thickness $t_0$ of the mode loss action part may be deviated from an integer times of ¼ of a wavelength $\lambda_0$ of the light generated in the light emitting element. In other words, the phase of light going around in the resonator and forming a standing wave may be disturbed at the mode loss action part, to break the standing wave, whereby a mode loss corresponding thereto can be given. Alternatively, the mode loss action part may include a dielectric material, and the optical thickness $t_0$ of the mode loss action part (having a refractive index $n_0$) may be an integer times of ¼ of the wavelength $\lambda_0$ of the light generated in the light emitting element. In other words, the optical thickness $t_0$ of the mode loss action part may be such as not to disturb the phase of the light generated in the light emitting element and not to break the standing wave. It is to be noted, however, that the optical thickness to may not be strictly an integer times of ¼ of the wavelength $\lambda_0$, but may be such that $$(\lambda_0/4n_0) \times m - (\lambda_0/8n_0) \le t_0 \le (\lambda_0/4n_0) \times 2m + (\lambda_0/8n_0)$$

is satisfied. Alternatively, the mode loss action part may include a dielectric material, a metallic material, or an alloy material, whereby the light passing through the mode loss action part can be made to undergo phase disturbance or absorption, by the mode loss action part. With these configurations adopted, control of oscillation mode loss can be performed with a higher degree of freedom, and the degree of freedom in designing the light emitting element can be further enhanced.

Alternatively, in the light emitting element of the second configuration including the above-mentioned preferred configurations, a projected portion may be formed on the second surface side of the second compound semiconductor layer, and the mode loss action part may be formed on that region of the second surface of the second compound semiconductor layer which surrounds the projected portion. A light emitting element of such a configuration will be referred to as a "light emitting element of the (2-D)th configuration" for convenience' sake. The projected portion occupies the current injection region and the current non-injection inside region. In this case, let an optical distance from the active layer in the current injection region to the second surface of the second compound semiconductor layer be $L_2$ and let an optical distance from the active layer in the mode loss action region to the top surface of the mode loss action part be $L_0$, then $$L_0 < L_2$$

may be satisfied. Further, in these cases, the light having a higher order mode generated may be confined in the current injection region and the current non-injection inside region by the mode loss action region, whereby oscillation mode loss may be reduced. In other words, the light field intensities of a fundamental mode and a higher order mode generated are increased in the orthogonal projection images of the current injection region and the current non-injection inside region, due to the presence of the mode loss action region that acts on variation in oscillation mode loss. Further, in these cases, the mode loss action part may include a dielectric material, a metallic material, or an alloy material. Here, examples of the dielectric material, the metallic material, or the alloy material include the above-mentioned various materials.

Alternatively, in the light emitting element of the third configuration including the above-mentioned preferred modifications, a projected portion may be formed on the first surface side of the first compound semiconductor layer, and the mode loss action part may be formed on that region of the first surface of the first compound semiconductor layer which surrounds the projected portion, or the mode loss action part includes that region of the first compound semiconductor layer which surrounds the projected portion. A light emitting element of such a configuration will be referred to as a "light emitting element of the (3-D)th configuration" for convenience' sake. The projected portion coincides with the orthogonal projection image of the current injection region and the current non-injection inside region. In this case, let an optical distance from the active layer in the current injection region to the first surface of the first compound semiconductor layer be $L_1'$ and let an optical distance from the active layer in the mode loss action region to the top surface of the mode loss action part be $L_0'$, then $$L_0' < L_1'$$

may be satisfied; further, in these cases, the light having a higher order mode generated may be confined in the current injection region and the current non-injection inside region by the mode loss action region, whereby oscillation mode loss may be reduced, and, further, in these cases, the mode loss action part may include a dielectric material, a metallic material, or an alloy material. Here, examples of the dielectric material, the metallic material, or the alloy material include the above-mentioned various materials.

Furthermore, in the light emitting element or the like of the present disclosure including the above-mentioned preferred forms and configurations (inclusive of the light emitting elements of the first to third configurations), the stacked structure including the second electrode may be formed with a light absorbing material layer parallel to a virtual plane occupied by the active layer. Here, a light emitting element of such a configuration is referred to as a "light emitting element of the fourth configuration" for convenience' sake. The light absorbing material layer, depending on the formation position, may function also as a low-resistance layer.

In the light emitting element of the fourth configuration, it is preferable that at least two light absorbing material layers are formed.

In the light emitting element of the fourth configuration including the above-mentioned preferred configurations, let an oscillation wavelength (the wavelength of the light mainly emitted from the light emitting element and a desired oscillation wavelength) be $\lambda_0$, let an equivalent refractive index of the whole body of the two light absorbing material layers and that part of the stacked structure which is located between the light absorbing material layer and the light absorbing material layer be $n_{eq}$, and let a distance between the light absorbing material layer and the light absorbing material layer be $L_{Abs}$, then it is preferable that $$0.9 \times \{(m \cdot \lambda_0)/(2 \cdot n_{eq})\} \le L_{Abs} \le 1.1 \times \{(m \cdot \lambda_0)/(2 \cdot n_{eq})\}$$

is satisfied. Here, m is 1, or 2 or more any integer including 1. The equivalent refractive index $n_{eq}$ is represented by $$n_{eq} = \Sigma(t_i \times n_i)/\Sigma(t_i)$$

where $t_i$ is the respective thickness of each layer of the two light absorbing material layer and that part of the stacked structure which is located between the light absorbing material layer and the light absorbing material layer, and $n_i$ is the respective refractive index of each layer. Provided that i=1, 2, 3, . . . , I, "I" is the total number of the two light absorbing material layers and layers constituting that part of the stacked structure which is located between the light absorbing material layer and the light absorbing material layer, and "$\Sigma$" means to take the total from i=1 to i=I. The equivalent refractive index $n_{eq}$ is only required to obtain by observing the constituent materials from electron microscope observation of the light emitting element surface or the like, and calculating the equivalent refractive index based on known refractive indices of the constituent materials and their thicknesses obtained by the observation. In the case where m is 1, the distance between the adjacent light absorbing material layers satisfies $$0.9 \times \{\lambda_0/(2 \cdot n_{eq})\} \le L_{Abs} \le 1.1 \times \{\lambda_0/(2 \cdot n_{eq})\}$$

in all the plurality of light absorbing material layers. In addition, in the case where m is 2 or more any integer including 1, for example, m=1, 2, the distance between the adjacent light absorbing material layers satisfies $$0.9 \times \{\lambda_0/(2 \cdot n_{eq})\} \le L_{Abs} \le 1.1 \times \{\lambda_0/(2 \cdot n_{eq})\}$$

in part of the light absorbing material layers, and the distance between the adjacent light absorbing material layers satisfies $$0.9 \times \{(2 \cdot \lambda_0)/(2 \cdot n_{eq})\} \le L_{Abs} \le 1.1 \times \{(2 \cdot \lambda_0)/(2 \cdot n_{eq})\}$$

in the rest of the light absorbing material layers. Broadly speaking, the distance between the adjacent light absorbing layers satisfies $$0.9 \times \{\lambda_0/(2 \cdot n_{eq})\} \le L_{Abs} \le 1.1 \times \{\lambda_0/(2 \cdot n_{eq})\}$$

in part of the light absorbing material layers, and the distance between the adjacent light absorbing material layers satisfies $$0.9 \times \{(m' \cdot \lambda_0)/(2 \cdot n_{eq})\} \le L_{Abs} \le 1.1 \times \{(m' \cdot \lambda_0)/(2 \cdot n_{eq})\}$$

in the various rest of the light absorbing material layers. Here, m' is two or more any integer. In addition, the distance between the adjacent light absorbing material layers is the distance between the centers of gravity of the adjacent light absorbing material layers. In other words, in practice, the distance between the adjacent light absorbing material layers is the distance between the centers of the light absorbing material layers when they are cut along a virtual plane along the thickness direction of the active layer.

Further, in the light emitting element of the fourth configuration including the above-mentioned various preferred configurations, the thickness of the light absorbing material layer is preferably equal to or less than $\lambda_0/(4 \cdot n_{eq})$. As a lower limit for the thickness of the light absorbing material layer, 1 nm may be exemplified.

Furthermore, in the light emitting element of the fourth configuration including the above-mentioned various preferred configurations, the light absorbing material layers may be located at a minimum amplitude portion generated in a standing wave of light formed inside the stacked structure.

Further, in the light emitting element of the fourth configuration including the above-mentioned various preferred configurations, the active layer may be located at a maximum amplitude portion generated in the standing wave of light formed inside the stacked structure.

Furthermore, in the light emitting element of the fourth configuration including the above-mentioned various preferred configurations, the light absorbing material layer may have a light absorption coefficient of equal to or more than two times the light absorption coefficient of the compound semiconductor constituting the stacked structure. Here, the light absorption coefficient of the light absorbing material layer and the light absorption coefficient of the compound semiconductor constituting the stacked structure can be obtained by observing the constituent materials from electron microscope observation of a light emitting element section or the like, and analogizing the light absorption coefficients from known evaluation results observed for the constituent materials.

Further, in the light emitting element of the fourth configuration including the above-mentioned various preferred configurations, the light absorbing material layer may include at least one material selected from the group consisting of a compound semiconductor material narrower in bandgap than the compound semiconductor constituting the stacked structure, a compound semiconductor material doped with an impurity, a transparent conductive material, and a light reflection layer constituent material having a light absorbing characteristic. Here, examples of the compound semiconductor material narrower in bandgap than the compound semiconductor constituting the stacked structure include InGaN in the case where the compound semiconductor constituting the stacked structure is GaN; examples of the compound semiconductor material doped with an impurity include Si-doped n-GaN and B-doped n-GaN; examples of the transparent conductive material include transparent conductive materials for constituting an electrode which will be described later; and examples of the light reflection layer constituent material having a light absorbing characteristic include materials for constituting a light reflection layer which will be described later (for example, $SiO_X$, $SiN_X$, $TaO_X$, etc.). All the light absorbing material layers may include one of these materials. Alternatively, the light absorbing material layers may include various materials selected from these materials, but it is preferable that one light absorbing material layer include one material, from the viewpoint of simplification of the formation of the light absorbing material layers. The light absorbing material layer may be formed in the first compound semiconductor layer, may be formed in the second compound semiconductor layer, may be formed in the first light reflection layer, or may be formed in the second light reflection layer; a combination of these may also be adopted. Alternatively, the light absorbing material layer may be made to function also as an electrode including a transparent conductive material which will be described later (specifically, a second electrode).

Furthermore, in the light emitting element or the like of the present disclosure including the above-described preferred forms and configurations (inclusive of the light emitting elements of the first to fourth configurations), the compound semiconductor substrate may be disposed between the first surface of the first compound semiconductor layer and the first light reflection layer, as aforementioned. Here, a light emitting element of such a configuration is referred to as a "light emitting element of the fifth configuration" for convenience' sake. In this case, the compound semiconductor substrate may include a GaN substrate. Note that as the thickness of the compound semiconductor substrate, $5 \times 10^{-5}$ m to $1 \times 10^{-4}$ m may be exemplified, but such a value is not limitative. In the light emitting element of the fifth configuration including such a configuration, a concave mirror section of the first light reflection layer may include a base section including a projected portion of the compound semiconductor substrate and a multilayer light reflection film formed on a surface of at least a part of the base section. Here, a light emitting element of such a configuration is referred to as a "light emitting element of the (5-A)th configuration" for convenience' sake. Alternatively, the concave mirror section of the first light reflection layer may include a base section formed on the compound semiconductor substrate and a multilayer light reflection film formed on a surface of at least a part of the base section. Here, a light emitting element of such a configuration is referred to as a "light emitting element of the (5-B)th configuration" for convenience' sake. The material constituting the base section in the light emitting element of the (5-A)th configuration may be, for example, a GaN substrate. The GaN substrate may be any one of a polar substrate, a semi-polar substrate, and a nonpolar substrate. On the other hand, examples of the material constituting the base section in the light emitting element of the (5-B)th configuration include transparent dielectric materials such as $TiO_2$, $Ta_2O_5$, and $SiO_2$, silicone resins, and epoxy resins.

Alternatively, in the light emitting element or the like of the present disclosure including the above-described preferred forms and configurations (inclusive of the light emitting elements of the first to fourth configurations), the first light reflection layer may be formed on the first surface of the first compound semiconductor layer. Here, a light emitting element of such a configuration is referred to as a "light emitting element of the sixth configuration" for convenience' sake.

Further, in the light emitting element or the like of the present disclosure including the above-described preferred forms and configurations (inclusive of the light emitting elements of the first to sixth configurations), a value of thermal conductivity of the stacked structure may be higher than a value of thermal conductivity of the first light reflection layer. A value of thermal conductivity of the dielectric material constituting the first light reflection layer is generally on the order of 10 watt/(m·K) or less. On the other hand, the value of thermal conductivity of the GaN-based compound semiconductor constituting the stacked structure is on the order of 50 to 100 watt/(m·K).

Furthermore, in the light emitting element or the like of the present disclosure including the above-described preferred forms and configurations (inclusive of the light emitting elements of the first to sixth configurations), let a radius of curvature of the concave mirror section of the light emitting element (specifically, an effective region of a radius $r'_{DBR}$ in the concave mirror section of the first light reflection layer) be $R_{DBR}$, then $R_{DBR} \leq 1 \times 10^{-3}$ m, preferably $1 \times 10^{-5}$ m $\leq R_{DBR} \leq 1 \times 10^{-3}$ m, more preferably $1 \times 10^{-5}$ m $\leq R_{DBR} \leq 1 \times 10^{-4}$ m may be satisfied. In addition, while $1 \times 10^{-5}$ m $\leq L_{OR}$ is satisfied, it is desirable that $1 \times 10^{-5}$ m $\leq L_{OR} \leq 5 \times 10^{-4}$ m, more preferably $1 \times 10^{-5}$ m $\leq L_{OR} \leq 1 \times 10^{-4}$ m is satisfied.

In the light emitting element or the like of the present disclosure including the above-described preferred forms and configurations (inclusive of the light emitting elements of the first to sixth configurations), a protuberant portion may be formed in the periphery of the first light reflection layer, and the first light reflection layer may not protrude from the protuberant portion; by this, the first light reflection layer can be protected. In other words, the first light reflection layer is provided in a retracted state as compared to the protuberant portion, and, therefore, even when some body makes contact with the protuberant portion, the body would not make contact with the first light reflection layer, and the first light reflection layer can be protected securely.

In addition, in the light emitting element or the like of the present disclosure including the above-described preferred forms and configurations (inclusive of the light emitting elements of the first to sixth configurations), in regard of the materials constituting the various compound semiconductor layers (inclusive of the compound semiconductor substrate) located between the active layer and the first light reflection layer, it is preferable that a modulation in refractive index of equal to or more than 10% is absent (a refractive index modulation of equal to or more than 10%, with reference to the average refractive index of the stacked structure, is absent), whereby disturbance of light field in the resonator can be restrained from being generated.

By the light emitting element of the like of the present disclosure including the above-described preferred forms and configurations, a surface light emitting laser element (vertical resonator laser, VCSEL) that emits laser light to the exterior through the first light reflection layer can be configured, or, alternatively, a surface light emitting laser element that emits laser light to the exterior through the second light reflection layer can be configured. In some cases, a light emitting element production substrate (described later) can be omitted.

In the light emitting element or the like of the present disclosure, more specific examples of the GaN-based compound semiconductor constituting the stacked structure include GaN, AlGaN, InGaN, and AlInGaN. Further, these compound semiconductors may contain, as desired, boron (B) atoms, thallium (Tl) atoms, arsenide (As) atoms, phosphorus (P) atoms, or antimony (Sb) atoms. The active layer desirably has a quantum well structure. Specifically, the active layer may have a single quantum well structure (SQW structure), or may have a multiple quantum well structure (MQW structure). The active layer having the quantum well structure has a structure in which at least one well layer and at least one barrier layer are stacked, in which examples of the combination of (a compound semiconductor constituting the well layer, a compound semiconductor constituting the barrier layer) include $(In_yGa_{(1-y)}N, GaN)$, $(In_yGa_{(1-y)}N, In_zGa_{(1-z)}N)$ [provided that y>z], and $(In_yGa_{(1-y)}N, AlGaN)$. The first compound semiconductor layer may include a compound of semiconductor of a first conductivity type (e.g., n-type), and the second compound semiconductor layer may include a compound semiconductor of a second conductivity type (e.g., p-type) different from the first conductivity type. The first compound semiconductor layer and the second compound semiconductor layer are referred to also as a first clad layer and a second clad layer. The first compound semiconductor layer and the second compound semiconductor layer may be a single structure layer, or may be a multilayer structure layer, or a superlattice structure layer. Further, they may be layers having a composition gradient layer or a concentration gradient layer.

The stacked structure may be formed on the second surface of the light emitting element production substrate, or may be formed on the second surface of the compound semiconductor substrate. Examples of the light emitting element production substrate include a GaN substrate, a sapphire substrate, a GaAs substrate, a SiC substrate, an alumina substrate, a ZnS substrate, a ZnO substrate, an AlN substrate, a LiMgO substrate, an LiGaO$_2$ substrate, a MgAl$_2$O$_4$ substrate, an InP substrate, a Si substrate, and substrates in which a ground layer or a buffer layer is formed on a front surface (main surface) of these substrates, with the use of the GaN substrate being preferred because of low defect density. In addition, examples of the compound semiconductor substrate include the GaN substrate, as aforementioned. The GaN substrate is known to be changed in characteristics in the manner of polar/nonpolar/semi-polar, and either main surface (second surface) of the GaN substrate can be used for formation of a compound semiconductor layer. In addition, in regard of the main surface of the GaN substrate, depending on the crystal structure (for example, a cubic type, a hexagonal type, etc.), a crystal orientation plane, what is generally called, A plane, B plane, C plane, R plane, M plane, N plane, S plane or the like, or a plane obtained by setting these planes into a specific direction can be used. Examples of the method for forming various compound semiconductor layers for constituting the light emitting element include MOCVD method (MOCVD method, metal organic-chemical vapor deposition method, and MOVPE method, metal organic-vapor phase epitaxy method), molecular beam epitaxy method (MBE method), hydride vapor phase growth method in which a halogen contributes to transport or reaction (HVPE method), ALD method (atomic layer deposition method), MEE method (migration-enhanced epitaxy method), and PPD method (plasma-assisted physical vapor phase growth method), but these methods are non-limitative.

Here, as an organic gallium source gas in the MOCVD method, trimethylgallium (TMG) gas and triethylgallium (TEG) gas may be mentioned, and as a nitrogen source gas, ammonium gas, and hydrazine gas may be mentioned. In the formation of a GaN-based compound semiconductor layer having n-type conductivity type, for example, it is sufficient to add silicon (Si) as an n-type impurity (n-type dopant), and in the formation of a GaN-based compound semiconductor layer having a p-type conductivity type, for example, it is sufficient to add magnesium (Mg) as a p-type impurity (p-type dopant). In the case where aluminum (Al) or indium (In) is contained as a constituent atom in the GaN-based compound semiconductor layer, it is sufficient to use trimethylaluminum (TMA) gas as an Al source and trimethylindium (TMI) gas as an In source. Further, it is sufficient to use monosilane gas (SiH$_4$ gas) as a Si source, and biscyclopentadienylmagnesium gas, methylcyclopentadienylmagnesium, or biscyclopentadienylmagnesium (Cp$_2$Mg) as a Mg source. Note that examples of the n-type impurity (n-type dopant), other than Si, include Ge, Se, Sn, C, Te, S, O, Pd, and Po, and examples of the p-type impurity (p-type dopant), other than Mg, include Zn, Cd, Be, Ga, Ba, C, Hg, and Sr.

In the production of the light emitting element or the like of the present disclosure, the light emitting element production substrate may be left as the compound semiconductor substrate, or the light emitting element production substrate may be removed after the active layer, the second compound semiconductor layer, the second electrode, and the second light reflection layer are sequentially formed over the first compound semiconductor layer. Specifically, the active layer, the second compound semiconductor layer, the second electrode, and the second light reflection layer may be sequentially formed over the first compound semiconductor layer, next the second light reflection layer may be fixed to a support substrate, and thereafter, it is sufficient to remove the light emitting element production substrate and to expose the first compound semiconductor layer (the first surface of the first compound semiconductor layer). The removal of the light emitting element production substrate can be conducted by a wet etching method using an aqueous alkali solution such as an aqueous sodium hydroxide solution and an aqueous potassium hydroxide solution, ammonia solution+hydrogen peroxide solution, sulfuric acid solution+hydrogen peroxide solution, hydrochloric solution+ hydrogen peroxide solution, phosphoric acid solution+hydrogen peroxide solution, or the like, a chemical mechanical polishing method (CMP method), a mechanical polishing method, a dry etching method, a lift-off method using laser, or the like, or a combination of these methods. Alternatively, part of the light emitting element production substrate may be removed by a combination of these methods, or the thickness of the substrate may be reduced, followed by performing a chemical/mechanical polishing method, whereby it is sufficient to expose the first compound semiconductor layer (the first surface of the first compound semiconductor layer).

Alternatively, in the case of removing the light emitting element production substrate, for example, the first light reflection layer and the first compound semiconductor layer may be formed over the light emitting element production substrate, then the active layer, the second compound semiconductor layer, the second electrode, and the second light reflection layer may be sequentially formed over the first compound semiconductor layer (inclusive of formation of the light absorbing material layer), and thereafter, it is sufficient to remove the light emitting element production substrate, with the first light reflection layer as a stopper layer. Specifically, for example, the first light reflection layer and the first compound semiconductor layer may be formed over the light emitting element production substrate, then the active layer, the second compound semiconductor layer, the second electrode, and the second light reflection layer may be sequentially formed over the first compound semiconductor layer (inclusive of formation of the light absorbing material layer), next the second light reflection layer may be fixed to the support substrate, and it is sufficient to remove the light emitting element production substrate, with the first light reflection layer as a stopper layer, and to expose the first compound semiconductor layer (the first surface of the first compound semiconductor layer) and the first light reflection layer. Further, the first electrode is only required to form on the first compound semiconductor layer (the first surface of the first compound semiconductor layer). Alternatively, when removing amount is controlled based on a removal rate (polishing rate) of the light emitting element production substrate, the stopper layer may not be used.

The support substrate is only required to include, for example, one of the various substrate mentioned as examples of the light emitting element production substrate, or include an insulating substrate including AlN or the like, a semiconductor substrate including Si, SiC, Ge or the like, a metallic substrate, or an alloy substrate. It is preferable to use a conductive substrate. Alternatively, use of a metallic substrate or an alloy substrate is preferable from the viewpoint of mechanical characteristics, elastic deformation, plastic deformation, heat dissipation property and the like. A thickness of the support substrate may be, for example, 0.05 to 1 mm. As a method for fixing the second light reflection layer to the support substrate, there can be used known methods such as a solder joining method, a normal temperature joining method, a joining method using a pressure sensitive adhesive tape, a joining method using wax joining, a method using an adhesive, etc. It is desirable to use the solder joining method or the normal temperature joining method, from the viewpoint of securing conductivity. For example, in the case where a silicon semiconductor substrate which is a conductive substrate is used as the support substrate, it is desirable to adopt a method by which joining can be performed at a low temperature of equal to or lower than 400° C., for restraining warpage due to a difference in thermal expansion coefficient. In the case where a GaN substrate is used as the support substrate, the joining temperature may be equal to or higher than 400° C.

Though depending on the configuration or structure of the light emitting element, in the light emitting element according to the first mode of the present disclosure, the first electrode is only required to form on the first surface of the compound semiconductor substrate, and, in the light emitting element according to the second mode of the present disclosure, the first electrode is only required to form on the first surface of the first compound semiconductor layer. Note that, in these cases, the first electrode is only required to form, for example, in such a manner as to surround the first light reflection layer. In the light emitting element according to the third mode of the present disclosure, a first electrode extension section extending from the first electrode making contact with the low-resistance layer is only required to form on the first surface of the compound semiconductor substrate, or form on the first surface of the first compound semiconductor layer, and, in some cases, form on an exposed surface on the second electrode side of the first compound semiconductor layer.

The first electrode, for example, desirably has a monolayer configuration of a multilayer configuration that includes at least one metal (inclusive of alloy) selected from the group consisting of gold (Au), silver (Ag), palladium (Pd), platinum (Pt), nickel (Ni), titanium (Ti), vanadium (V), tungsten (W), chromium (Cr), Al (aluminum), Cu (copper), Zn (zinc), tin (Sn), and indium (In); specific examples include Ti/Au, Ti/Al, Ti/Al/Au, Ti/Pt/Au, Ni/Au, Ni/Au/Pt, Ni/Pt, Pd/Pt, and Ag/Pd. Note that, in the multilayer configuration, the layer on the former side of "/" is located on the more active layer side. This applies also to the following descriptions. The first electrode can be formed, for example, by a PVD method such as a vacuum deposition method and a sputtering method.

In the case where the first electrode is formed such as to surround the first light reflection layer, the first light reflection layer and the first electrode may be in contact with each other. Alternatively, the first light reflection layer and the first electrode may be spaced from each other, or an offset may exist therebetween, and a spacing distance may be within 1 mm. When the current injection region located in the first light reflection layer and the first electrode are spaced from each other on a plane basis, the current flows a longer distance in the first compound semiconductor layer. Therefore, in order to suppress the electric resistance generated in the current flow path, it is preferable that the spacing distance is within 1 mm. In some cases, a state in which the first electrode is formed over to a position on an edge portion of the first light reflection layer, or a state in which the first light reflection layer is formed over to a position on an edge portion of the first electrode, may be adopted. Here, in the case of the state in which the first light reflection layer is formed over to a position on an edge portion of the first electrode, the first electrode should have an opening region of a certain size, in order to restrain or minimize absorption of fundamental mode light of laser oscillation. The size of the opening region varies depending on the wavelength of the fundamental mode and the light confinement structure in the transverse direction (the plane direction of the first compound semiconductor layer), and is preferably on the order of several times the oscillation wavelength $\lambda_0$ or more, which is not limitative.

The second electrode may include a transparent conductive material. Examples of the transparent conductive material constituting the second electrode include the followings: indium-based transparent conductive materials [specific examples include indium tin oxide (ITO, inclusive of Sn-doped $In_2O_3$, crystalline ITO, and amorphous ITO), indium zinc oxide (IZO), indium gallium oxide (IGO), indium-doped gallium zinc oxide (GZO, In—$GaZnO_4$), IFO (F-doped $In_2O_3$), ITiO (Ti-doped $In_2O_3$), InSn, InSnZnO]; tin-based transparent conductive materials [specific examples include tin oxide ($SnO_2$), ATO (Sb-doped $SnO_2$), FTO (F-doped $SnO_2$)]; zinc-based transparent conductive materials [specific examples include zinc oxide (ZnO, inclusive of Al-doped ZnO (AZO) and B-doped ZnO), gallium-doped zinc oxide (GZO), AlMgZnO (aluminum oxide and magnesium oxide-doped zinc oxide)]; and NiO. Alternatively, examples of the second electrode include transparent conductive films having a base layer of gallium oxide, titanium oxide, niobium oxide, antimony oxide, nickel oxide or the like, and transparent conductive materials such as spinel-type oxide and oxides having a $YbFe_2O_4$ structure. It is to be noted, however, that through depending on the layout state of the second light reflection layer and the second electrode, the transparent conductive materials are not limitative, and such metals as palladium (Pd), platinum (Pt), nickel (Ni), gold (Au), cobalt (Co), and rhodium (Rh) can also be used. The second electrode may include at least one of these materials. The second electrode can be formed, for example, by a PVD method such as a vacuum deposition method and a sputtering method. Alternatively, a semiconductor layer low in resistance may also be used as the transparent electrode layer; in this case, specifically, n-type GaN-based compound semiconductor layer may also be used. Further, in the case where the layer adjacent to the n-type GaN-based compound semiconductor layer is of the p-type, both may be joined through a tunnel junction, whereby electric resistance at the interface can be lowered. With the second electrode including a transparent conductive material, the current can be spread in the transverse direction (the plane direction of the second compound semiconductor layer), so that the current can be efficiently supplied to the current injection region (element region). It is preferable that a surface roughness Ra of the second compound semiconductor layer (the second surface of the second compound semiconductor layer) is equal to or less than 1.0 nm, from the viewpoint of prevention of scattering of light at the second surface of the second compound semiconductor layer. The surface roughness Ra is prescribed in JIS B-610:2001, and can specifically be measured based on observation based on AFM or section TEM.

A pad electrode may be provided on the first electrode and the second electrode, for electrical connection with an external electrode or circuit. The pad electrode desirably has a monolayer configuration or a multilayer configuration including at least one metal selected from the group consisting of Ti (titanium), aluminum (Al), Pt (platinum), Au (gold), nickel (Ni), and Pd (palladium). Alternatively, the pad electrode may have a multilayer configuration, examples of which include a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, and a Ti/Ni/Au/Cr/Au multilayer configuration. In the case where the first electrode includes a Ag layer or a Ag/Pd layer, it is preferable to form a cover metal layer including, for example, Ni/TiW/Pd/TiW/Ni on the surface of the first electrode, and to form a pad electrode including, for example, a Ti/Ni/Au multilayer configuration or a Ti/Ni/Au/Cr/Au multilayer configuration on the cover metal layer.

The light reflection layer (distributed Bragg reflector layer, DBR layer) constituting the first light reflection layer and the second light reflection layer includes, for example, a semiconductor multilayer film or a dielectric material multilayer film. Examples of the dielectric material include oxides, nitrides (e.g., $SiN_X$, $AlN_X$, $AlGaN_X$, $GaN_X$, and $BN_X$), fluorides and the like of Si, Mg, Al, Hf, Nb, Zr, Sc, Ta, Ga, Zn, Y, B, and Ti. Specific examples include $SiO_X$, $TiO_X$, $NbO_X$, $ZrO_X$, $TaO_X$, $ZnO_X$, $AlO_X$, $HfO_X$, $SiN_X$, and $AlN_X$. A light reflection layer can be obtained by alternately stacking two or more dielectric material films of these dielectric materials differing in refractive index, of these dielectric materials. For example, multilayer films of $SiO_X/SiN_Y$, $SiO_X/TaO_X$, $SiO_X/NbO_Y$, $SiO_X/ZrO_Y$, $SiO_X/AlN_Y$ and the like are preferable. In order to obtain a desired light reflectance, the materials, film thicknesses, number of stacked layers and the like of the dielectric material films may be appropriately selected. The thickness of each dielectric material film may be appropriately adjusted depending on the material used and the like, and is determined by the oscillation wavelength (light emission wavelength) $\lambda_0$ and the refractive index n of the material used at the oscillation wavelength $\lambda_0$. Specifically, an odd number times of $\lambda_0/(4n)$ is preferable. For example, in a light emitting element with an oscillation wavelength $\lambda_0$ of 410 nm, in the case where the light reflecting layer includes $SiO_X/NbO_Y$, an example of the thickness is on the order to 40 to 70 nm. The number of layers stacked may be, for example, equal to or more than 2, preferably on the order of 5 to 20. The overall thickness of the light reflection layer may be, for example, on the order of 0.6 to 1.7 µm. In addition, the light reflectance of the light reflection layer is desirably equal to or more than 95%.

The light reflection layer can be formed based on a known method. Specific examples of the method include the followings: PVD methods such as a vacuum deposition method, a sputtering method, a reactive sputtering method, an ECR plasma sputtering method, a magnetron sputtering method, an ion beam assisted vapor deposition method, anion plating method, and a laser ablation method; various CVD methods; coating methods such as a spraying method, a spin coating method, and a dipping method; combined methods of two or more of these methods; combined methods of these methods with any one of a total or partial pretreatment, irradiation with an inert gas (Ar, He, Xe, etc.) or plasma, irradiation with oxygen gas or ozone gas or plasma, an oxidizing treatment (heat treatment), and a light exposure treatment.

The light reflection layer is not particularly limited in size and shape, insofar as it covers the current injection region or an element region. Specific examples of the shape of the boundary between the current injection region and the current non-injection inside region, the shape of the boundary between the current non-injection inside region and the current non-injection outside region, and the plan-view shapes of the openings provided in the element region and a current constriction region include a circle, ellipses, rectangles, and polygons (triangle, tetragon, hexagon, etc.). Examples of the plan-view shape of the first electrode include an annular shape, though depending on the configuration or structure of the light emitting element. It is to be noted, however, that these shapes are not limitative. It is desirable that the shape of the boundary between the current injection region and the current non-injection inside region and the shape of the boundary between the current non-injection inside region and the current non-injection outside region are similar to each other. In the case where the shape of the boundary between the current injection region and the current non-injection inside region is a circle, it is preferable that the diameter of the circle is on the order to 5 to 100 µm. Here, the "element region" refers to a region into which a constricted current is injected, or a region in which light is confined due to a difference in refractive index or the like, or that region of the region between the first light reflection layer and the second light reflection layer in which laser oscillation is generated, or that region of the region between the first light reflection layer and the second light reflection layer which actually contributes to laser oscillation.

In order to obtain the current constriction region, a current constriction layer including an insulating material (e.g., $SiO_X$, $SiN_X$, and $AlO_X$) may be formed between the second electrode and the second compound semiconductor layer, or the second compound semiconductor layer may be etched by an RIE method or the like to form a mesa structure, or some of the stacked second compound semiconductor layers may be partly oxidized to form a current constriction region, or an impurity may be ion-injected into the second compound semiconductor layer to form a region lowered in conductivity, or these methods may be combined as required. It is to be noted, however, that the second electrode should be electrically connected to that part of the second compound semiconductor layer in which a current flows due to current constriction.

A side surface or an exposed of the stacked structure may be coated with a coating layer (insulating film). Formation of the coating layer (insulating film) can be conducted based on a known method. It is preferable that the refractive index of the material constituting the coating layer (insulating film) is lower than the refractive indices of the materials constituting the stacked structure. Examples of the material constituting the coating layer (insulating film) include $SiO_X$ based materials inclusive of $SiO_2$, $SiN_X$ based materials, $SiO_YN_Z$ based materials, $TaO_X$, $ZrO_X$, $AlN_X$, $AlO_X$, and $GaO_X$, and organic materials such as polyimide resins. Examples of the method for forming the coating layer (insulating film) include PVD methods such as a vacuum deposition method and a sputtering method, CVD methods, and the coating layer (insulating film) can be formed also by a coating method.

Embodiment 1

Embodiment 1 relates to the light emitting element according to the first mode of the present disclosure, specifically to the light emitting element of the (5-A)th configuration. The light emitting elements of Embodiment 1 or Embodiments 2 to 13 and Embodiments 16 to 18 described later, more specifically, include a surface emitting laser element (vertical cavity laser, VCSEL) that emits laser light from a top surface of the second compound semiconductor layer via the second light reflection layer. In addition, the light emitting elements of Embodiments 14, 15, and 19 described later, more specifically, include a surface emitting laser element (vertical cavity laser, VCSEL) that emits laser light from a top surface of the first compound semiconductor layer via the first light reflection layer.

The light emitting element of Embodiment 1 of which a schematic partial end view is depicted in FIG. 1 includes:
a compound semiconductor substrate 11;
a stacked structure 20 including a GaN-based compound semiconductor;
a first light reflection layer 41; and
a second light reflection layer 42,
in which the stacked structure 20 includes, in a stacked state
a first compound semiconductor layer 21 that is formed on the compound semiconductor substrate 11 and has a first surface 21a and a second surface 21b opposite to the first surface 21a,
an active layer (light emitting layer) 23 facing the second surface 21b of the first compound semiconductor layer 21, and
a second compound semiconductor layer 22 that has a first surface 22a facing the active layer 23 and a second surface 22b opposite to the first surface 22a,
the first light reflection layer 41 is disposed on the compound semiconductor substrate 11 (specifically, on a first surface 11a of the compound semiconductor substrate 11) and has a concave mirror section 43, the second light reflection layer 42 is disposed on the second surface 22b side of the second compound semiconductor layer 22 and has a flat shape, and the compound semiconductor substrate 11 includes a low impurity concentration compound semiconductor substrate or a semi-insulating compound semiconductor substrate (in Embodiment 1, specifically, a low impurity concentration compound semiconductor substrate).

Here, the impurity concentration of the compound semiconductor substrate 11 including the low impurity concentration compound semiconductor substrate is equal to or less than $5 \times 10^{17}/cm^3$, and is specifically $5 \times 10^{16}/cm^3$. With the compound semiconductor substrate 11 produced based on a vapor phase growth method (for example, HVPE method) or a liquid phase growth method (for example, Na flux method), the impurity concentration of the compound semiconductor substrate 11 can be set equal to or less than $5 \times 10^{17}/cm^3$. The low impurity concentration compound semiconductor substrate includes an n-GaN substrate. That surface of the compound semiconductor substrate 11 which faces the first compound semiconductor layer 21 is referred to as a "second surface 11b," and a surface opposite to the second surface 11b is referred to as a "first surface 11a." The stacked structure 20 is formed on the second surface 11b of the compound semiconductor substrate 11 that is conductive. The first compound semiconductor layer 21 has a first conductivity type (specifically, n-type), while the second compound semiconductor layer 22 has a second conductivity type (specifically, p-type).

The average impurity concentration of the impurity concentration of the low impurity concentration compound semiconductor substrate and the impurity concentration of the first compound semiconductor layer 21 is equal to or less than $5 \times 10^{17}/cm^3$. Specifically, the impurity concentration of the first compound semiconductor layer 21 is on the order of $1 \times 10^{18}/cm^3$, and the thickness of the layer is equal to or less than 5 μm. The first compound semiconductor layer 21 is doped with at least one impurity selected from the group consisting of silicon, germanium, oxygen, and carbon, and is specifically doped with silicon ($S_1$) as an impurity. Let a sheet resistance of the first compound semiconductor layer 21 be $R_1$, let the sheet resistance of the second compound semiconductor layer 22 be $R_2$, and let the sheet resistance of the second electrode be $R_{EL-2}$, then $R_1 < R_2$ and $R_{EL-2} < R_2$ are satisfied. Specifically, $R_1 = 1 \times 10^{-1} \Omega/\square$ $R_2 = 1 \times 10^4 \Omega/\square$ $R_{EL-2} = 1 \times 10^2 \Omega/\square$.

The thickness of the first compound semiconductor layer 21 is equal to or more than $1 \times 10^{-5}$ m, and is specifically 15 μm, the thickness of the second compound semiconductor layer 22 is equal to or less than $1 \times 10^{-5}$ m, and is specifically 0.1 μm, the impurity concentration of the second compound semiconductor layer 22 is equal to or more than $5 \times 10^{17}$ cm$^3$, and is specifically $1 \times 10^{19}/cm^3$. The second compound semiconductor layer 22 is doped with at least one impurity selected from the group consisting of magnesium and zinc, and is specifically doped with magnesium (Mg) as an impurity.

A region of the first light reflection layer 41 ranging from the first surface 21a of the first compound semiconductor layer 21 to a certain depth, the stacked structure 20 (the first compound semiconductor layer 21, the active layer 23, and the second compound semiconductor layer 22), and a region of the second light reflection layer 42 ranging from the second surface 22b of the second compound semiconductor layer 22 to a certain depth constitute a resonator. Here, let the cavity length be $L_{OR}$, then $1×10^{-5}$ m $\leq L_{OR}$ is satisfied.

In the light emitting element of Embodiment 1, the figure drawn by an interface 43a, facing the stacked structure 20, of a part (an effective region 44 in the concave mirror section 43 of the first light reflection layer 41) of the concave mirror section of the first light reflection layer 41 when the first light reflection layer 41 is cut along a virtual plane including the stacking direction of the stacked structure 20, is a part of a circle or a part of a parabola. Note that the shape (the shape of a sectional shape) of that part of the concave mirror section 43 which is located outside the effective region may not be a part of a circle or a part of a parabola.

The concave mirror section 43 of the first light reflection layer 41 includes a base section 45A including a projected portion 11a' of the first surface 11a of the compound semiconductor substrate 11, and a multilayer light reflection film 46 formed on a surface of at least a part of the base section 45A (specifically, a surface of the base section 45A). Further, let the radius of curvature of the concave mirror section 43 (specifically, the effective region 44 of a radius $r'_{DBR}$ in the concave mirror section 43 of the first light reflection layer 41) be $R_{DBR}$, then $$R_{DBR} \leq 1×10^{-3} \text{ m}$$

is satisfied. Specifically, though not limitative, $$L_{OR}=50 \text{ μm}$$

$$R_{DBR}=70 \text{ μm}$$

$$r'_{DBR}=20 \text{ μm}$$

may be exemplified. In addition, as a desired wavelength (oscillation wavelength) $\lambda_0$ of light mainly emitted from the light emitting element, $$\lambda_0=450 \text{ nm}$$

may be exemplified.

Here, let the distance from the active layer 23 to the boundary between the base section 45A and the multilayer light reflection film 46 be $T_0$, then a function x=f(z) of an ideal parabola can be expressed by $$x=z^2/t_0$$

$$h_{DBR}=r'^2_{DBR}/2T_0,$$

but it is natural that when the figure drawn by the interface 43a is a part of a parabola, the parabola may be deviated from such an ideal parabola.

In addition, the value of thermal conductivity of the stacked structure 20 is higher than the value of thermal conductivity of the first light reflection layer 41. The value of thermal conductivity of the dielectric material constituting the first light reflection layer 41 is on the order of 10 watt/(m·K) or less. On the other hand, the value of thermal conductivity of the GaN-based compound semiconductor constituting the stacked structure 20 is on the order of 50 to 100 watt/(m·K).

The first compound semiconductor layer 21 includes an n-GaN layer, the active layer 23 includes a five-quantum multi-quantum well structure of $In_{0.04}Ga_{0.96}N$ layers (barrier layers) and $In_{0.16}Ga_{0.84}N$ layers (well layers), and the second compound semiconductor layer 22 includes a p-GaN layer. The first electrode 31 is formed on the first surface 11a of the compound semiconductor substrate 11. On the other hand, the second electrode 32 is formed on the second compound semiconductor layer 22, and the second light reflection layer 42 is formed on the second electrode 32. The second light reflection layer 42 on the second electrode 32 has a flat shape. The first electrode 31 includes Ti/Pt/Au, and the second electrode 32 includes a transparent conductive material, specifically, ITO. A pad electrode (not illustrated) including, for example, Ti/Pt/Au or V/Pt/Au for electrical connection with an external electrode or circuit is formed on or connected onto an edge portion of the first electrode 31. A pad electrode 33 including, for example, Pd/Ti/Pt/Au, Ti/Pd/Au, or Ti/Ni/Au for electrical connection with an external electrode or circuit is formed on or connected onto an edge portion of the second electrode 32. The first light reflection layer 41 and the second light reflection layer 42 include a stacked structure (total number of layers of a dielectric material film: 20 layers) of $Ta_2O_5$ layers and $SiO_2$ layers. While the first light reflection layer 41 and the second light reflection layer 42 thus have a multilayer structure, they are represented in a monolayer form, for simplification of the drawing. Plan-view shapes of openings 34A provided in the first electrode 31, the first light reflection layer 41, the second light reflection layer 42, and an insulating layer (current constriction layer) 34 are circular.

A method of manufacturing the light emitting element of Embodiment 1 will be described below, referring to FIGS. 2A, 2B, 3, 4, 5, 6, and 7, which are schematic partial end views of the stacked structure or the like.

[Step-100]

First, on a second surface 11b of a compound semiconductor substrate 11 having a thickness on the order of 0.4 mm, a stacked structure 20 including a GaN-based compound semiconductor is formed, the stacked structure 20 including, in a stacked state a first compound semiconductor layer 21 that has a first surface 21a and a second surface 21b opposite to the first surface 21a, an active layer (light emitting layer) 23 facing the second surface 21b of the first compound semiconductor layer 21, and a second compound semiconductor layer 22 that has a first surface 22a facing the active layer 23 and a second surface 22b opposite to the first surface 22a. Specifically, the first compound semiconductor layer 21, the active layer 23, and the second compound semiconductor layer 22 are sequentially formed over the second surface 11b of the compound semiconductor substrate 11, based on an epitaxial growth method by a known MOCVD method, in which the stacked structure 20 can be obtained (see FIG. 2A).

[Step-110]

Figure 2A:
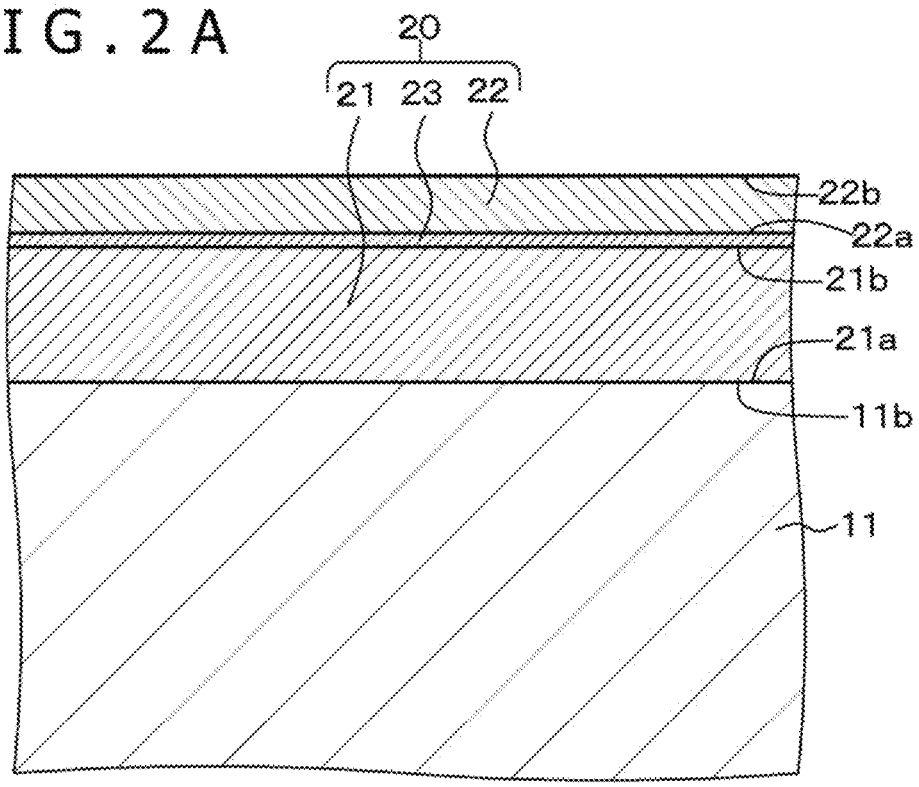
FIGS. 2A and 2B are schematic partial end views of a stacked structure or the like for explaining a producing method for the light emitting element of Embodiment 1.
Figure 2B:
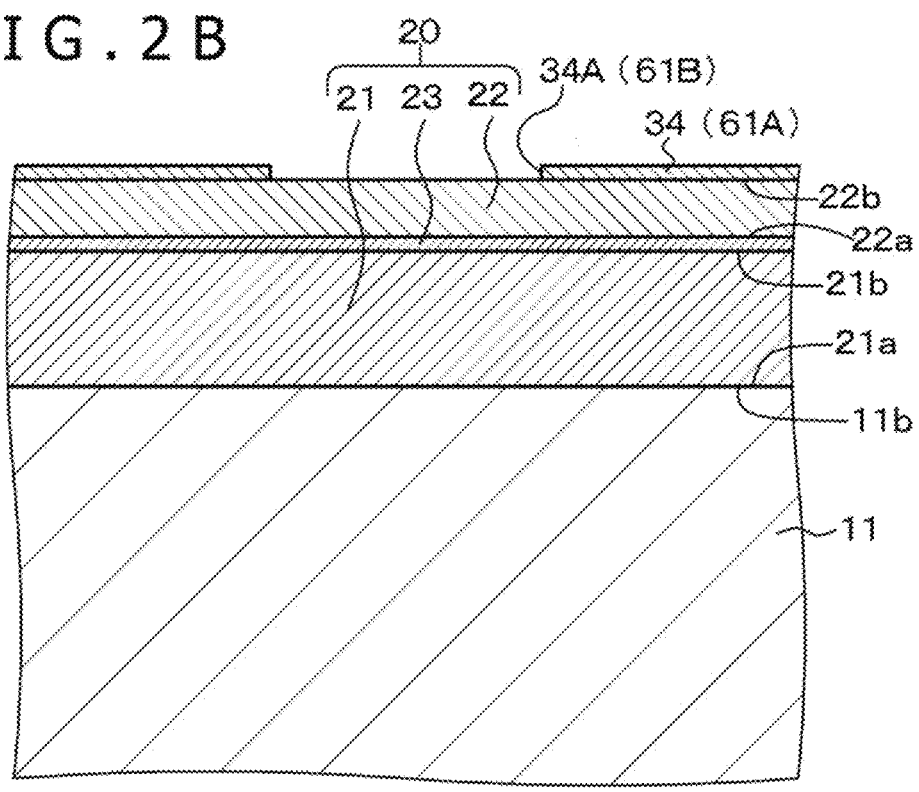
Figure 3:
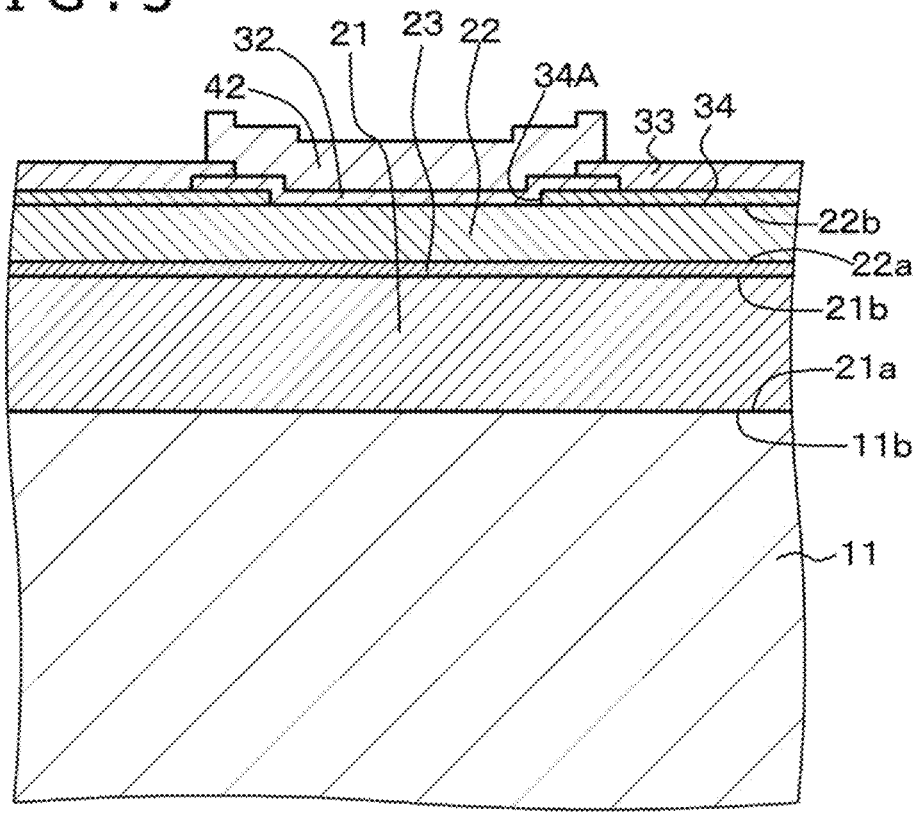
FIG. 3, subsequent to FIG. 2B, is a schematic partial end view of the stacked structure or the like for explain the producing method for the light emitting element of Embodiment 1.

Next, an insulating layer (current constriction layer) 34 including $SiO_2$ and having an opening 34A is formed on the second surface 22b of the second compound semiconductor layer 22, based on a combination of a film forming method such as a CVD method, a sputtering method, or a vacuum deposition method with a wet etching method or a dry etching method (see FIG. 2B). By the insulating layer 34 having the opening 34A, a current constriction region (a current injection region 61A and a current non-injection region 61B) is defined. In other words, the current injection region 61A is defined by the opening 34A.

In order to obtain the current constriction region, an insulating layer (current constriction layer) including an insulating material (e.g., $SiO_X$, $SiN_X$, and $AlO_X$) may be formed between a second electrode 32 and the second compound semiconductor layer 22, or the second compound semiconductor layer 22 may be etched by an RIE method or the like to form a mesa structure, or some layers of the stacked second compound semiconductor layers 22 may be partly oxidized from a lateral direction to form a current constriction region, or an impurity may be ion-injected into the second compound semiconductor layer 22 to form a region lowered in conductivity, or these methods may be combined as required. It is to be noted, however, that the second electrode 32 should be electrically connected to that part of the second compound semiconductor layer 22 in which a current flows owing to current constriction.

[Step-120]

Thereafter, a second electrode 32 and a second light reflection layer 42 are formed over the second compound semiconductor layer 22. Specifically, the second electrode 32 is formed, for example, by a lift-off method, over a range of the second surface 22b of the second compound semiconductor layer 22 exposed at a bottom surface of the opening 34A (current injection region 61A) to the insulating layer 34, and, further, a pad electrode 33 is formed, based on a combination of a film forming method such as a sputtering method or a vacuum deposition method with a wet etching method or a dry etching method. Next, a second light reflection layer 42 is formed over a range of a position the second electrode 32 to a position on the pad electrode 33, based on a combination of a film forming method such as a sputtering method or a vacuum deposition method with a wet etching method or a dry etching method. The second light reflection layer 42 on the second electrode 32 has a flat shape. In this way, a structure depicted in FIG. 3 can be obtained.

[Step-130]

Figure 4:
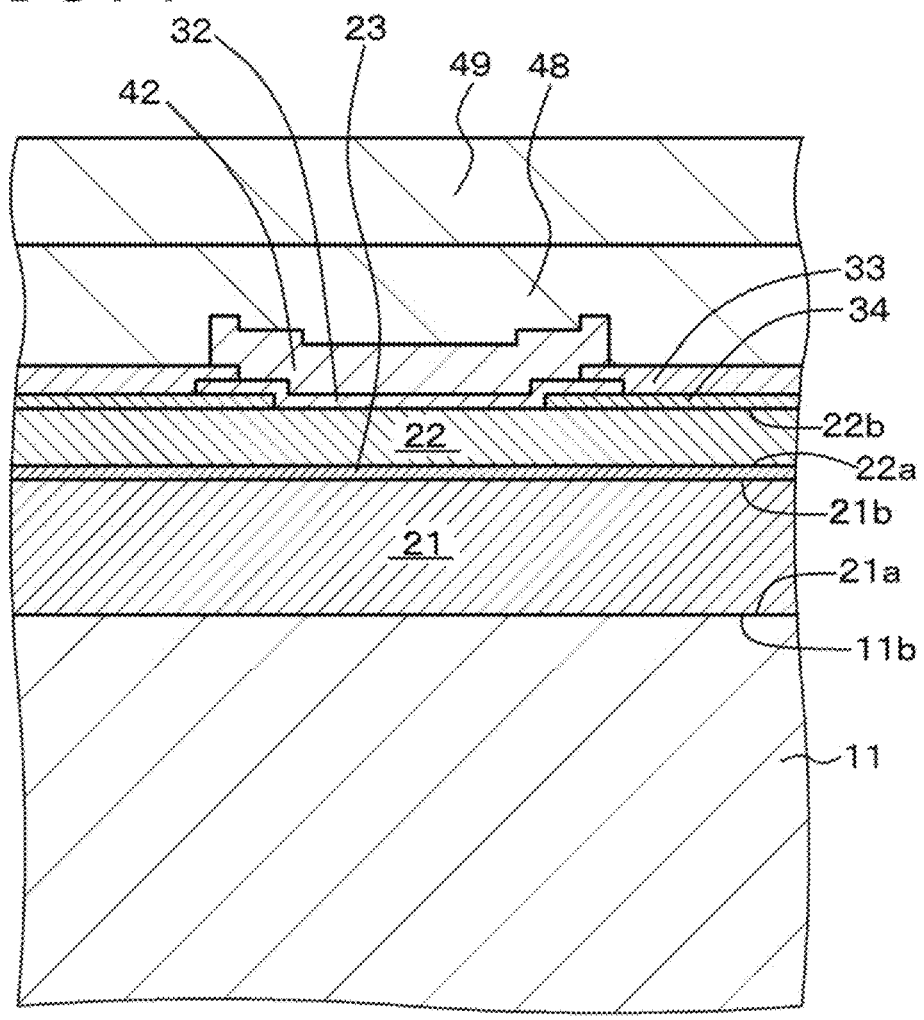
FIG. 4, subsequent to FIG. 3, is a schematic partial end view of the stacked structure or the like for explaining the producing method for the light emitting element of Embodiment 1.

Subsequently, the second light reflection layer 42 is fixed to a support substrate 49 through a joining layer 48 (see FIG. 4). Specifically, the second light reflection layer 42 is fixed to the support substrate 49, including a sapphire substrate, by use of a joining layer 48 including an adhesive.

[Step-140]

Figure 5:
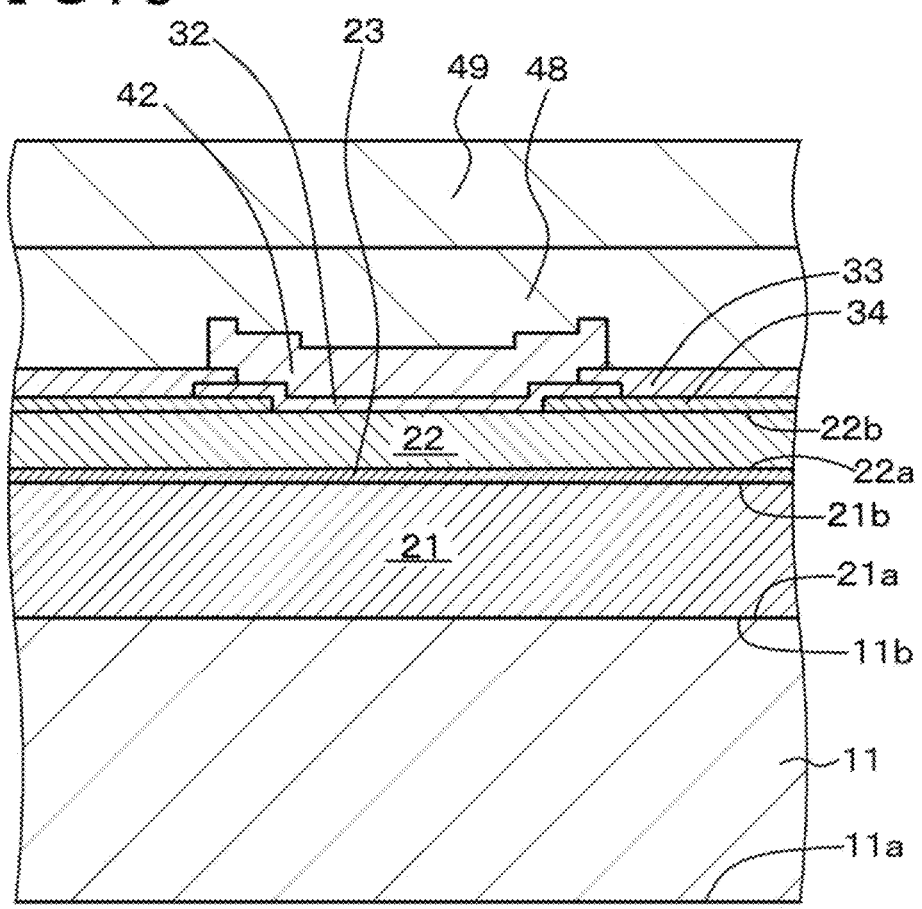
FIG. 5, subsequent to FIG. 4, is a schematic partial end view of the stacked structure or the like for explaining the producing method for the light emitting element of Embodiment 1.
Figure 6:
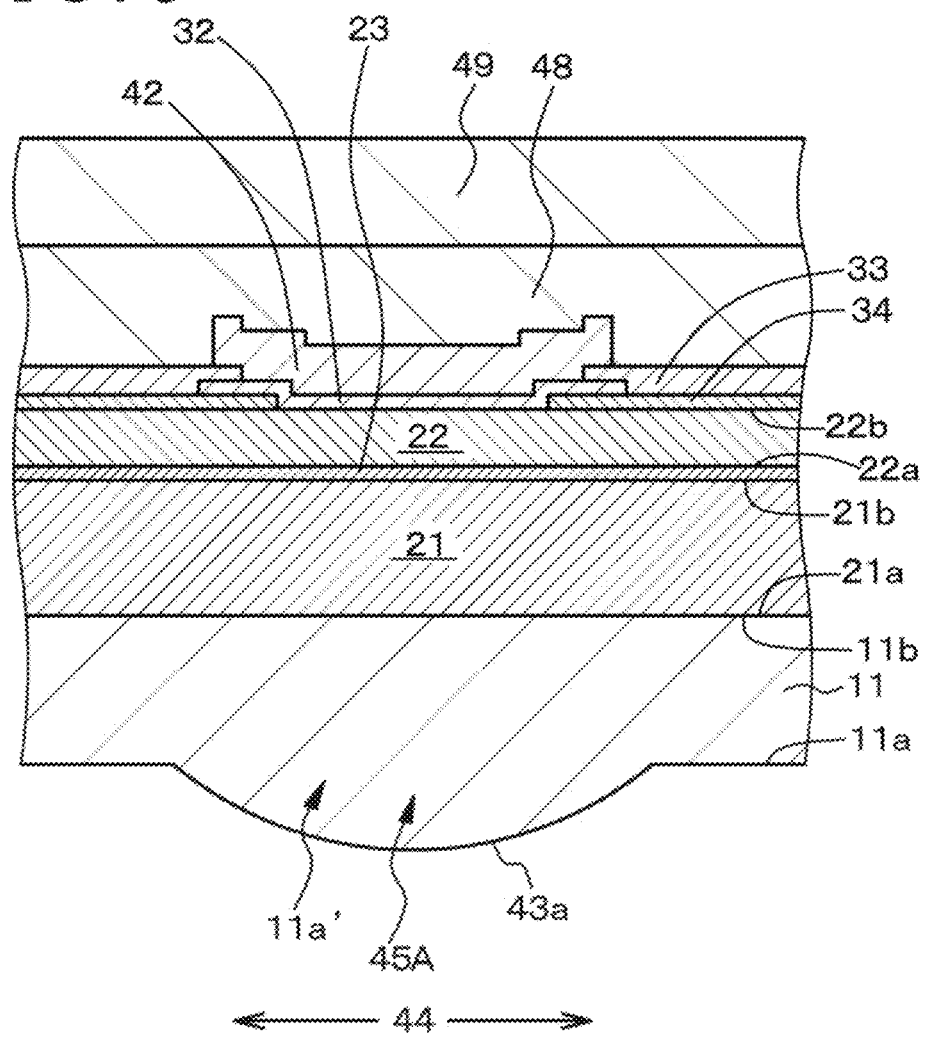
FIG. 6, subsequent to FIG. 5, is a schematic partial end view of the stacked structure or the like for explaining the producing method for the light emitting element of Embodiment 1.
Figure 7:
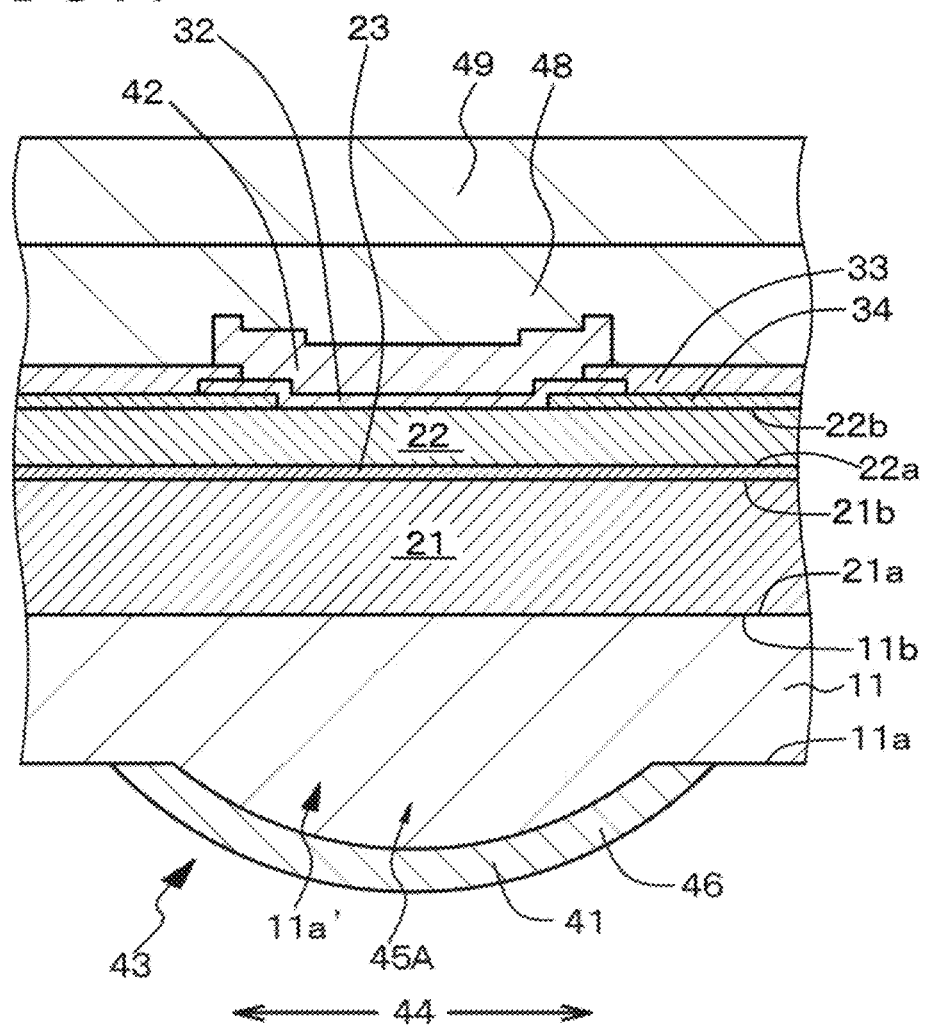
FIG. 7, subsequent to FIG. 6, is a schematic partial end view of the stacked structure or the like for explaining the producing method for the light emitting element of Embodiment 1.

Next, the compound semiconductor substrate 11 is thinned based on a mechanical polishing method or a CMP method, and, further, the first surface 11a of the compound semiconductor substrate 11 is subjected to mirror finishing (see FIG. 5). The value of surface roughness Ra of the first surface 11a of the compound semiconductor substrate 11 is preferably equal to or less than 10 nm. The surface roughness Ra is prescribed in JIS B-610:2001, and, specifically, it can be measured based on observation based on AFM or section TEM. Then, an exposed surface (first surface 11a) of the compound semiconductor substrate 11 is formed with a base section 45A including a projected portion 11a'. Specifically, a patterned resist layer is formed on the first surface 11a of the compound semiconductor substrate 11 where to form the base section 45A, and the resist layer is heated to put the resist layer into reflow, thereby obtaining a resist pattern. A shape which is the same as (or similar to) the shape of the projected portion 11a' is imparted to the resist pattern. Then, the resist pattern and the first surface 11a of the compound semiconductor substrate 11 are etched back by an RIE method or the like, whereby the base section 45A including the projected portion 11a' can be formed at the exposed surface (first surface 11a) of the compound semiconductor substrate 11 (see FIG. 6).

[Step-150]

Thereafter, a multilayer light reflection film 46 is formed on at least a part of the base section 45A. Specifically, the multilayer light reflection film 46 is formed over a range of the exposed surface (first surface 11a) of the compound semiconductor substrate 11 to a position on the base section 45A, based on a known method such as a sputtering method and a vacuum deposition method. Then, an unrequired part of the multilayer light reflection film 46 is removed, based on a patterning method such as a wet etching method or a dry etching method, to obtain a first light reflection layer 41 (see FIG. 7), after which a first electrode 31 is formed on the first surface 11a of the compound semiconductor substrate 11, based on a combination of a film forming method such as a sputtering method or a vacuum deposition method with a patterning method such as a wet etching method or a dry etching method, whereby the first electrode 31 electrically connected to the first compound semiconductor layer 21 can be obtained.

[Step-160]

Then, the support substrate 49 is peeled off. In this way, a structure depicted in FIG. 1 can be obtained. Thereafter, what is generally called an element isolation is conducted to isolate the light emitting element, and the side surface and exposed surface of the stacked structure is coated with an insulating film including, for example, $SiO_2$. Next, packaging or sealing is conducted, to complete the light emitting element of Embodiment 1.

Note that, in [step-140], the support substrate 49 may be peeled off, after the compound semiconductor substrate 11 is thinned and, further, the mirror finishing is conducted.

Figure 8:
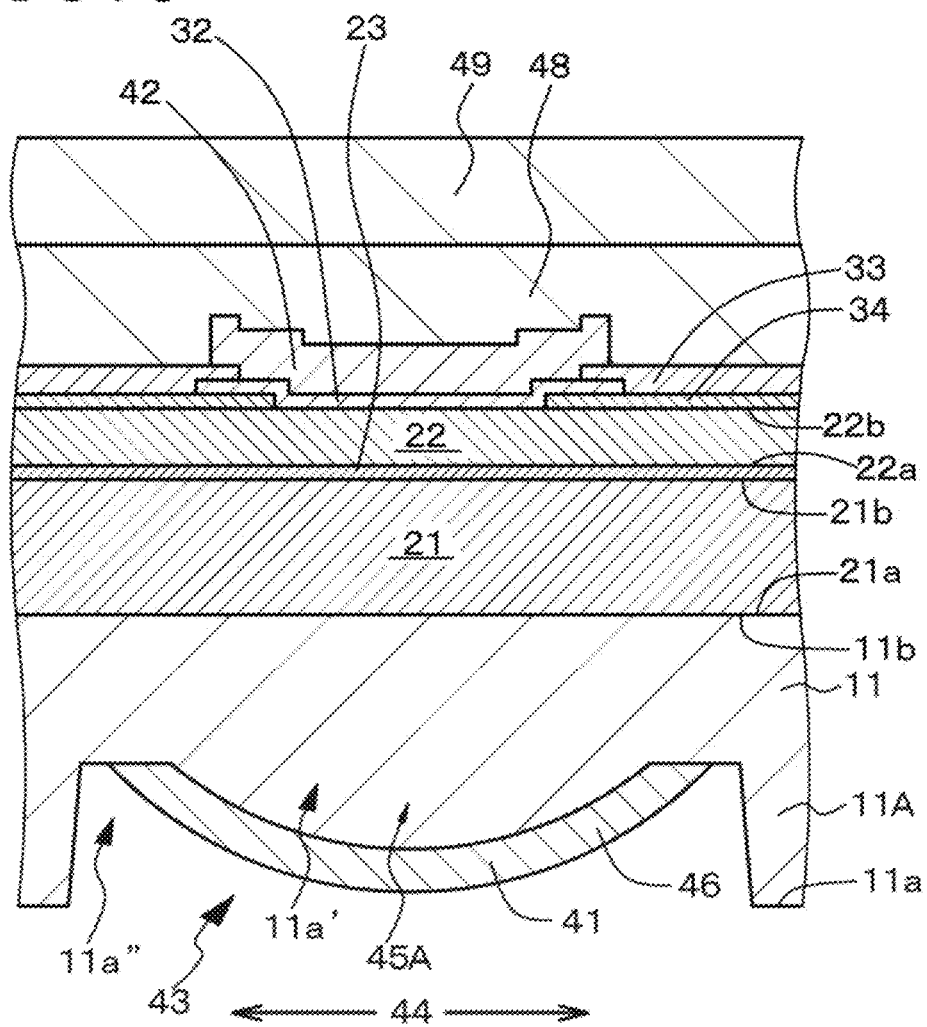
FIG. 8 is a schematic partial end view of a stacked structure or the like of a modification of the light emitting element of Embodiment 1.

In addition, as a modification of the light emitting element of Embodiment 1, in [step-140], after the compound semiconductor substrate 11 is thinned and further the mirror finishing is conducted and before the base section 45A including the projected portion 11a' is formed at the exposed surface (first surface 11a) of the compound semiconductor substrate 11, a recess 11a" is formed in that region of the exposed surface (first surface 11a) of the compound semiconductor substrate 11 in which to form the base section 45A, a patterned resist layer is formed in the recess 11a", and the resist layer is heated to put the resist layer into reflow, thereby obtaining a resist pattern. A shape which is the same as (or similar to) the shape of the projected portion 11a' is imparted to the resist pattern. Then, the part of the resist pattern and the recess 11a" may be etched back by use of an RIE method or the like, to form the base section 45A including the projected portion 11a' in the recess 11a" in the exposed surface (first surface 11a) of the compound semiconductor substrate 11 (see FIG. 8). Next, the multilayer light reflection film 46 is formed on the whole surface inclusive of an upper area of the base section 45A, based on a known method such as a sputtering method and a vacuum deposition method. Then, an unrequired part of the multilayer light reflection film 46 is removed, based on a patterning method such as a wet etching method and a dry etching method, whereby the first light reflection layer 41 can be obtained. In other words, a protuberant portion 11A is formed in the periphery of the first light reflection layer 41, and the first light reflection layer 41 does not protrude from the protuberant portion 11A (which includes the exposed surface (first surface 11a) of the compound semiconductor substrate 11), whereby the first light reflection layer 41 can be protected.

Alternatively, in [step-140], simultaneously with the formation of the base section 45A including the projected portion 11a' at the exposed surface (first surface 11a) of the compound semiconductor substrate 11, a projection portion may be formed at the exposed surface (first surface 11a) of the compound semiconductor substrate 11 in the state of being spaced from the base section 45A and in the manner of surrounding the base section 45A. Specifically, a patterned resist layer is formed on the first surface 11a of the compound semiconductor substrate 11 where to form the base section 45A, and the resist layer is heated to put the resist layer into reflow, to obtain a resist pattern. A shape which is the same as (or similar to) the shape of the projected portion 11a' is imparted to the resist pattern. In addition, a resist layer is formed on that part of the first surface 11a of the compound semiconductor substrate 11 at which to form the projection portion, in the manner of being spaced from the resist pattern and in the manner of surrounding the resist pattern. Then, the resist pattern, the resist layer, and the first surface 11a of the compound semiconductor substrate 11 are etched back by use of an RIE method or the like, whereby the base section 45 including the projected portion 11a' can be formed, and, in addition, the projection portion can be formed, at the exposed surface (first surface 11a) of the compound semiconductor substrate 11. The projection portion is formed in the periphery of the first light reflection layer 41, and the first light reflection layer 41 does not protrude from the projection portion (which includes the exposed surface (first surface 11a) of the compound semiconductor substrate 11), whereby the first light reflection layer 41 can be protected.

Figure 9:
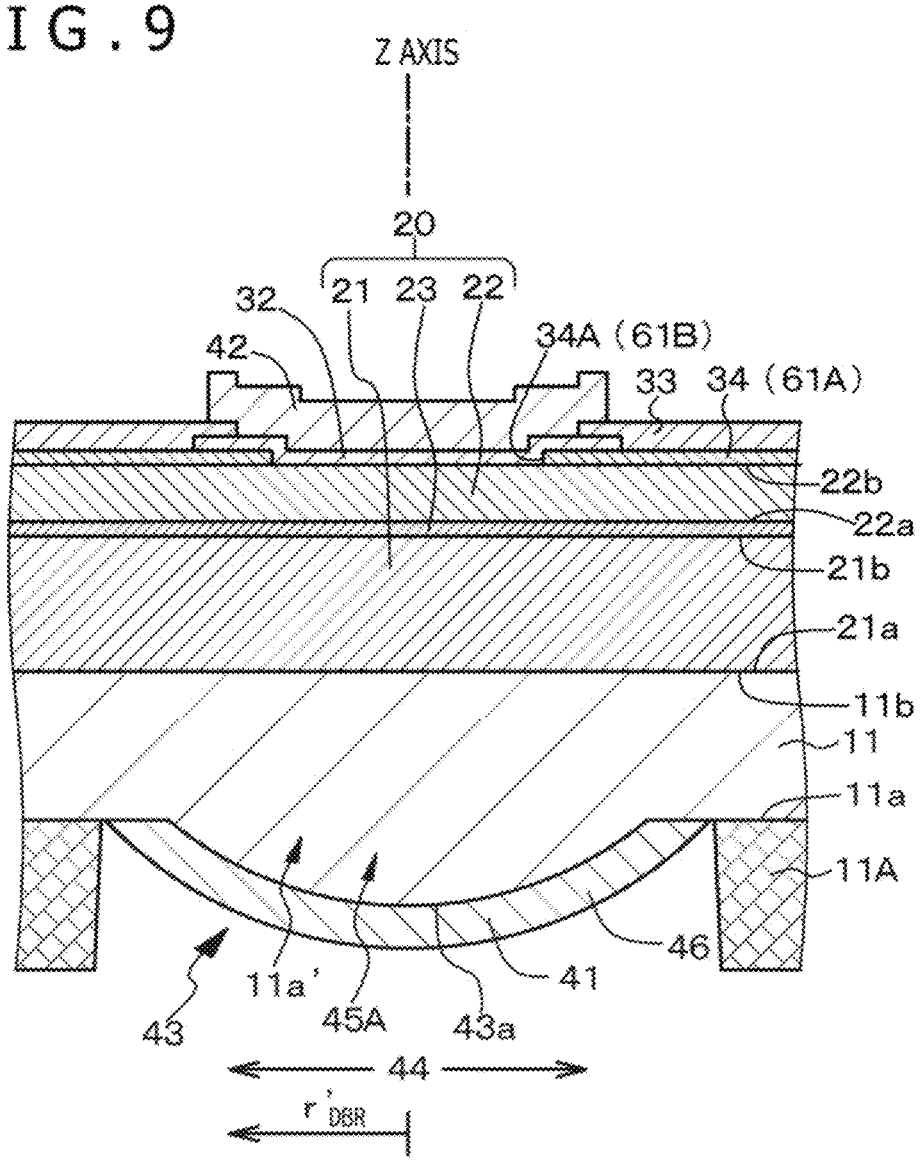
FIG. 9 is a schematic partial end view of a stacked structure or the like of another modification of the light emitting element of Embodiment 1.

Alternatively, in [step-150] above, after the multilayer light reflection film 46 is formed on at least a part of the base section 45A to obtain the first light reflection layer 41, the protuberant portion 11A surrounding the first light reflection layer 41 may be formed on the first surface 11a of the compound semiconductor substrate 11 (see FIG. 9). The protuberant portion 11A may include, for example, an insulating material or a metallic material. Thus, the protuberant portion 11A is formed in the periphery of the first light reflection layer 41, and the first light reflection layer 41 does not protrude from the protuberant portion 11A, whereby the first light reflection layer 41 can be protected.

In the light emitting elements of Embodiment 1 or Embodiments 2 to 19 described later, the first light reflection layer has the concave mirror section. Therefore, the light having spread through diffraction with the active layer as a start point and been incident on the first light reflection layer can be securely reflected toward the active layer and concentrated onto the active layer. For this reason, even when the cavity length $L_{OR}$ is, for example, equal to or more than $1 \times 10^{-5}$ m, an increase in diffraction loss can be avoided, and, as a result, laser oscillation can be performed securely. Incidentally, in the case where the stacked structure includes the GaN-based compound semiconductor, the problem of thermal saturation may be generated. Here, "thermal saturation" is a phenomenon in which light output is saturated due to self-heating, at the time of driving a surface emitting laser element. The material used for the light reflection layer (for example, such material as $SiO_2$ or $Ta_2O_5$) is lower in the value of thermal conductivity than the GaN-based compound semiconductor. Therefore, thickening the GaN-based compound semiconductor layer leads to restraining of thermal saturation. When the thickness of the GaN-based compound semiconductor layer is increased, however, the length of the cavity length $L_{OR}$ is enlarged, so that the problem of diffraction loss may be generated. However, in the light emitting elements of Embodiment 1 or Embodiments 2 to 19 described later, since, for example, the cavity length $L_{OR}$ can be set equal to or more than $1 \times 10^{-5}$ m, i.e., since a long resonator is provided, the problem of thermal saturation can be avoided or restrained, and, as a result of an increase in the degree of allowance for manufacturing process of the light emitting element, enhancement of yield can be realized. In addition, where the thickness of the GaN-based compound semiconductor layer is increased, the GaN-based compound semiconductor layer itself absorbs light, possibly resulting in worsening of characteristics. More specifically, worsening of characteristics such as worsening of a threshold or lowering in reliability may occur, or laser oscillation itself may be hindered. However, since an increase in diffraction loss can be avoided even where, for example, the cavity length $L_{OR}$ is equal to or more than $1 \times 10^{-5}$ m, laser oscillation can be performed assuredly.

In addition, while a GaN substrate is used in the manufacturing process of the light emitting element, exclusively of Embodiment 5 described later, the GaN-based compound semiconductor is not formed based on a method for transverse epitaxial growth such as an ELO method. Therefore, as a GaN substrate, there can be used not only a polar GaN substrate but also a semi-polar GaN substrate and a nonpolar GaN substrate. While the use of a polar GaN substrate tends to lower luminous efficiency due to an effect of a piezo electric field in the active layer, the use of a nonpolar GaN substrate or a semi-polar GaN substrate makes it possible to solve or restrain such a problem. Moreover, since the compound semiconductor substrate includes a low impurity concentration compound semiconductor substrate, light absorption by a resonator can be restrained.

Embodiment 2

Embodiment 2 is a modification of Embodiment 1, and a compound semiconductor substrate 11 therein includes a semi-insulating compound semiconductor substrate, specifically, an iron atom-containing indium phosphorus (InP) substrate. Note that the concentration of the iron atoms is, for example, $5 \times 10^{16}/cm^3$. Such a semi-insulating compound semiconductor substrate can be manufactured based on a vapor phase growth or liquid phase growth method.

In the light emitting element of Embodiment 2, the compound semiconductor substrate 11 includes InP as aforementioned, a first compound semiconductor layer includes S-added InP, a second compound semiconductor layer includes Zn-added InP, and an active layer includes an AlInGaAsP-based compound. In addition, examples of the material of a reflector mirror including a dielectric material multilayer film include amorphous silicon, SiC, ZnSe, $TiO_2$, SiN, $Al_2O_3$, and MgO. An oscillation wavelength may be, for example, 1.3 µm or 1.55 µm. Other configurations than the above-mentioned points may similar to those in Embodiment 1, and, therefore, detailed description thereof is omitted. In the light emitting element of Embodiment 2, the compound semiconductor substrate includes a semi-insulating compound semiconductor substrate, and, therefore, light absorption by the resonator can be restrained, as in the light emitting element of Embodiment 1. Note that it is preferable to combine Embodiment 2 with Embodiment 6 described later.

Embodiment 3

Figure 10:
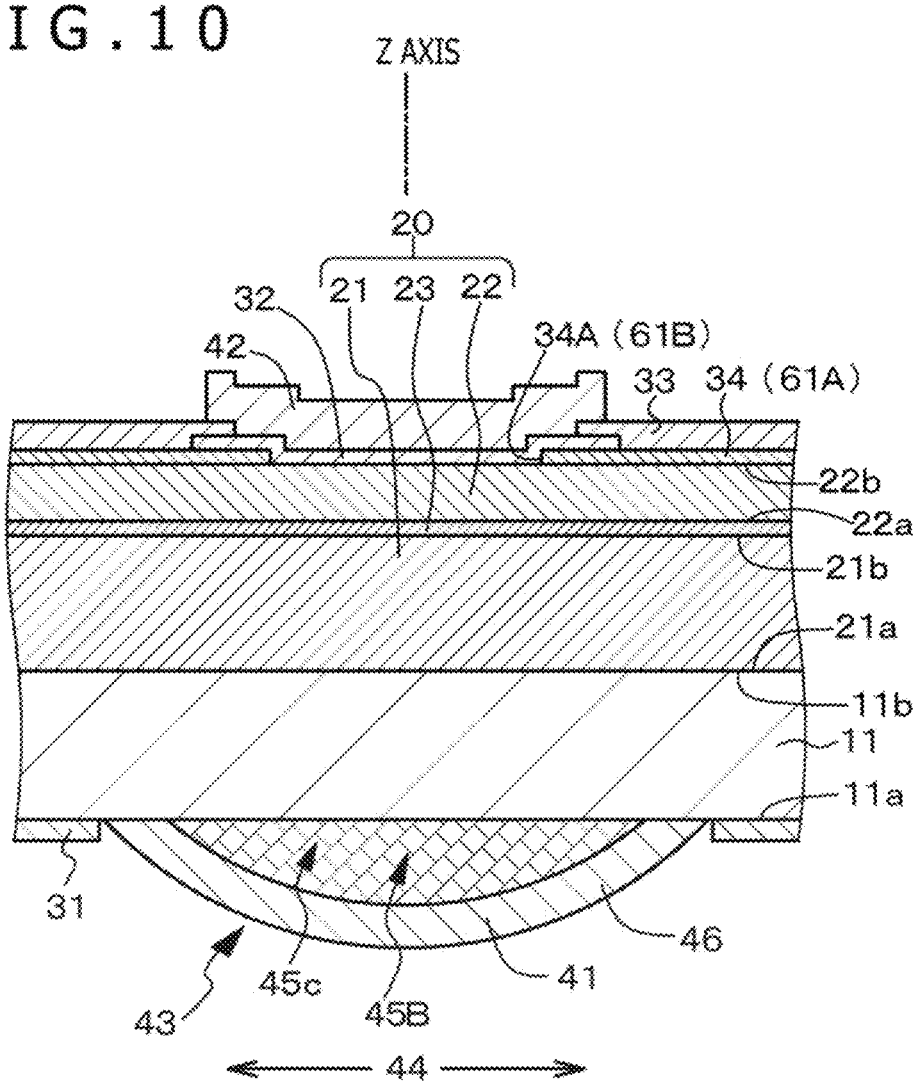
FIG. 10 is a schematic partial end view of a light emitting element of Embodiment 3.

Embodiment 3 is a modification of Embodiments 1 and 2, and relates to a light emitting element of the (5-B)th configuration. In a light emitting element of Embodiment 3 of which a schematic partial end view is depicted in FIG. 10, a concave mirror section 43 of a first light reflection layer 41 includes a base section 45B including a projected portion 45c formed on a compound semiconductor substrate 11 (specifically, on a first surface 11a of the compound semiconductor substrate 11), and a multilayer light reflection film 46 formed on at least a part of the base section 45B (specifically, a surface of the base section 45B). Examples of the material constituting the base section 45B (projected portion 45c) include transparent dielectric materials such as $TiO_2$, $Ta_2O_5$, and $SiO_2$, silicone resins, and epoxy resins.

In manufacturing the light emitting element of Embodiment 3, in a step similar to [step-140] of Embodiment 1, a base section 45B including a projected portion 45c is formed on an exposed surface (first surface 11a) of the compound semiconductor substrate 11, after the compound semiconductor substrate 11 is thinned and mirror finishing is conducted. Specifically, for example, a $TiO_2$ layer or a $Ta_2O_5$ layer is formed on the exposed surface (first surface 11a) of the compound semiconductor substrate 11, next a patterned resist layer is formed on the $TiO_2$ layer or $Ta_2O_5$ layer where to form the base section 45B, and the resist layer is heated to put the resist layer into reflow, thereby obtaining a resist pattern. A shape which is the same as (or similar to) the shape of the projected portion 45c is imparted to the resist pattern. Then, the resist pattern and the $TiO_2$ layer or $Ta_2O_5$ layer are etched back, whereby the base section 45B including the projected portion 45c can be formed on the exposed surface (first surface 11a) of the compound semiconductor substrate 11. Subsequently, the multilayer light reflection film 46 is formed over a range of the exposed surface (first surface 11a) of the compound semiconductor substrate 11 to a position on the base section 45B, based on a known method. Thereafter, an unrequired part of the multilayer light reflection film 46 is removed to obtain the first light reflection layer 41, after which a first electrode 31 is formed on the first surface 11a of the compound semiconductor substrate 11, whereby the first electrode 31 electrically connected to a first compound semiconductor layer 21 can be obtained.

Other configurations and structures of the light emitting element of Embodiment 3 than the above-mentioned points may be similar to the configurations and structures of the light emitting element of Embodiment 1, and, therefore, detailed description thereof is omitted. Note that the modification of the light emitting element of Embodiment 1 and the light emitting element of Embodiment 2 may be applied to Embodiment 3.

Embodiment 4

Embodiment 4 relates to the light emitting element according to the second mode of the present disclosure, and relates to the light emitting element of the sixth configuration.

Figure 11:
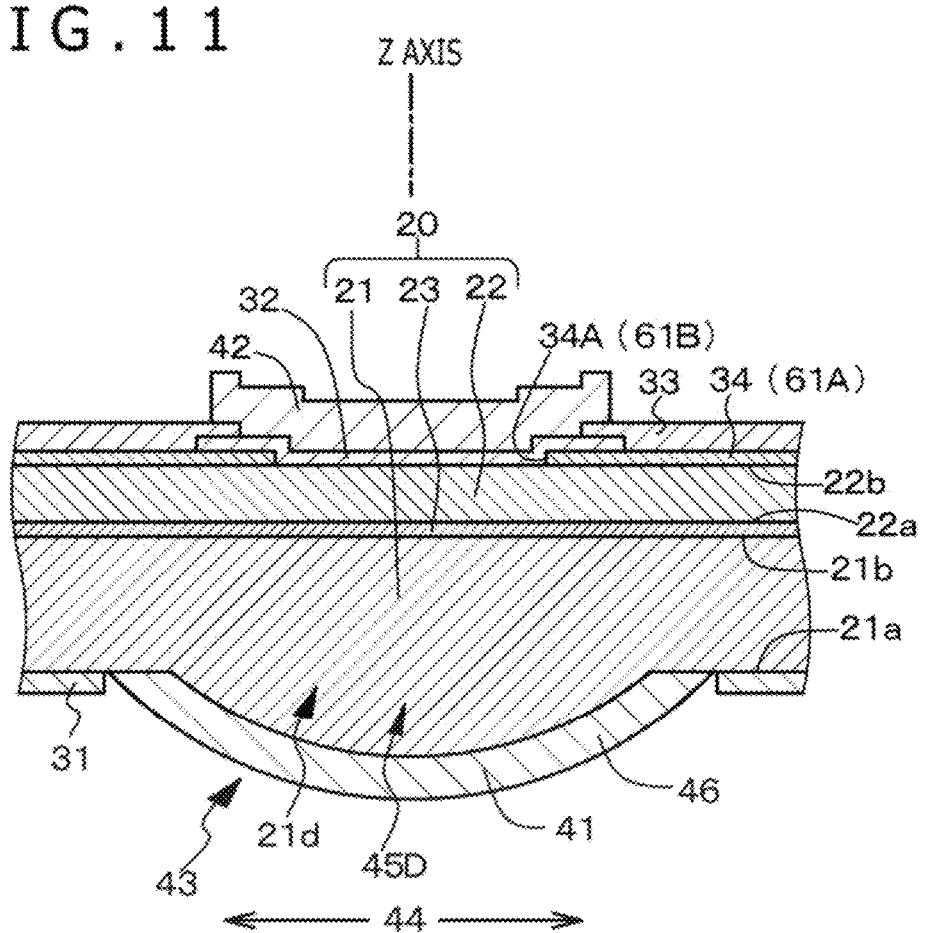
FIG. 11 is a schematic partial end view of a light emitting element of Embodiment 4.

A light emitting element of Embodiment 4 of which a schematic partial end view is depicted in FIG. 11, includes:
a stacked structure 20 including a GaN-based compound semiconductor;
a first light reflection layer 41; and
a second light reflection layer 42,
in which the stacked structure 20 includes, in a stacked state
a first compound semiconductor layer 21 that has a first surface 21a and a second surface 21b opposite to the first surface 21a,
an active layer 23 facing the second surface 21b of the first compound semiconductor layer 21, and
a second compound semiconductor layer 22 that has a first surface 22a facing the active layer 23 and a second surface 22b opposite to the first surface 22a,
the first light reflection layer 41 is disposed on the first surface 21a of the first compound semiconductor layer 21 and has a concave mirror section 43, the second light reflection layer 42 is disposed on the second surface 22b side of the second compound semiconductor layer 22 and has a flat shape, and
the first compound semiconductor layer 21 has an impurity concentration of equal to or less than $5 \times 10^{17}/cm^3$.

Here, let the sheet resistance of the first compound semiconductor layer 21 be $R_1$, let the sheet resistance of the second compound semiconductor layer 22 be $R_2$, and let the sheet resistance of the second electrode 32 be $R_{EL-2}$, then $R_1 < R_2$ and $R_{EL-2} < R_2$ are satisfied. Specifically, $R_1 = 1 \times 10^{-1} \Omega/\square$ $R_2 = 5 \times 10^4 \Omega/\square$ $R_{EL-2} = 3 \times 10^2 \Omega/\square$.

The first compound semiconductor layer 21 has a thickness of equal to or more than $1 \times 10^{-5}$ m, specifically, a thickness of 15 the second compound semiconductor layer 22 has a thickness of equal to or less than $1 \times 10^{-5}$ m, specifically, a thickness of 0.2 and the second compound semiconductor layer 22 has an impurity concentration of equal to or more than $5 \times 10^{17}/cm^3$, specifically, an impurity concentration of $5 \times 10^{18}/cm^3$. The second compound semiconductor layer 22 is doped with at least one impurity selected from the group consisting of magnesium and zinc, and is specifically doped with magnesium (Mg) as an impurity. The impurity concentration of the first compound semiconductor layer 21 is equal to or less than $5 \times 10^{17}/cm^3$, and is specifically $1 \times 10^{17}/cm^3$. The first compound semiconductor layer 21 is doped with at least one impurity selected from the group consisting of silicon, germanium, oxygen, and carbon, and is specifically doped with oxygen (O) as an impurity.

Figure 12:
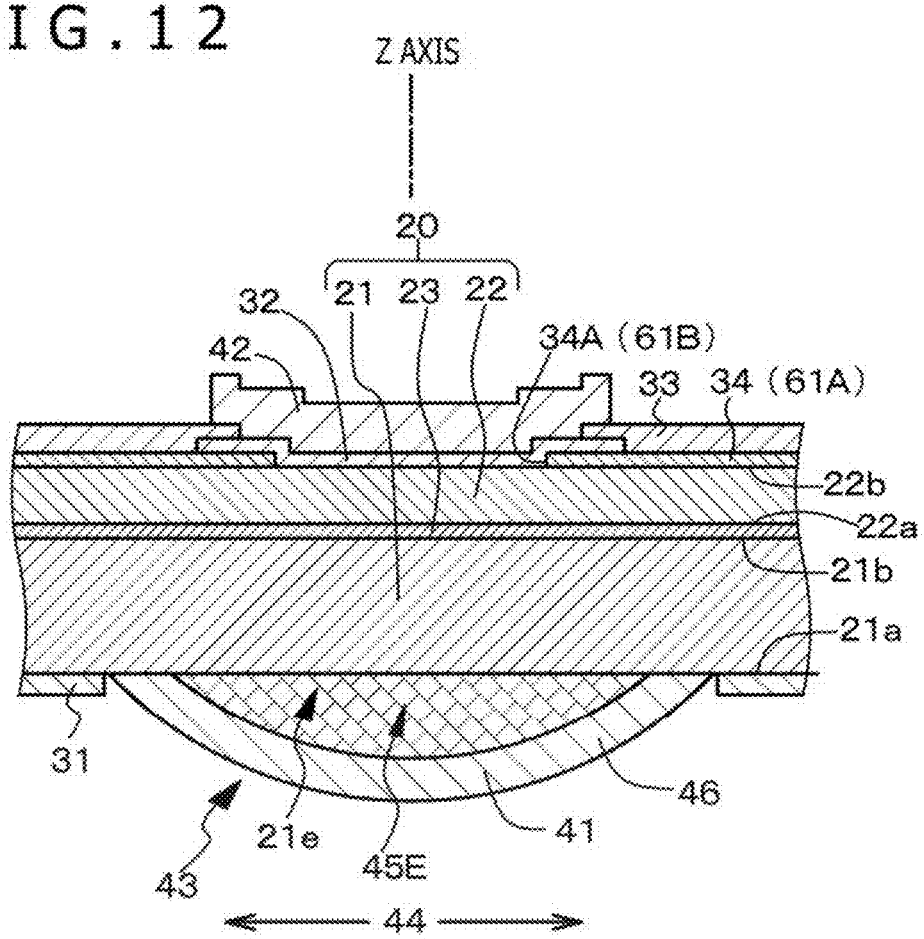
FIG. 12 is a schematic partial end view of a modification of the light emitting element of Embodiment 4.

Specifically, a first light reflection layer 41 is formed on the first surface 21a of the first compound semiconductor layer 21. In the manufacture of the light emitting element of Embodiment 4, in a step similar to [step-140] of Embodiment 1, a light emitting element production substrate 11 is removed, to expose the first surface 21a of the first compound semiconductor layer 21. Then, as in Embodiment 1, a patterned resist layer is formed on the first surface 21a of the first compound semiconductor layer 21 where to form a base section 45D, and the resist layer is heated to put the resist layer into reflow, thereby obtaining a resist pattern. A shape which is the same as (or similar to) the shape of a projected portion 21d is imparted to the resist pattern. Then, the resist pattern and the first surface 21a of the first compound semiconductor layer 21 are etched back, whereby the base section 45D including the projected portion 21d can be formed at the first surface 21a of the first compound semiconductor layer 21. Alternatively, in a modification of the light emitting element of Embodiment 4 of which a schematic partial end view is depicted in FIG. 12, for example, a $TiO_2$ layer or a $Ta_2O_5$ layer is formed on the first surface 21a of the first compound semiconductor layer 21, next a patterned resist layer is formed on the $TiO_2$ layer or $Ta_2O_5$ layer where to form a base section 45E, and the resist layer is heated to put the resist layer into reflow, thereby obtaining a resist pattern. A shape which is the same as (or similar to) the shape of a projected portion 21e is imparted to the resist pattern. Then, the resist pattern and the $TiO_2$ layer or $Ta_2O_5$ layer are etched back, whereby the base section 45E including the projected portion 21e can be formed on the first surface 21a of the first compound semiconductor layer 21.

Other configurations and structures of the light emitting element of Embodiment 4 and the modification thereof, than the above-mentioned points, may be similar to the configurations and structures of the light emitting element of Embodiment 1, and, therefore, detailed description thereof is omitted. In the light emitting element of Embodiment 4, the impurity concentration of the first compound semiconductor layer 21 is prescribed, and, accordingly, light absorption by a resonator can be restrained. Note that a support substrate 49 and a joining layer 48 may be left, without being removed, and, in this case, light is emitted to the exterior through the first light reflection layer 41.

Embodiment 5

Embodiment 5 is a modification of Embodiment 4. A schematic partial end view of a light emitting element of Embodiment 5 substantially similar to FIG. 12, and the configurations and structures of the light emitting element of Embodiment 5 may be substantially similar to the configurations and structures of the light emitting element of Embodiment 4, and, therefore, detailed description thereof is omitted.

Figure 13A:
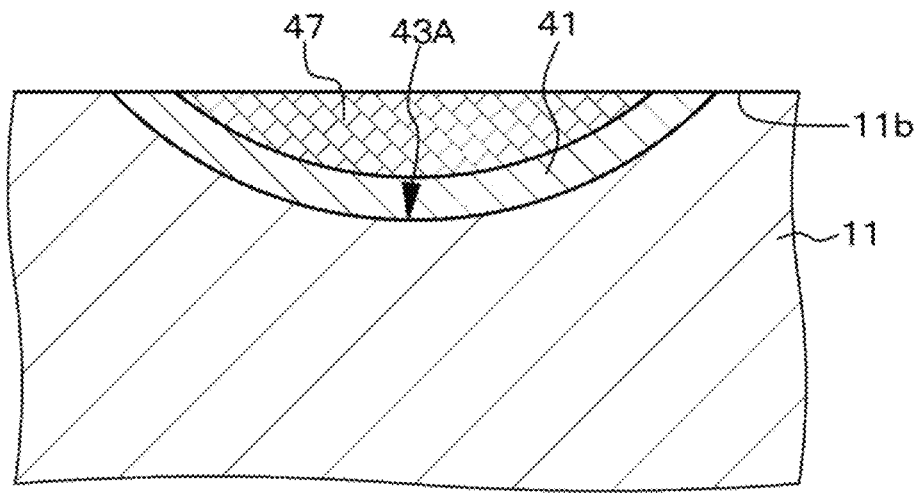
FIGS. 13A and 13B are schematic partial end views of a stacked structure or the like for explaining a producing method for a light emitting element of Embodiment 5.

In Embodiment 5, first, a second surface 11b of a compound semiconductor substrate 11 is formed with a recess 43A for forming a concave mirror section 43. Then, after a first light reflection layer 41 including a multilayer film is formed on the second surface 11b of the compound semiconductor substrate 11, a planarization film 47 is formed on the first light reflection layer 41, the planarization film 47 and the first light reflection layer 41 are subjected to a planarization treatment, and a part of the second surface 11b of the compound semiconductor substrate 11 is exposed while leaving the planarization film 47 and the first light reflection layer 41 (see FIG. 13A). The plan-view shape of the first light reflection layer 41 is circular. It is to be noted, however, that the shape of the first light reflection layer 41 is not limited to this.

Figure 13B:
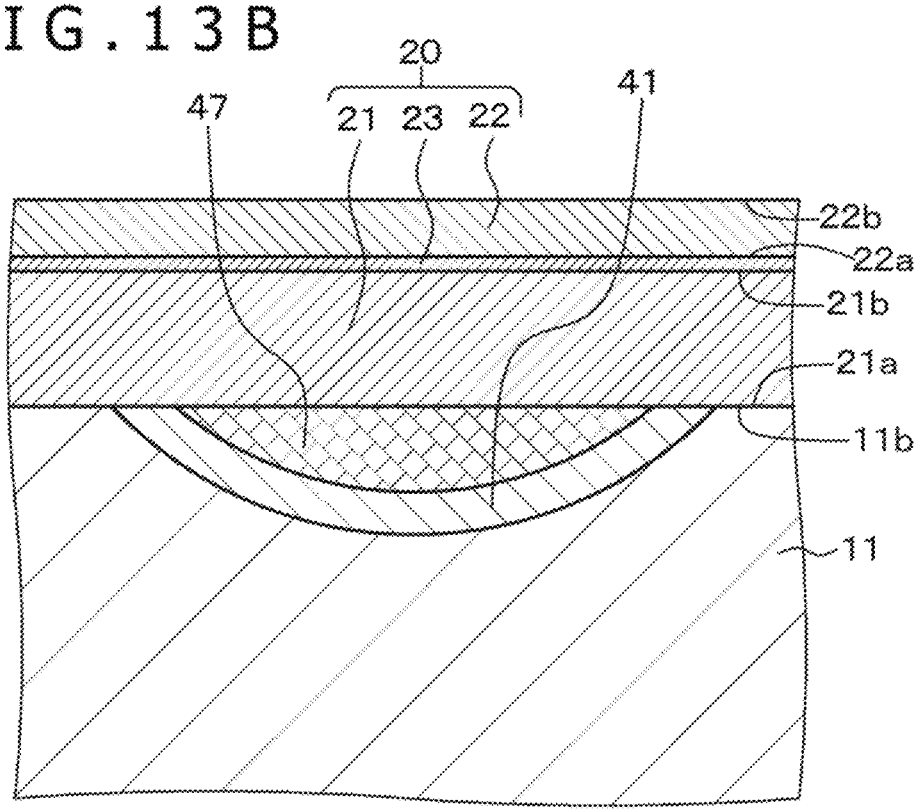

Next, a stacked structure 20 is formed on the compound semiconductor substrate 11 inclusive of the first light reflection layer 41, based on transverse growth by use of a transverse epitaxial growth method such as an ELO method (see FIG. 13B). Thereafter, [step-110] and [step-120] of Embodiment 1 are carried out. Then, the compound semiconductor substrate 11 is removed, and a first electrode 31 is formed on a first surface 21a of the first compound semiconductor layer 21 which is exposed. Alternatively, the first electrode 31 is formed on the first surface 11a of the compound semiconductor substrate 11, without removing the compound semiconductor substrate 11. Thereafter, what is generally called an element isolation is conducted to isolate the light emitting element, and a side surface and an exposed surface of the stacked structure are coated with an insulating film including SiO$_2$, for example. Then, packaging or sealing is performed, whereby the light emitting element of Embodiment 5 can be completed.

Embodiment 6

Embodiment 6 relates to the light emitting element according to the third mode of the present disclosure, specifically to the light emitting element according to the (3-A)th mode.

Figure 14:
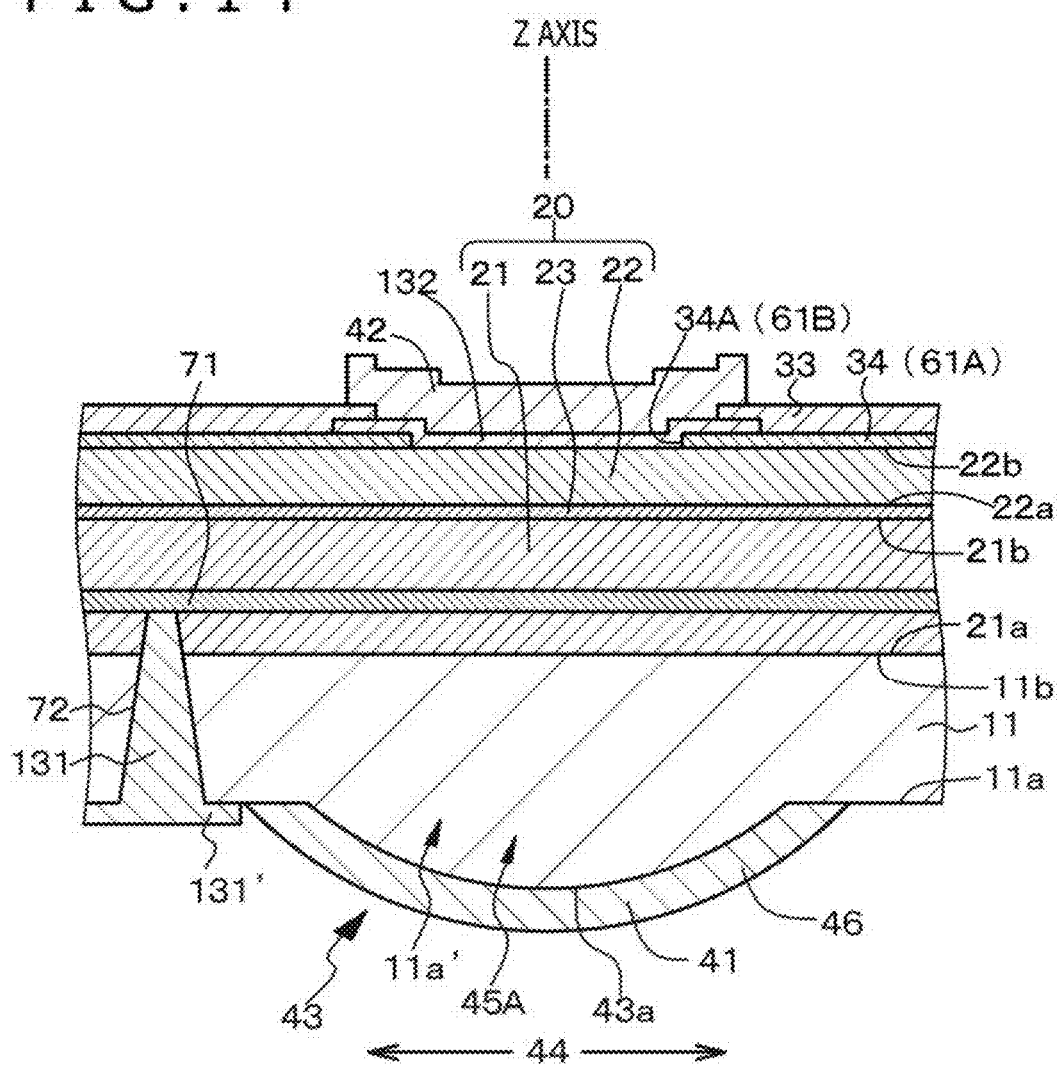
FIG. 14 is a schematic partial end view of a light emitting element of Embodiment 6.

As a schematic partial end view is depicted in FIG. 14, a light emitting element of Embodiment 6 includes:
a stacked structure 20 including a GaN-based compound semiconductor;
a first light reflection layer 41; and
a second light reflection layer 42,
in which the stacked structure 20 includes, in a stacked state
a first compound semiconductor layer 21 that has a first surface 21a and a second surface 21b opposite to the first surface 21a,
an active layer 23 facing the second surface 21b of the first compound semiconductor layer 21, and
a second compound semiconductor layer 22 that has a first surface 22a facing the active layer 23 and a second surface 22b opposite to the first surface 22a,
the first light reflection layer 41 is disposed on the first surface 21a side of the first compound semiconductor layer 21 and has a concave mirror section 43,
the second light reflection layer 42 is disposed on the second surface 22b side of the second compound semiconductor layer 22 and has a flat shape, and
the first compound semiconductor layer 21 is formed with at least one (in the example illustrated, one) low-resistance layer 71 in parallel to a virtual plane occupied by the active layer 23.

The light emitting element of Embodiment 6 further includes:
a first electrode 131; and
a second electrode 132,
in which the second electrode 132 is formed between the second light reflection layer 42 and the second light reflection layer 42,
the first compound semiconductor layer 21 is formed with an opening 72 which reaches the low-resistance layer 71, and
the first electrode 131 in contact with the low-resistance layer 71 is formed in the opening 72.

Note that a first electrode extension section 131' extends on the first surface 11a of the compound semiconductor substrate 11 from the first electrode 131 formed inside the opening 72. In addition, the thickness of the low-resistance layer 71 is equal to or less than $1\times10^{-5}$ m, and is specifically 0.02 μm. Further, the impurity concentration of the low-resistance layer 71 is higher than the impurity concentration of the first compound semiconductor layer 21. Specifically, the impurity concentration of the low-resistance layer 71 is equal to or more than $1\times10^{18}$/cm$^3$, and is more specifically $5\times10^{19}$/cm$^3$, while the impurity concentration of the first compound semiconductor layer 21 is equal to or less than $5\times10^{17}$/cm$^3$, and is more specifically $5\times10^{16}$/cm$^3$. Here, the low-resistance layer 71 is doped with at least one impurity selected from the group consisting of silicon, germanium, oxygen, and carbon, and is more specifically doped with germanium (Ge) as an impurity. Further, the low-resistance layer 71 is located at a minimum amplitude portion generated in a standing wave of light formed inside the stacked structure 20, and the active layer 23 is located at a maximum amplitude portion generated in the standing wave of light formed inside the stacked structure 20. Specifically, let the oscillation wavelength be $\lambda_0$, let the equivalent refractive index of the active layer 23 and the first compound semiconductor layer 21 be $n_{eq}$, and let the distance between the active layer 23 and the low-resistance layer 71 be $L_{HCL}'$, then it is preferable that $$0.9\times\{(m\cdot\lambda_0)/(2\cdot n_{eq})\} \le L_{HCL}' \le 1.1\times\{(m\cdot\lambda_0)/(2\cdot n_{eq})\}$$

is satisfied. Here, m is 1, or is 2 or more any integer including 1. The low-resistance layer 71 functions also as a light absorbing material layer. The light absorbing material layer will be described later.

In Embodiment 6, also, let the sheet resistance of the first compound semiconductor layer 21 be $R_1$, let the sheet resistance of the second compound semiconductor layer 22 be $R_2$, and let the sheet resistance of the second electrode 132 be $R_{EL-2}$, then $R_1 < R_2$ and $R_{EL-2} < R_2$ are satisfied.

In the light emitting element of Embodiment 6, the first compound semiconductor layer is formed with at least one low-resistance layer, so that generation of a situation in which the contact resistance between the compound semiconductor layer and the electrode would increase can be avoided, power consumption can be suppressed, and, as a result, light absorption by the resonator can be restrained.

As a modification of Embodiment 6, the low-resistance layer 71 may include a GaN-based compound semiconductor material, and the GaN-based compound semiconductor material constituting the first compound semiconductor layer 21 and the GaN-based compound semiconductor material constituting the low-resistance layer 71 may be different from each other in composition. Besides, in this case, the bandgap of the GaN-based compound semiconductor material constituting the low-resistance layer 71 may be narrower than the bandgap of the GaN-based compound semiconductor material constituting the first compound semiconductor layer 21. Specifically, the GaN-based compound semiconductor material constituting the first compound semiconductor layer 21 includes GaN, while the GaN-based compound semiconductor material constituting the low-resistance layer 71 includes $In_{0.035}Ga_{0.965}N$.

In addition, the light emitting element of Embodiment 6 may be combined with at least one of the light emitting elements described in the light emitting elements of Embodiments 1 to 5.

Figure 15:
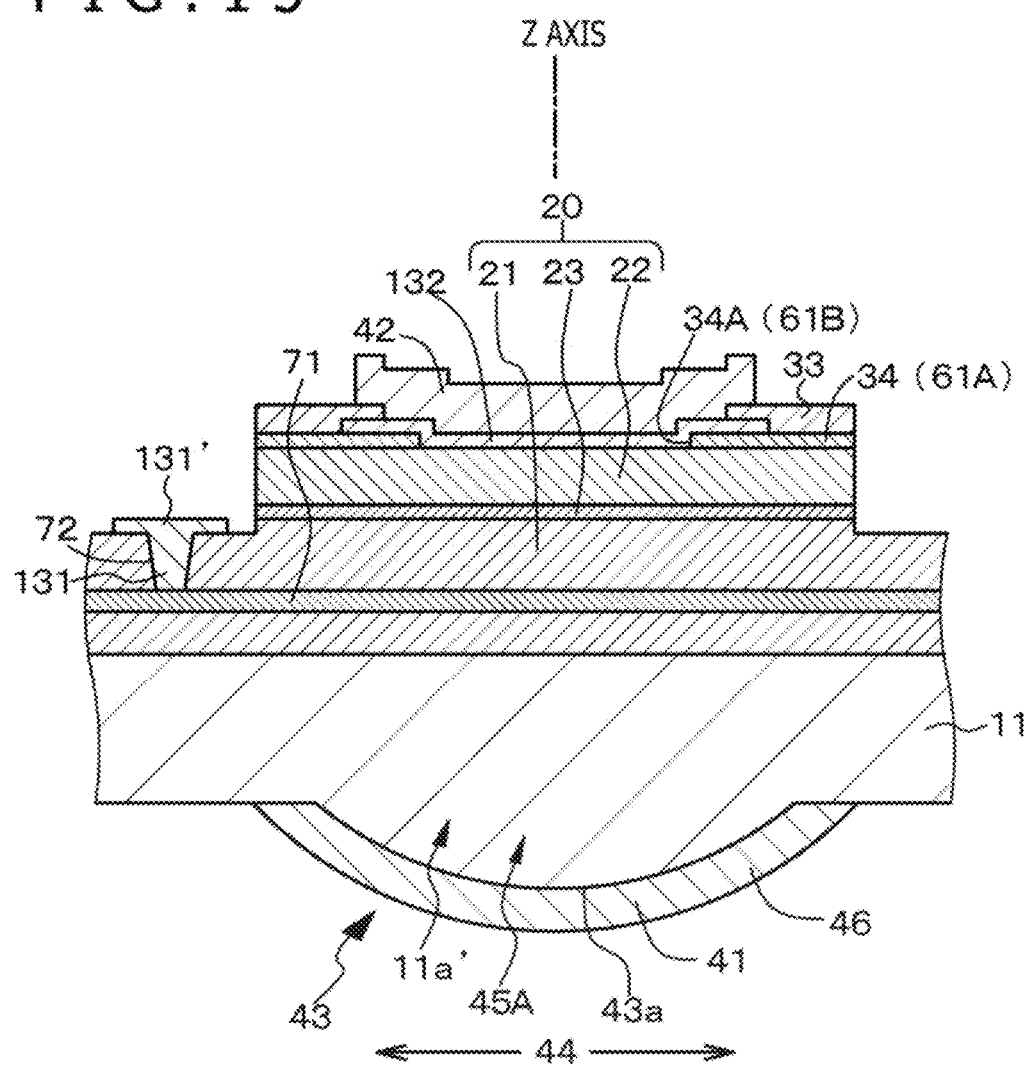
FIG. 15 is a schematic partial end view of a modification of the light emitting element of Embodiment 6.

In an example depicted in FIG. 14, the first electrode 131 extends from the first surface 21a side of the first compound semiconductor layer 21 toward the low-resistance layer 71. In a modification of the light emitting element of Embodiment 6 of which a schematic partial end view is depicted in FIG. 15, the stacked structure 20 has a mesa structure. Specifically, the second compound semiconductor layer 22, the active layer 23, and a part in the thickness direction of the first compound semiconductor layer 21 are etched by an RIE method or the like, to form the mesa structure. Besides, the first electrode extension section 131' is formed on the first compound semiconductor layer 21 which is exposed, and the first electrode 131 extends from the first electrode extension section 131' to the low-resistance layer 71, inside an opening 72 formed in the first compound semiconductor layer 21.

Embodiment 7

Figure 16:
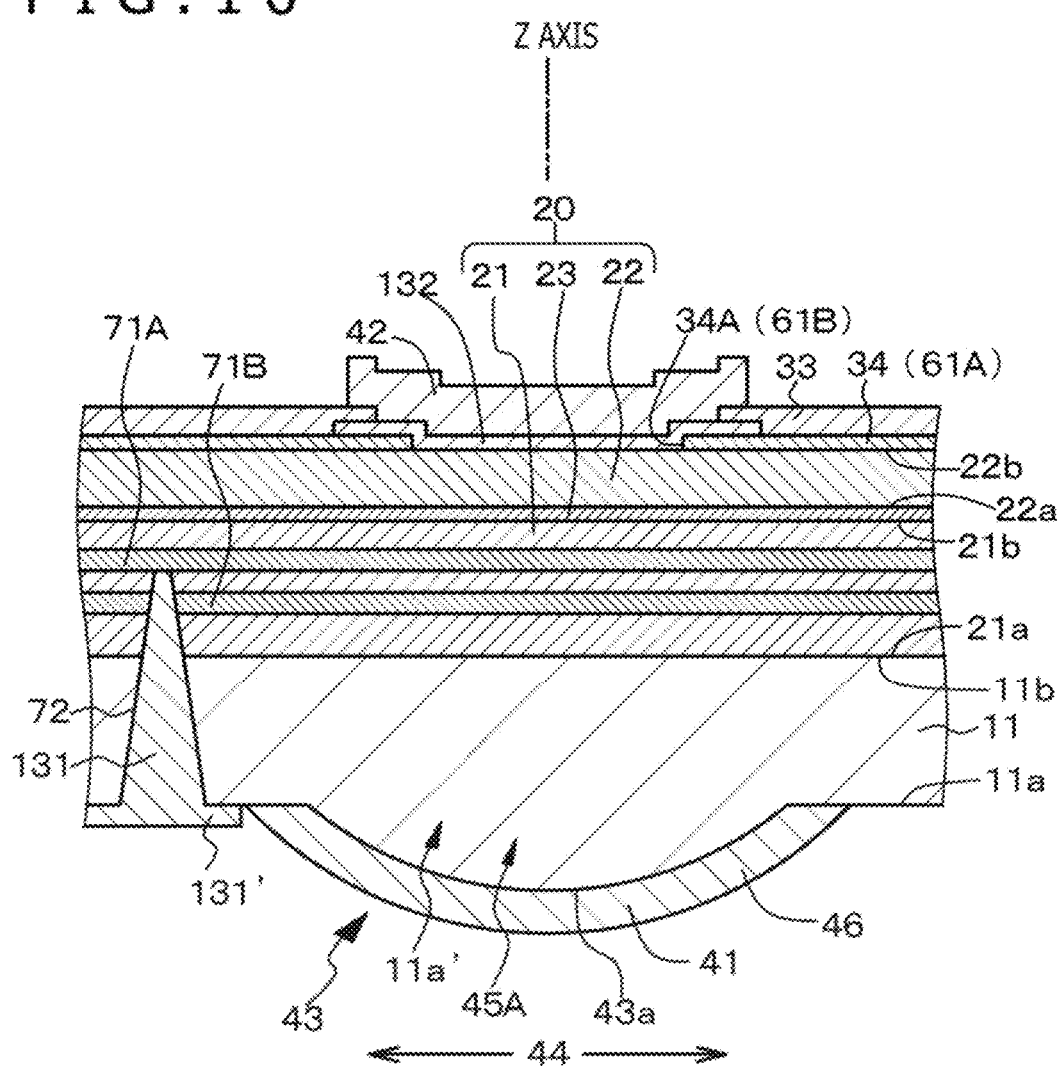
FIG. 16 is a schematic partial end view of a light emitting element of Embodiment 7.

Embodiment 7 is a modification of Embodiment 6, and relates to the light emitting element of the (3-B)th mode of the present disclosure. In Embodiment 6, one low-resistance layer 71 was provided in the first compound semiconductor layer 21. On the other hand, the light emitting element of Embodiment 7, as a schematic partial end view thereof is depicted in FIG. 16, further includes:

a first electrode 131; and a second electrode 132, in which the first compound semiconductor layer 21 is formed with at least two (in the example illustrated, two) low-resistance layers 71A and 71B, the first compound semiconductor layer 21 is formed with an opening 72 ranging over the at least two low-resistance layers 71A and 71B, and the first electrode 131 in contact with the at least two low-resistance layers 71A and 71B is formed inside the opening 72.

In the light emitting element of Embodiment 7, let the oscillation wavelength be $\lambda_0$, and let the equivalent refractive index of the plurality of low-resistance layers 71A and 71B and that part of the first compound semiconductor layer 21 which is located between the low-resistance layer 71A and the low-resistance layer 71B be $n_{1-eq}$, then the thickness of the low-resistance layers 71A and 71B is equal to or less than $\lambda_0/(4 \cdot n_{1-eq})$. Further, let the distance between the low-resistance layer 71A and the low-resistance layer 71B be $L_{HCL}$, then $$0.9 \times \{(m \cdot \lambda_0)/(2 \cdot n_{1-eq})\} \leq L_{HCL} \leq 1.1 \times \{(m \cdot \lambda_0)/(2 \cdot n_{1-eq})\}$$

is satisfied. It is to be noted that m is 1, or is 2 or more any integer including 1.

In Embodiment 7, also, the impurity concentrations of the low-resistance layers 71A and 71B are higher than the impurity concentration of the first compound semiconductor layer 21. In this case, as in Embodiment 6, the impurity concentrations of the low-resistance layers 71A and 71B are equal to or more than $1 \times 10^{18}/cm^3$, while the impurity concentration of the first compound semiconductor layer 21 is equal to or less than $5 \times 10^{17}/cm^3$. Further, as in Embodiment 6, the low-resistance layers 71A and 71B and the first compound semiconductor layer 21 are doped with at least one impurity selected from the group consisting of silicon, germanium, oxygen, and carbon.

Alternatively, in the light emitting element of Embodiment 7, as in the modification of Embodiment 6, the low-resistance layers 71A and 71B include a GaN-based compound semiconductor material, and the GaN-based compound semiconductor material constituting the first compound semiconductor layer 21 and the GaN-based compound semiconductor material constituting the low-resistance layers 71A and 71B are different from each other in composition. In this case, the bandgap of the GaN-based compound semiconductor material constituting the low-resistance layers 71A and 71B may be narrower than the bandgap of the GaN-based compound semiconductor material constituting the first compound semiconductor layer 21.

Other configurations and structures of the light emitting element of Embodiment 7, than the above-mentioned points, may be similar to the configurations and structures of the light emitting element of Embodiment 6, and the light emitting element of Embodiment 7 may be combined with at least one of the light emitting elements described in the light emitting elements of Embodiments 1 to 5.

Figure 17:
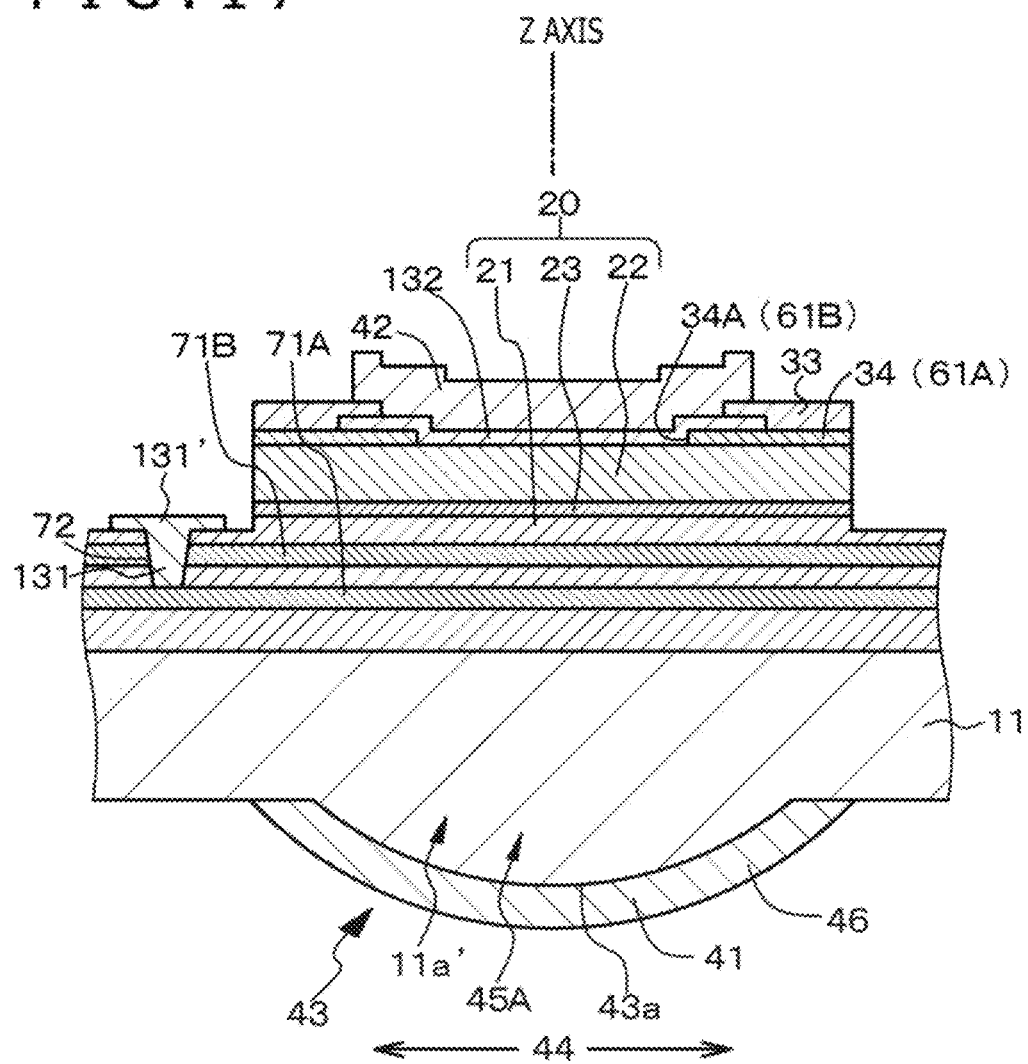
FIG. 17 is a schematic partial end view of a modification of the light emitting element of Embodiment 7.

In addition, in the example depicted in FIG. 16, the first electrode 131 extends from the first surface 21a side of the first compound semiconductor layer 21 toward the low-resistance layers 71A and 71B. On the other hand, as a schematic partial end view is depicted in FIG. 17, in a modification of the light emitting element of Embodiment 7, also, as in illustration in FIG. 15, a first electrode extension section 131' may be formed on the first compound semiconductor layer 21 which is exposed, and the first electrode 131 may extend from the first electrode extension section 131' to the low-resistance layers 71A and 71B, inside an opening 72 formed in the first compound semiconductor layer 21.

Embodiment 8

Embodiment 8 is a modification of Embodiments 6 and 7.

Figure 18:
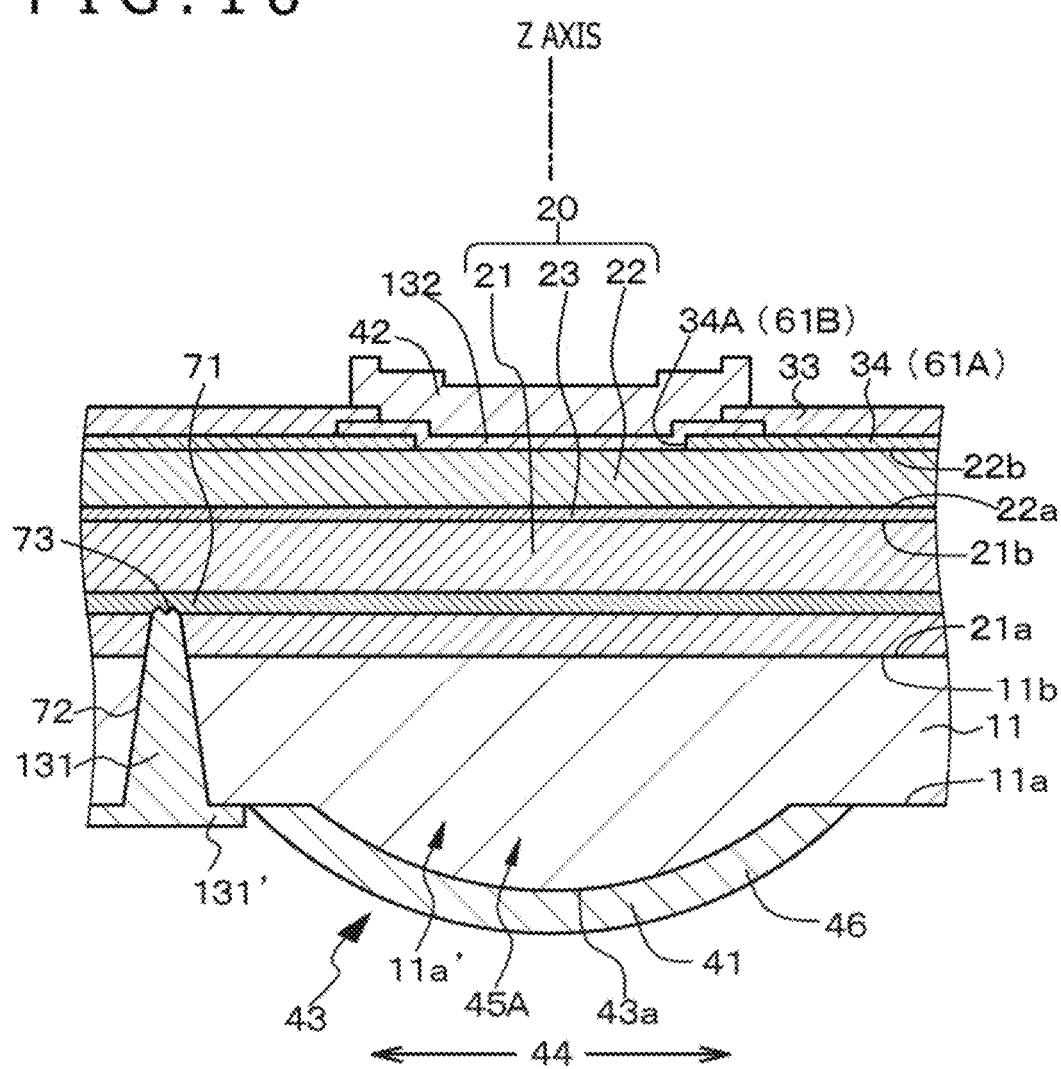
FIG. 18 is a schematic partial end view of a light emitting element of Embodiment 8.
Figure 19:
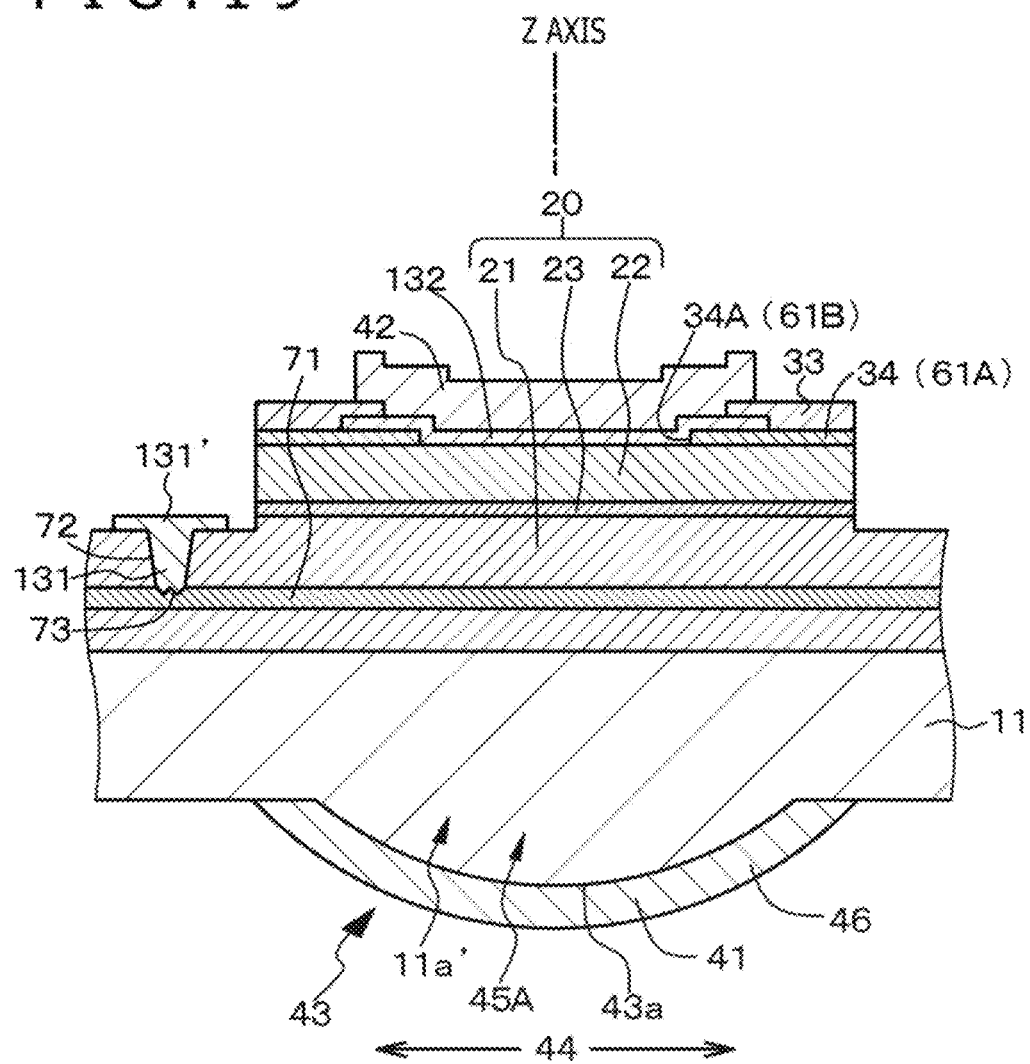
FIG. 19 is a schematic partial end view of a modification of the light emitting element of Embodiment 8.
Figure 20A:
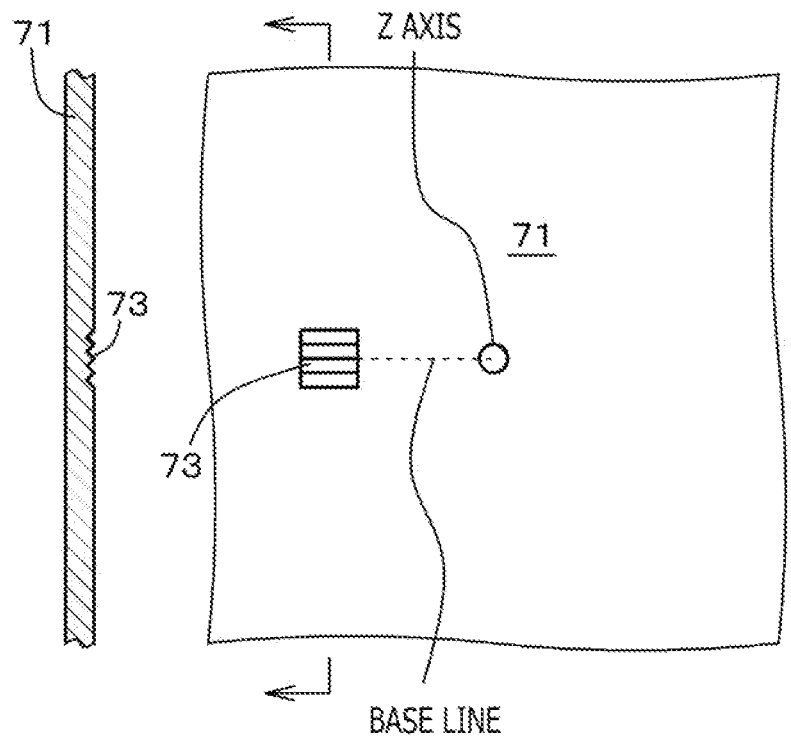
FIGS. 20A and 20B are schematic plan views depicting a bottom portion of an opening in an imaging device of Embodiment 8.
Figure 20B:
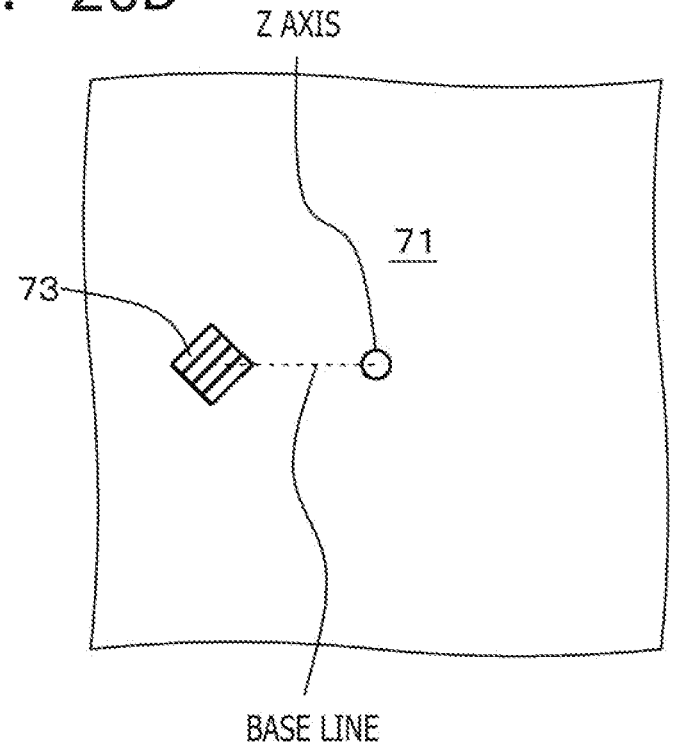

As a schematic partial end view is depicted in FIG. 18 or 19, and as a bottom portion 73 of an opening 72 is depicted in schematic plan views in FIGS. 20A and 20B, in a light emitting element of Embodiment 8 to which Embodiment 6 is applied, a first electrode 131 is in contact with a low-resistance layer 71 at the bottom portion 73 of the opening 72, the bottom portion 73 of the opening 72 has a rugged shape, and when 71 a base line that connects an axis (Z axis) passing through a center point of a first light reflection layer 41 and a center point of a second light reflection layer 42 with a center point of the bottom portion 73 of the opening 72 is drawn on the low-resistance layer, the angle formed between the base line and a direction in which a recessed portion and a projected portion of the rugged shape extend is 0 to 45 degrees. Note that, in the example depicted in FIG. 20A, this angle is 0 degrees, while in the example depicted in FIG. 20B, this angle is 45 degrees. In addition, the figure on the left side in FIG. 20A is a schematic partial end view along an arrow of the figure on the right side in FIG. 20A.

Figure 21:
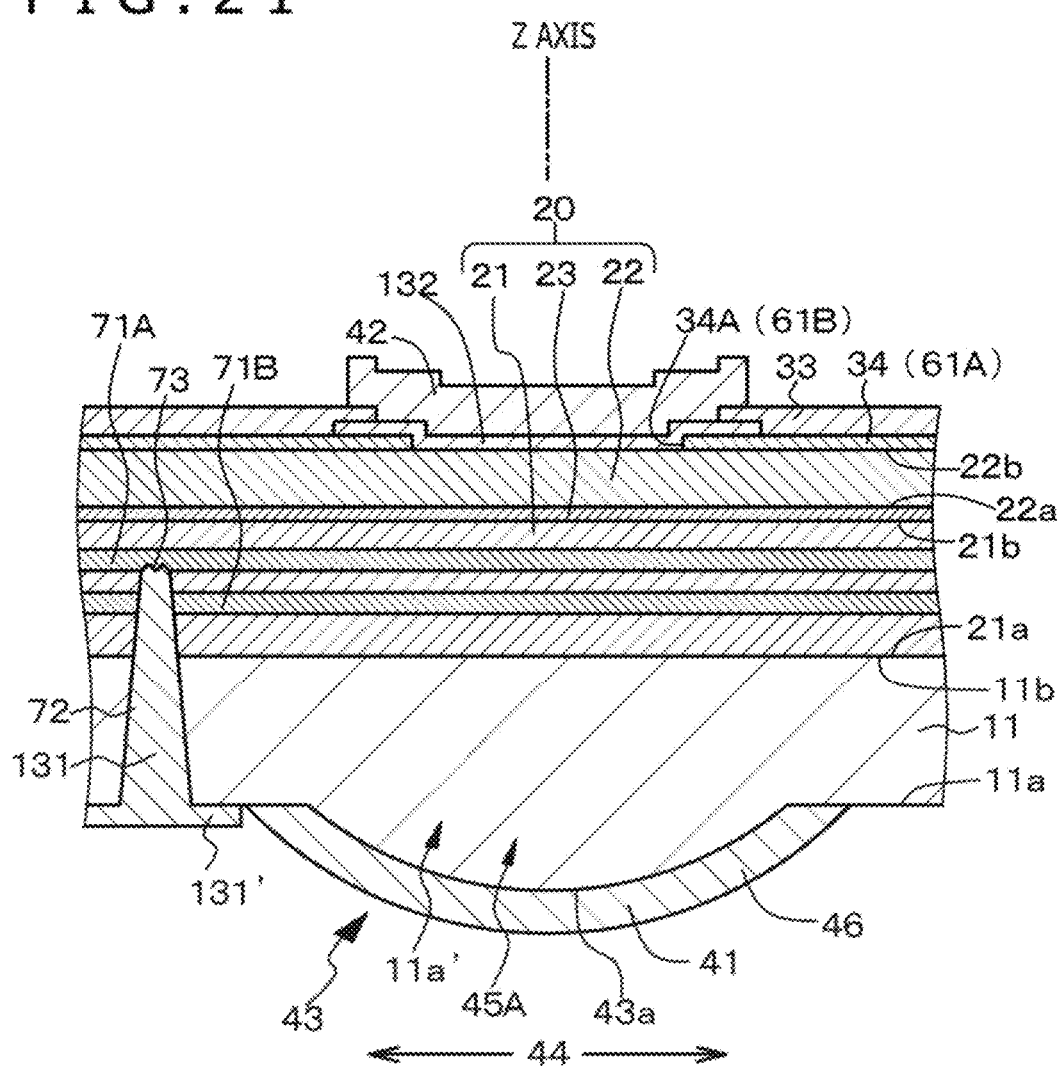
FIG. 21 is a schematic partial end view of another modification of the light emitting element of Embodiment 8.
Figure 22:
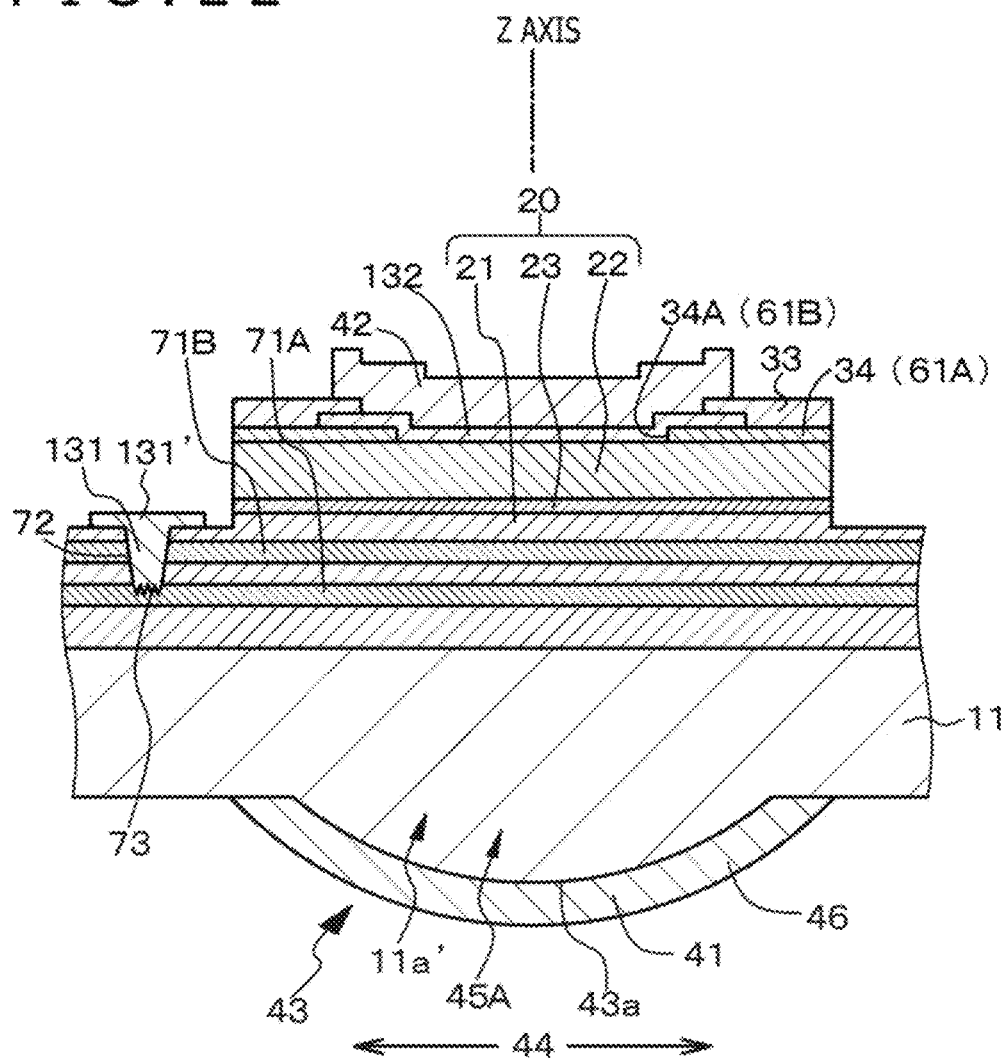
FIG. 22 is a schematic partial end view of a further modification of the light emitting element of Embodiment 8.

Besides, as a schematic partial end view is depicted in FIG. 21 or 22, in a light emitting element of Embodiment 8 to which Embodiment 7 or its modification is applied, a first electrode 131 is in contact with one layer 71A of a low-resistance layer at a bottom portion 73 of an opening 72, the first electrode 131 is in contact with the other layer 71B of the low-resistance layer 71 at a side surface of the opening 72, the bottom portion of the opening 72 has a rugged shape, and when a base line that connects an axis passing through a center point of a first light reflection layer 41 and a center point of a second light reflection layer 42 with a center point of the bottom portion of the opening 72 is formed on the low-resistance layer 71, the angle formed between the base line and a direction in which a recessed portion and a projected portion of the rugged shape extend is 0 to 45 degrees.

With the bottom portion of the opening 72 thus having the rugged shape, an increase in the area of contact with the low-resistance layers 71 and 71A can be realized, and a reduction in the contact resistance between the low-resistance layers 71 and 71A and the first electrode 131 can be realized. Moreover, with the angle formed between the base line and the direction in which the recessed portion and the projected portion of the rugged shape extend being set to 0 to 45 degrees, a flow of current between the first electrode and a second electrode can be put into a smooth state.

Embodiment 9

Embodiment 9 is a modification of Embodiments 1 to 8, and relates to the light emitting element of the first configuration. As aforementioned, by the insulating layer 34 having the opening 34A, the current constriction region (the current injection region 61A and the current non-injection region 61B) is defined. That is, the current injection region 61A is defined by the opening 34A. In other words, in the light emitting element of Embodiment 9, the second compound semiconductor layer 22 is provided with the current injection region 61A and the current non-injection region 61B surrounding the current injection region 61A, and the shortest distance $D_{CI}$ from an area center of gravity of the current injection region 61A to a boundary 61C between the current injection region 61A and the current non-injection region 61B satisfies the aforementioned formulas (1-1) and (1-2).

In the light emitting element of Embodiment 9, the radius r'DBR of an effective region in the concave mirror section 43 of the first light reflection layer 41 satisfies $$\omega_0 \leq r'_{DBR} \leq 20 \cdot \omega_0.$$

In addition, $D_{CI} \geq \omega_0$ is satisfied. Further, $R_{DBR} \leq 1 \times 10^{-3} M$ is satisfied. Specifically, $$D_{CI} = 4 \ \mu m$$

$$\omega_0 = 1.5 \ \mu m$$

$$L_{OR} = 50 \ \mu m$$

$$R_{DBR} = 60 \ \mu m$$

$$\lambda_0 = 525 \ nm$$

may be exemplified. Besides, as a diameter of the opening 34A, 8 μm may be exemplified. As a GaN substrate, there is used a substrate in which a surface obtained by inclining a c-plane by approximately 75 degrees to an m-axis direction is made to be a principal surface. In other words, the GaN substrate has a {20-21} plane, which is a semi-polar plane, as a principal surface. Note that such a GaN substrate can be used also in other embodiments.

A deviation between the center axis (Z axis) of the concave mirror section 43 and the current injection region 61A in XY plane directions causes worsening of characteristics of the light emitting element. A lithography technique is often used for both patterning for forming the concave mirror section 43 and patterning for forming the opening 34A, and, in this case, the positional relation of both of them is often deviated in the XY plane according to the performance of an exposure apparatus. Particularly, the opening 34A (current injection region 61A) is positioned by alignment conducted from the side of the second compound semiconductor layer 22. On the other hand, the concave mirror section 43 is positioned by alignment performed from the side of the compound semiconductor substrate 11. In view of this, in the light emitting element of Embodiment 9, the opening 34A (current injection region 61) is formed to be larger than the region to which light is converged by the concave mirror section 43, whereby there is realized a structure in which oscillation characteristics are not influenced even when a deviation is generated between the center axis (Z axis) of the concave mirror section 43 and the current injection region 61A in the XY plane directions.

Specifically, in the case where the region to which light reflected by the first light reflection layer is concentrated is not included in the current injection region corresponding to a region in which the active layer has a gain owing to current injection, induction release of light from the carrier may be hindered, and, eventually, laser oscillation may be hindered. However, with the above-mentioned formulas (1-1) and (1-2) satisfied, it can be ensured that the region to which the light reflected by the first light reflection layer is concentrated is included in the current injection region, whereby laser oscillation can be achieved securely.

Embodiment 10

Figure 23:
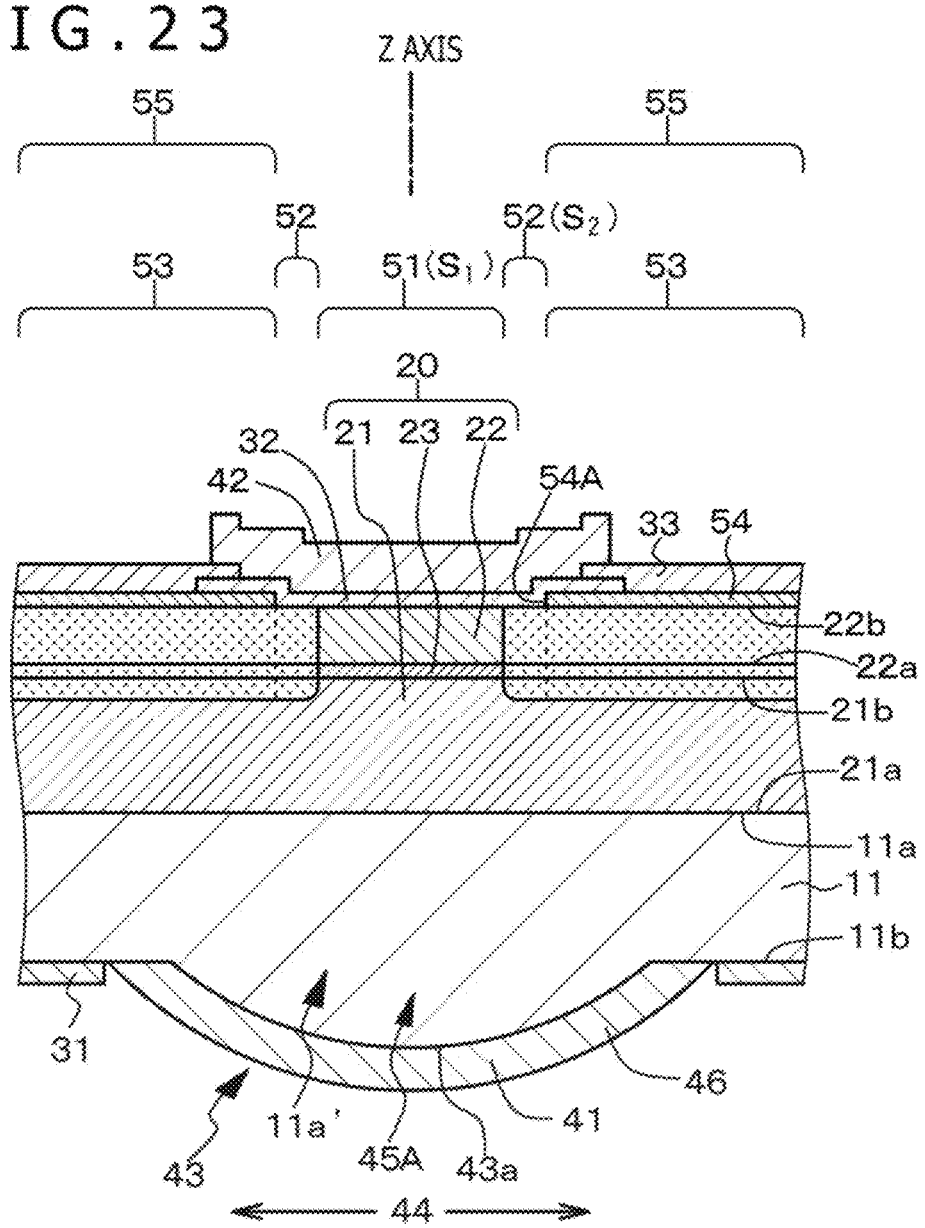
FIG. 23 is a schematic partial end view of a light emitting element of Embodiment 10.

Embodiment 10 is a modification of Embodiments 1 to 9, and relates to the light emitting element of the second configuration, specifically, the light emitting element of the (2-A)th configuration. A schematic partial end view of a light emitting element of Embodiment 10 is depicted in FIG. 23.

Incidentally, for controlling a flow path (current injection region) of a current flowing between a first electrode and a second electrode, a current non-injection region is formed in such a manner as to surround a current injection region. In a GaAs-based surface emitting laser element (a surface emitting laser element that includes a GaAs-based compound semiconductor), an active layer is oxidized from outside along an XY plane, whereby a current non-injection region surrounding a current injection region can be formed. The oxidized region (current non-injection region) of the active layer is lowered in refractive index as compared to the non-oxidized region (current injection region). As a result, the optical path length (represented by the product of refractive index and physical distance) of the resonator is shorter in the current non-injection region than in the current injection region. As a result, a kind of "lens effect" is generated, which acts to confine the laser light in a central part of the surface emitting laser element. In general, light tends to spread due to a diffraction effect, so that the laser light reciprocating in a resonator would be gradually dissipated to the outside of the resonator (diffraction loss), generating a bad influence such as an increase in a threshold current. However, the lens effect compensates for the diffraction loss, so that an increase in the threshold current can be restrained.

However, in the light emitting element that includes the GaN-based compound semiconductor, it is difficult, due to characteristics of material, to externally (laterally) oxidize the active layer along the XY plane. In view of this, as described in Embodiments 1 to 9, the insulating layer 34 including $SiO_2$ and having an opening is formed on the second compound semiconductor layer 22, the second electrode 32 including a transparent conductive material is formed over a range of the second compound semiconductor layer 22 exposed at a bottom portion of the opening 34A to a position on the insulating layer 34, and a second light reflection layer 42 including a stacked structure of insulating materials on the second electrode 32. With the insulating layer 34 thus formed, a current non-injection region 61B is formed. That part of the second compound semiconductor layer 22 which is located in the opening 34A provided in the insulating layer 34 becomes a current injection region 61A.

Figure 25:
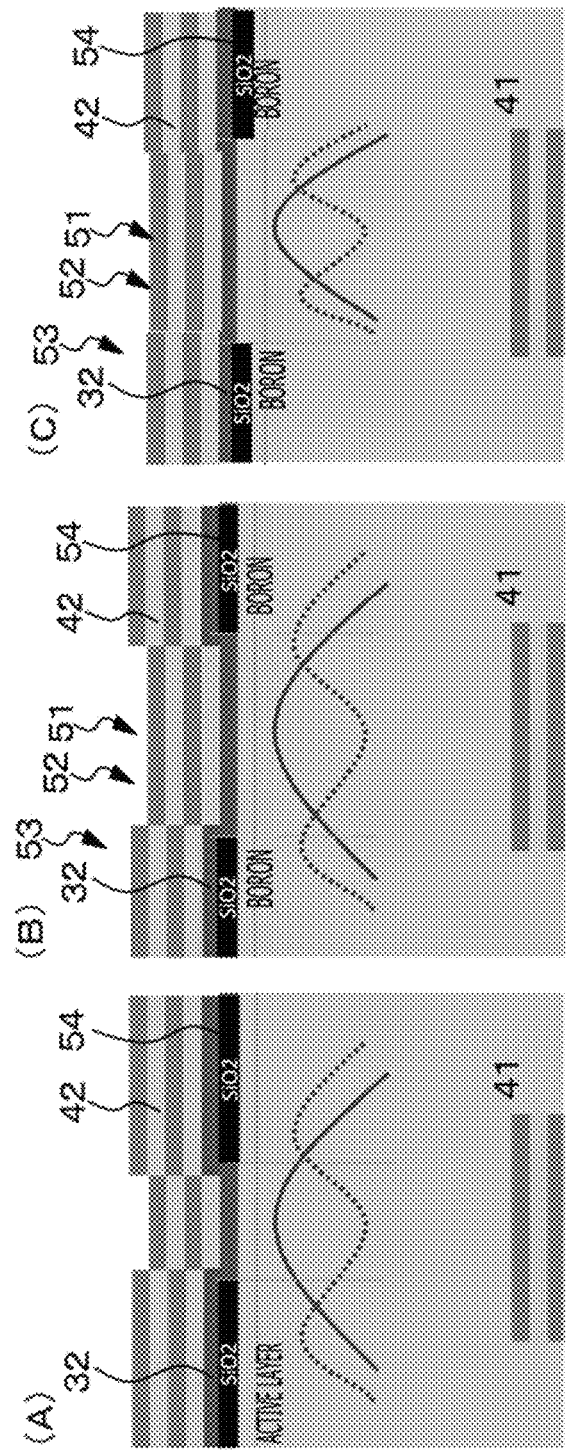
FIGS. 25(A), 25(B), and 25(C) are conceptual diagrams depicting light field intensities in a conventional light emitting element, the light emitting element of Embodiment 10, and a light emitting element of Embodiment 13, respectively.

In the case where the insulating layer 34 is formed on the second compound semiconductor layer 22, the cavity length in the region where the insulating layer 34 is formed (the current non-injection region 61B) is longer than the cavity length in the region where the insulating layer 34 is not formed (the current injection region 61A), by the optical length of the insulating layer 34. Therefore, there is generated an action by which the laser light reciprocating in the resonator formed by the two light reflection layers 41 and 42 of the surface emitting laser element (light emitting element) is dispersed and dissipated to the outside of the resonator. Such an action is referred to as an "inverse lens effect" for convenience' sake. As a result, oscillation mode loss is generated in the laser light, possibly increasing the threshold current or worsening the slope efficiency. Here, the "oscillation mode loss" is a physical quantity that gives variation in the light field intensity in a fundamental mode and higher order modes of the laser light oscillated, and different oscillation mode losses are defined for individual modes. The "light field intensity" is a light field intensity with a distance L in the XY plane from the Z axis as a function; in general, in the fundamental mode, the light field intensity decreases monotonously with an increase in the distance L, but, in the higher order modes, the light field intensity reaches a decrease while once performing or repeating variation with an increase in the distance L (see a conceptual diagram of (A) of FIG. 25). In FIG. 25, solid lines represent a light field intensity distribution in the fundamental mode, and broken lines represent a light field intensity distribution in a higher order mode. In addition, while the first light reflection layer 41 is represented in a flat state in FIG. 25 for convenience' sake, the first light reflection layer 41 in practice has the concave mirror section.

The light emitting element of Embodiment 10 or the light emitting elements of Embodiments 11 to 14 described later include:

(A) a stacked structure 20 including a GaN-based compound semiconductor, the stacked structure 20 including, in a stacked state, a first compound semiconductor layer 21 that has a first surface 21a and a second surface 21b opposite to the first surface 21a, an active layer (light emitting layer) 23 facing the second surface 21b of the first compound semiconductor layer 21, and a second compound semiconductor layer 22 that has a first surface 22a facing the active layer 23 and a second surface 22b opposite to the first surface 22a;

(B) a mode loss action part (mode loss action layer) 54 that is provided on the second surface 22b of the second compound semiconductor layer 22 and constitutes a mode loss action region 55 acting on variation in oscillation mode loss;

(C) a second electrode 32 that is formed over a range of a position on the second surface 22b of the second compound semiconductor layer 22 to a position on the mode loss action part 54;

(D) a second light reflection layer 42 formed on the second electrode 32;

(E) a first light reflection layer 41 provided on the first surface 21a side of the first compound semiconductor layer 21; and (F) a first electrode 31 electrically connected to the first compound semiconductor layer 21.

Besides, the stacked structure 20 is formed with a current injection region 51, a current non-injection inside region 52 surrounding the current injection region 51, and a current non-injection outside region 53 surrounding the current non-injection inside region 52, and an orthogonal projection image of the mode loss action region 55 and an orthogonal projection image of the current non-injection outside region 53 overlap with each other. In other words, the current non-injection outside region 53 is located on a lower side of the mode loss action region 55. Note that, in a region sufficiently remote from the current injection region 51 where a current is injected, the orthogonal projection image of the mode loss action region 55 and the orthogonal projection image of the current non-injection outside region 53 may not overlap with each other. Here, the stacked structure 20 is formed with the current non-injection regions 52 and 53 where a current is not injected, and, in the illustrated example, these regions are formed over a range of the second compound semiconductor layer 22 to a part of the first compound semiconductor layer 21, in the thickness direction. It is to be noted, however, that the current non-injection regions 52 and 53 may be formed in a region on the second electrode side of the second compound semiconductor layer 22, or may be formed ranging over the whole part of the second compound semiconductor layer 22, or may be formed in the second compound semiconductor layer 22 and the active layer 23, in the thickness direction.

The mode loss action part (mode loss action layer) 54 includes a dielectric material such as $SiO_2$, and is formed, in the light emitting elements of Embodiment 10 or Embodiments 11 to 14 described later, between the second electrode 32 and the second compound semiconductor layer 22. The optical thickness of the mode loss action part 54 may be a value deviated from an integer times of ¼ of the wavelength $\lambda_0$ of the light generated in the light emitting element. Alternatively, the optical thickness to of the mode loss action part 54 may be an integer times of ¼ of the wavelength $\lambda_0$ of the light generated in the light emitting element. In other words, the optical thickness to of the mode loss action part 54 may be such a thickness as not to disturb the phase of the light generated in the light emitting element and not to break the standing wave of the light. It is to be noted, however, that the optical thickness to may not necessarily be strictly an integer times of ¼ of the wavelength $\lambda_0$, but may be such that $(\lambda_0/4n_0) \times m - (\lambda_0/8n_0) \le t_0 \le (\lambda_0/4n_0) \times 2m + (\lambda_0/8n_0)$ is satisfied. Specifically, let the value of ¼ of the wavelength $\lambda_0$ of the light generated in the light emitting layer be "100," then the optical thickness to of the mode loss action part 54 is preferably on the order of 25 to 250. With these configurations adopted, the phase difference between the laser light passing through the mode loss action part 54 and the laser light passing through the current injection region 51 can be changed (the phase difference can be controlled), control of oscillation mode loss can be performed with a higher degree of freedom, and the degree of freedom in designing the light emitting element can be further enhanced.

In Embodiment 10, the shape of the boundary between the current injection region 51 and the current non-injection inside region 52 was a circle (diameter: 8 μm), and the shape of the boundary between the current non-injection inside region 52 and the current non-injection outside region 53 was a circle (diameter: 12 μm). Specifically, let the area of the orthogonal projection image of the current injection region 51 be $S_1$ and let the area of the orthogonal projection image of the current non-injection inside region 52 be $S_2$, then $0.01 \le S_1/(S_1+S_2) \le 0.7$ is satisfied. Specifically, $S_1/(S_1+S_2) = 8^2/12^2 = 0.44$.

In the light emitting elements of Embodiment 10 or Embodiments 11, 12 and 14 described later, let the optical distance from the active layer 23 in the current injection region 51 to the second surface of the second compound semiconductor layer 22 be $L_2$ and let the optical distance from the active layer 23 in the mode loss action region 55 to a top surface (a surface opposite to the second electrode 32) of the mode loss action part 54 be $L_0$, then $L_0 > L_2$ is satisfied. Specifically, $L_0/L_2 = 1.5$.

The laser light having a higher order mode generated is dissipated by the mode loss action region 55 toward the outside of a resonator structure including the first light reflection layer 41 and the second light reflection layer 42, so that oscillation mode loss is increased. Specifically, light field intensities in a fundamental mode and a higher order mode generated are decreased more in going away from the Z axis in the orthogonal projection image of the mode loss action region 55 (see a conceptual diagram in (B) of FIG. 25) due to the presence of the mode loss action region 55 that acts on variation of oscillation mode loss; in this case, the decrease in the light field intensity in the higher order mode is greater than the decrease in the light field intensity in the fundamental mode, so that the fundamental mode can be more stabilized, a lowering in threshold current can be realized, and the relative light field intensity in the fundamental mode can be increased. Moreover, since a skirt portion of the light field intensity in the higher order mode is located more remote from the current injection region than that in a conventional light emitting element (see (A) of FIG. 25), a reduction in the influence of the inverse lens effect can be realized. Note that, in the case where the mode loss action part 54 including $SiO_2$ is not provided at all, mixed presence of oscillation modes would be generated.

The first compound semiconductor layer 21 includes an n-GaN layer, the active layer 23 includes a five-quantum multi-quantum well structure of $In_{0.04}Ga_{0.96}N$ layers (barrier layers) and $In_{0.16}Ga_{0.84}N$ layers (well layers), and the second compound semiconductor layer 22 includes a p-GaN layer. In addition, the first electrode 31 includes Ti/Pt/Au, while the second electrode 32 includes a transparent conductive material, specifically, ITO. The mode loss action part 54 is formed with a circular opening 54A, and the second compound semiconductor layer 22 is exposed at a bottom portion of the opening 54A. A pad electrode (not illustrated) including, for example, Ti/Pt/Au or V/Pt/Au, for electrical connection with an external electrode or circuit is formed on or connected onto an edge portion of the first electrode 31. A pad electrode 33 including, for example, Ti/Pd/Au or Ti/Ni/Au, for electrical connection with an external electrode or circuit is formed on or connected onto an edge portion of the second electrode 32. The first light reflection layer 41 and the second light reflection layer 42 include a stacked structure (total number of stacked layers of dielectric material film: 20 layers) of SiN layers and $SiO_2$ layers.

In the light emitting element of Embodiment 10, the current non-injection inside region 52 and the current non-injection outside region 53 are formed by ion injection into the stacked structure 20. As ion species, for example, boron was selected, but the boron ion is not limitative.

An outline of a method for manufacturing the light emitting element of Embodiment 10 will be described below.

[Step-1000]

In manufacturing the light emitting element of Embodiment 10, first, a step similar to [step-100] in Embodiment 1 is performed.

[Step-1010]

Next, based on an ion injection method using boron ions, the current non-injection inside region 52 and the current non-injection outside region 53 are formed in the stacked structure 20.

[Step-1020]

Figure 24A:
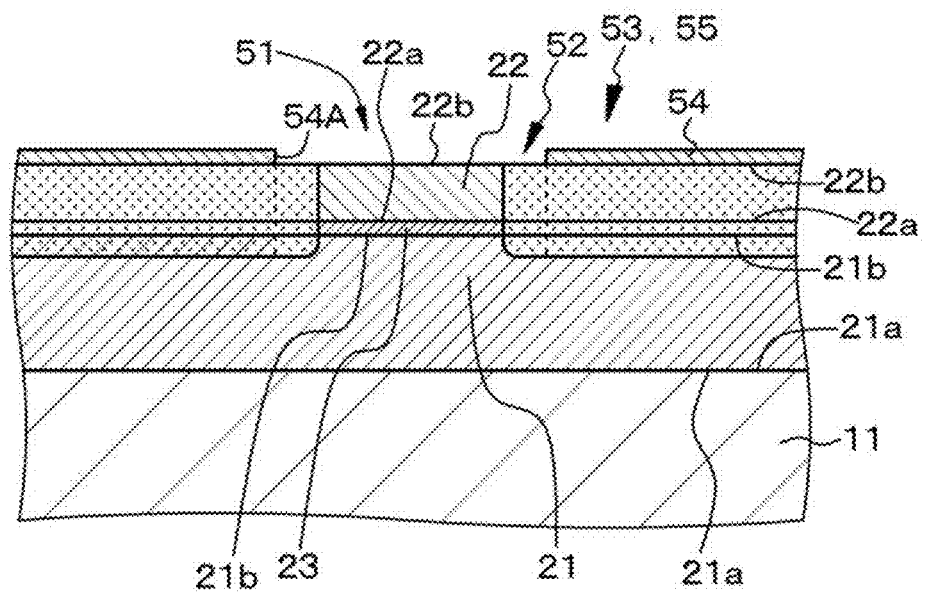
FIGS. 24A and 24B are schematic partial end views of a stacked structure or the like for explaining a producing method for the light emitting element of Embodiment 10.

Thereafter, in a step similar to [step-110] in Embodiment 1, the mode loss action part (mode loss action layer) 54 including $SiO_2$ and having the opening 54A is formed on the second surface 22b of the second compound semiconductor layer 22, based on a known method (see FIG. 24A).

[Step-1030]

Figure 24B:
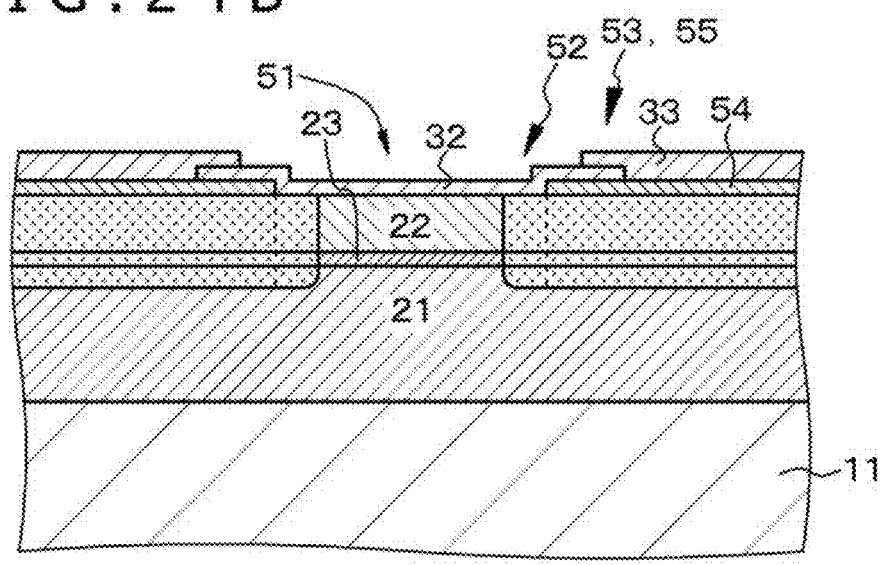

Thereafter, steps similar to [step-120] to [step-160] in Embodiment 1 are carried out, whereby the light emitting element of Embodiment 10 can be obtained. Note that a structure obtained in the course of a step similar to [step-120] is depicted in FIG. 24B.

In the light emitting element of Embodiment 10, the stacked structure is formed with the current injection region, the current non-injection inside region surrounding the current injection region, and the current non-injection outside region surrounding the current non-injection inside region, and an orthogonal projection image of the mode loss action region and an orthogonal projection image of the current non-injection outside region overlap with each other. In other words, the current injection region and the mode loss action region are isolated (separated) from each other by the current non-injection inside region. Therefore, as a conceptual diagram is depicted in (B) of FIG. 25, a variation (specifically, an increase in Embodiment 10) in oscillation mode loss can be put into a desired state. Alternatively, the variation in the oscillation mode loss can be put into a desired state, by appropriately determining the positional relation between the current injection region and the mode loss action region, the thickness of the mode loss action part constituting the mode loss action region, and the like. As a result, the problems in the conventional light emitting elements, such as an increase in threshold current or worsening of slope efficiency, can be solved. For example, by reducing the oscillation mode loss in a fundamental mode, a lowering in threshold current can be realized. Moreover, since the region to which the oscillation mode loss is given and the region into which a current is injected and which contributes to light emission can be controlled independently, that is, since control of oscillation mode loss and control of a light emitting state of the light emitting element can be performed independently, it is possible to enhance the degree of freedom in control and the degree of freedom in designing. Specifically, with the current injection region, the current non-injection region, and the mode loss action region set into the above-mentioned predetermined position relation, the magnitude relation between the oscillation mode losses given respectively to the fundamental mode and a higher order mode can be controlled, so that, by setting the oscillation mode loss given to the higher order mode relatively greater than the oscillation mode loss given to the fundamental mode, the fundamental mode can be more stabilized. Moreover, since the light emitting element of Embodiment 10 has the concave mirror section 43, generation of diffraction loss can be restrained more securely.

Embodiment 11

Figure 26:
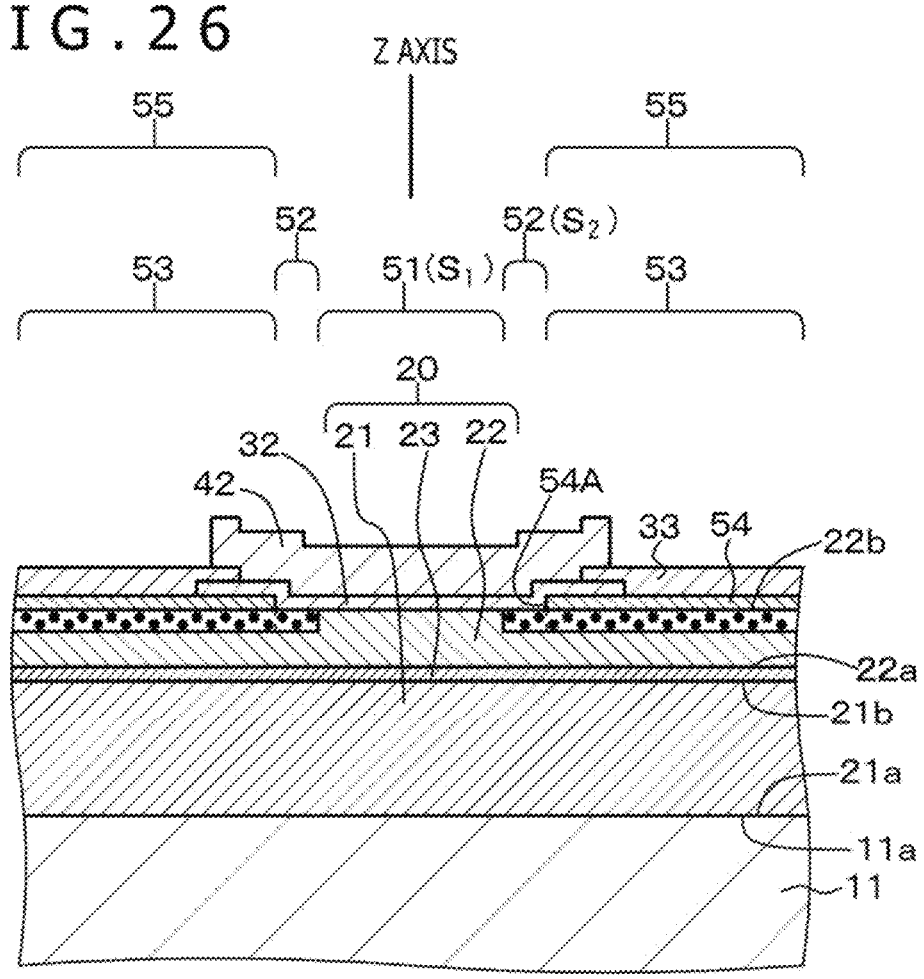
FIG. 26 is a schematic partial end view of a light emitting element of Embodiment 11.

Embodiment 11 is a modification of Embodiment 10, and relates to the light emitting element of the (2-B)th configuration. As a schematic partial sectional view is depicted in FIG. 26, in a light emitting element of Embodiment 11, a current non-injection inside region 52 and the current non-injection outside region 53 are formed by irradiation with plasma of a second surface of a second compound semiconductor layer 22, or an ashing treatment of the second surface of the second compound semiconductor layer 22, or a reactive ion etching (RIE) treatment of the second surface of the second compound semiconductor layer 22. Since the current non-injection inside region 52 and the current non-injection outside region 53 are thus exposed to plasma particles (specifically, argon, oxygen, nitrogen, or the like), deterioration of conductivity of the second compound semiconductor layer 22 is generated, and the current non-injection inside region 52 and the current non-injection outside region 53 are brought into a high resistance state. In other words, the current non-injection inside region 52 and the current non-injection outside resin 53 are formed by exposure of the second surface 22b of the second compound semiconductor layer 22 to the plasma particles. Note that, in FIGS. 26, 27, 28, and 29, illustration of a first light reflection layer 41 is omitted.

In Embodiment 11, also, the shape of the boundary between the current injection region 51 and the current non-injection inside region 52 was a circle (diameter: 10 μm), and the shape of the boundary between the current non-injection inside region 52 and the current non-injection outside region 53 was a circle (diameter: 15 μm). In other words, let the area of the orthogonal projection image of the current injection region 51 be $S_1$, and let the area of the orthogonal projection image of the current non-injection inside region 52 be $S_2$, then $$0.01 \leq S_1/(S_1+S_2) \leq 0.7$$

is satisfied. Specifically, $$S_1/(S_1+S_2)=10^2/15^2=0.44.$$

In Embodiment 11, the current non-injection inside region 52 and the current non-injection outside region 53 are only required to form in the stacked structure 20, based on irradiation with plasma of the second surface of the second compound semiconductor layer 22, or an ashing treatment of the second surface of the second compound semiconductor layer 22, or a reactive ion etching treatment of the second surface of the second compound semiconductor layer 22, in place of [step-1010] of Embodiment 10.

Other configurations and structures of the light emitting element of Embodiment 11 than the above-mentioned points may be similar to the configurations and structures of the light emitting element of Embodiment 10, and, therefore, detailed description thereof is omitted.

In the light emitting element of Embodiment 11 or Embodiment 12 described later, also, with the current injection region, the current non-injection region, and the mode loss action region set into the aforementioned predetermined positional relation, the magnitude relation between the oscillation mode losses given respectively to a fundamental mode and a higher order mode by the mode loss action region can be controlled, and, by setting the oscillation mode loss given to the higher order mode relatively greater than the oscillation mode loss given to the fundamental mode, the fundamental mode can be more stabilized.

Embodiment 12

Figure 27:
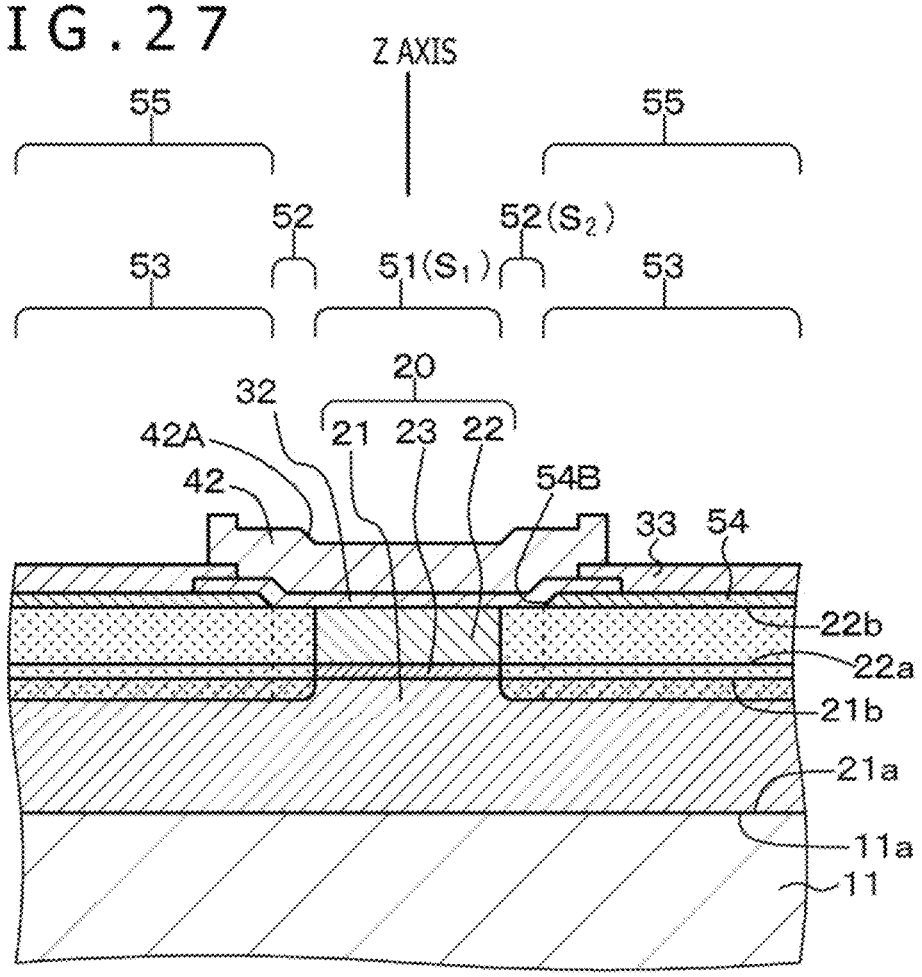
FIG. 27 is a schematic partial end view of a light emitting element of Embodiment 12.

Embodiment 12 is a modification of Embodiments 10 and 11, and relates to the light emitting element of the (2-C)th configuration. As a schematic partial sectional view is depicted in FIG. 27, in the light emitting element of Embodiment 12, a second light reflection layer 42 has a region that reflects or scatters the light from a first light reflection layer 41 toward an outside of a resonator structure including the first light reflection layer 41 and the second light reflection layer 42 (that is, toward a mode loss action region 55). Specifically, that part of the second light reflection layer 42 which is located on an upper side of a side wall of the mode loss action part (mode loss action layer) 54 (a side wall of an opening 54B) has a normally tapered inclined section 42A or a region curved in a protuberant shape toward the first light reflection layer 41.

In Embodiment 12, the shape of a boundary between a current injection region 51 and a current non-injection inside region 52 was a circle (diameter: 8 μm), and the shape of a boundary between the current non-injection inside region 52 and a current non-injection outside region 53 was a circle (diameter: 10 to 20 μm).

In Embodiment 12, where the opening 54B is provided and when the mode loss action part (mode loss action layer) 54 including $SiO_2$ is to be formed, the opening 54B having a normally tapered side wall may be formed, in a step similar to [step-1020] of Embodiment 10. Specifically, a resist layer is formed on the mode loss action layer formed on a second surface 22b of a second compound semiconductor layer 22, and that part of the resist layer at which to form the opening 54B is provided with an opening, based on a photolithography technique. A side wall of the opening is formed into a normally tapered shape, based on a known method. Then, etching back is conducted, whereby the mode loss action part (mode loss action layer) 54 can be formed with the opening 54B having a normally tapered side wall. Further, a second electrode 32 and a second light reflection layer 42 are formed over such a mode loss action part (mode loss action layer) 54, whereby a normally tapered inclined section 42A can be imparted to the second light reflection layer 42.

Other configurations and structures of the light emitting element of Embodiment 12 than the above-mentioned points may be similar to the configurations and structures of the light emitting elements of Embodiments 10 and 11, and, therefore, detailed description thereof is omitted.

Embodiment 13

Figure 28:
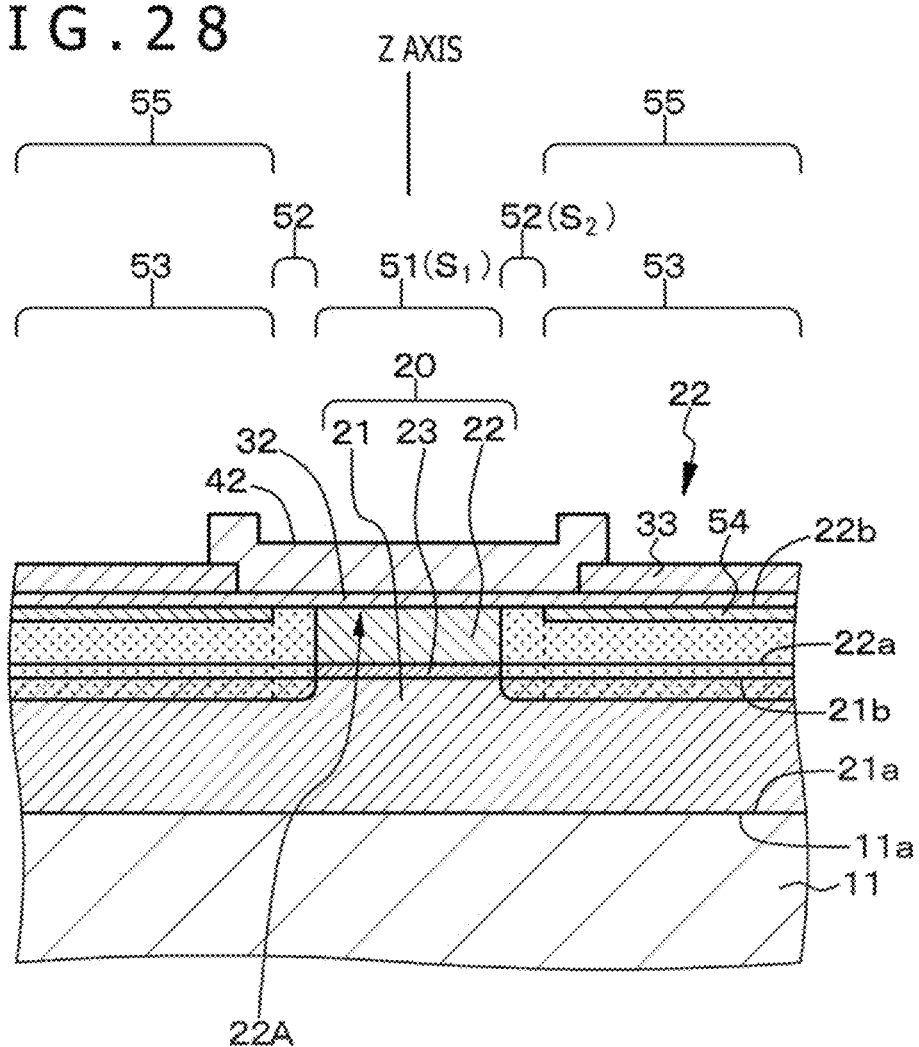
FIG. 28 is a schematic partial end view of a light emitting element of Embodiment 13.
Figure 29:
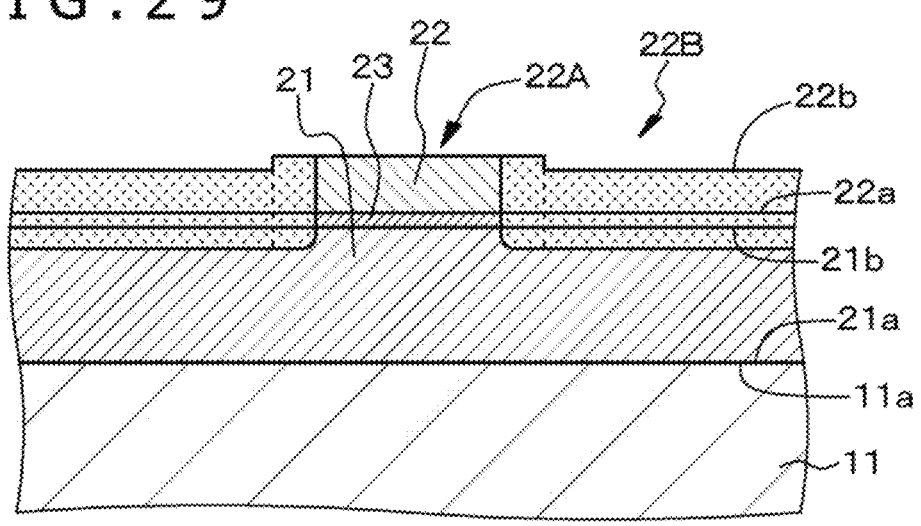
FIG. 29 is a schematic partial sectional view obtained by cutting out a major part of the light emitting element of Embodiment 13 depicted in FIG. 28.

Embodiment 13 is a modification of Embodiments 10 to 12, and relates to the light emitting element of the (2-D)th configuration. As a schematic partial sectional view of a light emitting element of Embodiment 13 is depicted in FIG. 28 and a schematic partial sectional view of a major part cut out is depicted in FIG. 29, a projected portion 22A is formed on a second surface 22b side of a second compound semiconductor layer 22. As depicted in FIGS. 28 and 29, a mode loss action part (mode loss action layer) 54 is formed on a region 22B of the second surface 22b of the second compound semiconductor layer 22 that surrounds the projected portion 22A. The projected portion 22A occupies a current injection region 51, a current injection region 51, and a current non-injection inside region 52. The mode loss action part (mode loss action layer) 54 includes a dielectric material such as $SiO_2$, as in Embodiment 10. A current non-injection outside region 53 is provided in the region 22B. Let the optical distance from an active layer 23 in the current injection region 51 to a second surface of a second compound semiconductor layer 22 be $L_2$, and let the optical distance from the active layer 23 in a mode loss action region 55 to a top surface (a surface opposite to a second electrode 32) of the mode loss action part 54 be $L_0$, then $$L_0 < L_2$$

is satisfied. Specifically, a setting that $$L_2/L_0 = 1.5$$

is adopted. As a result, a lens effect is generated in the light emitting element.

In the light emitting element of Embodiment 13, laser light having a higher order mode generated is confined in the current injection region 51 and the current non-injection inside region 52 by the mode loss action region 55, whereby oscillation mode loss is reduced. In other words, light field intensities in a fundamental mode and the higher order mode generated are increased in the orthogonal projection images of the current injection region 51 and the current non-injection inside region 52, by the presence of the mode loss action region 55 that acts on variation in oscillation mode loss.

In Embodiment 13, the shape of a boundary between the current injection region 51 and the current non-injection inside region 52 was a circle (diameter: 8 μm), and the shape of a boundary between the current non-injection inside region 52 and the current non-injection outside region 53 was a circle (diameter: 30 μm).

In Embodiment 13, it is sufficient to form the projected portion 22A by removing a part of the second compound semiconductor layer 22 from the second surface 22b side, between [step-1010] and [step-1020] of Embodiment 10.

Other configurations and structures of the light emitting element of Embodiment 13 than the above-mentioned points may be similar to the configurations and structures of the light emitting element of Embodiment 10, and, therefore, detailed description thereof is omitted. In the light emitting element of Embodiment 13, oscillation mode loss given to various modes by the mode loss action region can be restrained, a transverse mode can be put into multi-mode oscillation, and a threshold for laser oscillation can be reduced. In addition, as a conceptual diagram is depicted in (C) of FIG. 25, light field intensities in a fundamental mode and a higher order mode generated can be increased in orthogonal projection images of the current injection region and the current non-injection inside region, by the presence of the mode loss action region that acts on a variation (specifically, a decrease in Embodiment 13) in oscillation mode loss.

Embodiment 14

Embodiment 14 is a modification of Embodiments 10 to 13. A light emitting element of Embodiment 14 or Embodiment 15 described later, more specifically, includes a surface emitting laser element (light emitting element) (vertical cavity laser, VCSEL) that emits laser light from a top surface of a first compound semiconductor layer 21 via a first light reflection layer 41.

Figure 30:
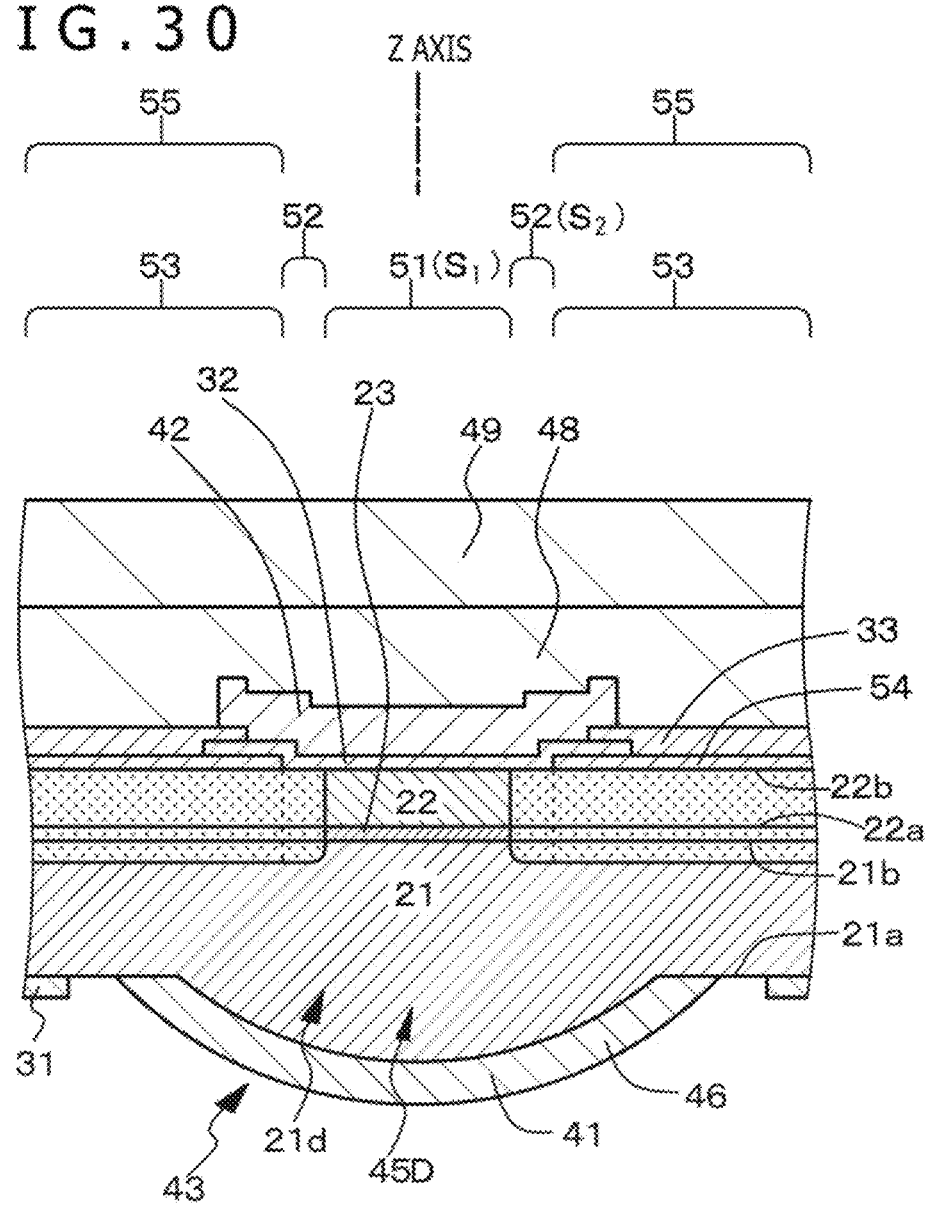
FIG. 30 is a schematic partial end view of a light emitting element of Embodiment 14.

In the light emitting element of Embodiment 14, as a schematic partial sectional view is depicted in FIG. 30, a second light reflection layer 42 is fixed to a support substrate 49, including a silicon semiconductor substrate, based on a solder joining method, through a joining layer 48 including a gold (Au) layer or a tin (Sn)-containing solder layer. In manufacturing the light emitting element of Embodiment 14, for example, steps similar to [step-1000] to [step-1030] of Embodiment 10, exclusive of removal of the support substrate 49, that is, without removing the support substrate 49.

In the light emitting element of Embodiment 14, also, with a current injection region and a current non-injection region and a mode loss action region set in the aforementioned predetermined layout relation, magnitude relation of oscillation mode losses given respectively to a fundamental mode and a higher order mode by the mode loss action region can be controlled, and, by setting the oscillation mode loss given to the higher order mode relatively greater than the oscillation mode loss given to the fundamental mode, the fundamental mode can be more stabilized.

In the example of the light emitting element described above and depicted in FIG. 30, an end portion of a first electrode 31 is spaced from a first light reflection layer 41. Specifically, the first light reflection layer 41 and the first electrode 31 are spaced from each other, in other words, an offset is present therebetween, and the spacing distance is within 1 mm, specifically, is an average of 0.05 mm, for example. It is to be noted, however, that such a structure is not limitative; the end portion of the first electrode 31 may be in contact with the first light reflection layer 41, or the end portion of the first electrode 31 may be formed ranging to a position on an edge portion of the first light reflection layer 41.

Besides, for example, after steps similar to [step-1000] to [step-1030] of Embodiment 10 are carried out, a light emitting element production substrate 11 may be removed to expose a first surface 21*a* of a first compound semiconductor layer 21, and then the first light reflection layer 41 and the first electrode 31 may be formed over a first surface 21*a* of the first compound semiconductor layer 21. In addition, in forming the first light reflection layer 41 on the first surface 21*a* of the first compound semiconductor layer 21, the first compound semiconductor layer 21 may be etched to form a recess in the first surface 21*a* of the first compound semiconductor layer 21, and the first light reflection layer 41 may be formed in the recess. In this case, with a side wall of the recess formed into a normally tapered shape, a light emitting element of the (2-C)th configuration can be obtained. In other words, the first light reflection layer 41 has a region (inclined section) that reflects or scatters the light from a second light reflection layer 42 toward the outside of a resonator structure including the first light reflection layer 41 and the second light reflection layer 42.

Embodiment 15

Embodiment 15 is a modification of Embodiments 1 to 14, and relates to the light emitting element of the third configuration, specifically, the light emitting element of the (3-A)th configuration. A light emitting element of Embodiment 15, more specifically, includes a surface emitting laser element (light emitting element) (vertical cavity laser, VCSEL) that emits laser light from a top surface of a first compound semiconductor layer 21 via a first light reflection layer 41.

Figure 31:
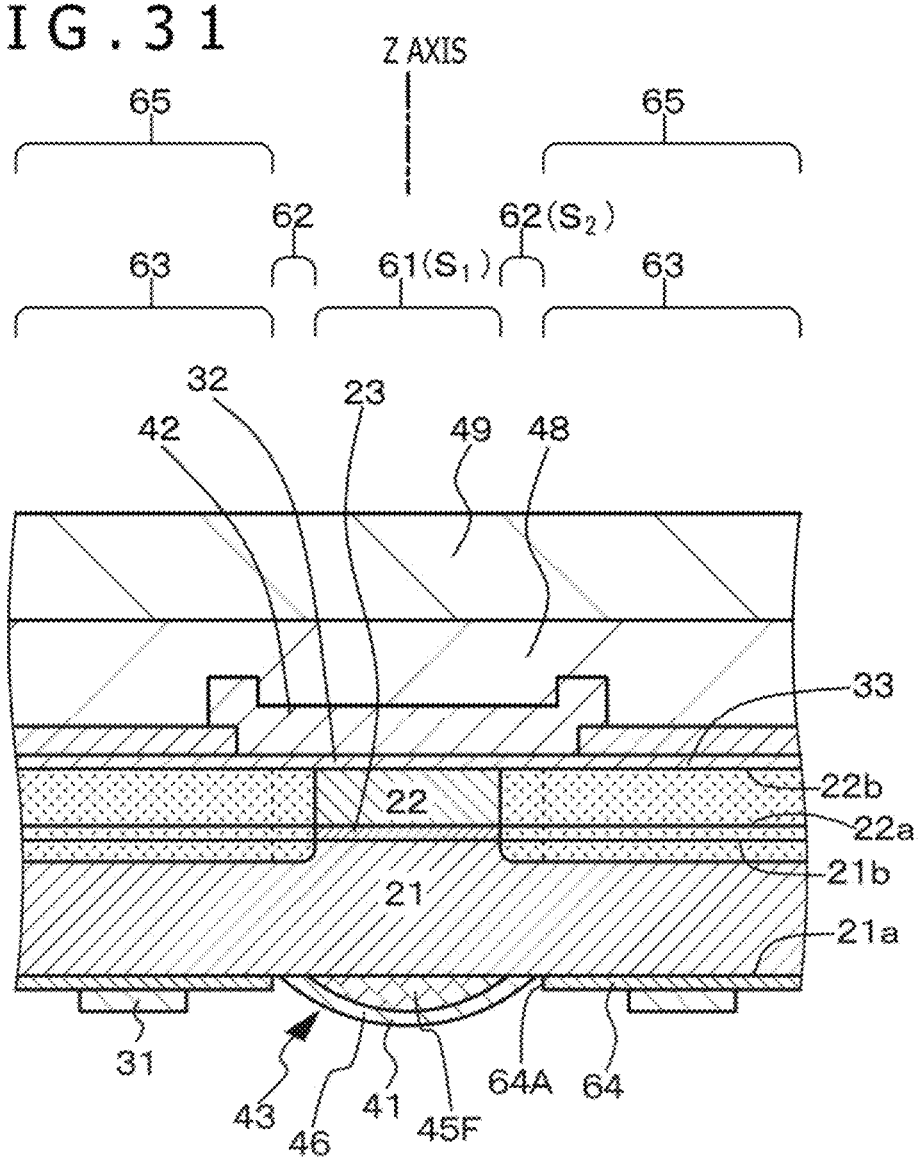
FIG. 31 is a schematic partial end view of a light emitting element of Embodiment 15.

The light emitting element of Embodiment 15 of which a schematic partial end view is depicted in FIG. 31, includes:

(a) a stacked structure 20 including, in a stacked state, a first compound semiconductor layer 21 that includes a GaN-based compound semiconductor and has a first surface 21*a* and a second surface 21*b* opposite to the first surface 21*a*, an active layer (light emitting layer) 23 that includes a GaN-based compound semiconductor and is in contact with the second surface 21*b* of the first compound semiconductor layer 21, and a second compound semiconductor layer 22 that includes a GaN-based compound semiconductor, and has a first surface 22*a* and a second surface 22*b* opposite to the first surface 22*a*, the first surface 22*a* being in contact with the active layer 23;

(b) a second electrode 32 formed on the second surface 22*b* of the second compound semiconductor layer 22;

(c) a second light reflection layer 42 formed on the second electrode 32;

(d) a mode loss action part 64 that is provided on the first surface 21*a* of the first compound semiconductor layer 21 and constitutes a mode loss action region 65 acting on variation in oscillation mode loss;

(e) a first light reflection layer 41 formed over a range of a position on the first surface 21*a* of the first compound semiconductor layer 21 to a position on the mode loss action part 64; and (f) a first electrode 31 electrically connected to the first compound semiconductor layer 21. Note that, in the light emitting element of Embodiment 15, the first electrode 31 is formed on the first surface 21*a* of the first compound semiconductor layer 21.

The stacked structure 20 is formed with a current injection region 61, a current non-injection inside region 62 surrounding the current injection region 61, and a current non-injection outside region 63 surrounding the current non-injection inside region 62, and an orthogonal projection image of a mode loss action region 65 and an orthogonal projection image of the current non-injection outside region 63 overlap with each other. Here, while the stacked structure 20 is formed with the current non-injection regions 62 and 63, these regions, in the example illustrated, are formed ranging from the second compound semiconductor layer 22 to a part of the first compound semiconductor layer 21, in the thickness direction. Note that the current non-injection regions 62 and 63 may be formed in a region on the second electrode side of the second compound semiconductor layer 22, or may be formed in the whole body of the second compound semiconductor layer 22, or may be formed in the second compound semiconductor layer 22 and the active layer 23, in the thickness direction.

The configurations of the stacked structure 20, a pad electrode 33, the first light reflection layer 41, and the second light reflection layer 42 may be similar to those in Embodiment 10, and the configuration of a joining layer 48 and a support substrate 49 may be similar to those in Embodiment 14. The mode loss action part 64 is formed with a circular opening 64A, and the first surface 21*a* of the first compound semiconductor layer 21 is exposed at a bottom portion of the opening 64A.

The mode loss action part (mode loss action layer) 64 includes a dielectric material such as $SiO_2$, and is formed on the first surface 21*a* of the first compound semiconductor layer 21. The optical thickness $t_0$ of the mode loss action part 64 may be deviated from an integer times of ¼ of the wavelength $\lambda_0$ of the light generated in the light emitting element. Alternatively, the optical thickness $t_0$ of the mode loss action part 64 may be an integer times of ¼ of the wavelength $\lambda_0$ of the light generated in the light emitting element. In other words, the optical thickness $t_0$ of the mode loss action part 64 may be such a thickness as not to disturb the phase of the light generated in the light emitting element and not to break the standing wave of the light. It is to be noted, however, that the optical thickness $t_0$ may not necessarily be strictly an integer times of ¼ of the wavelength $\lambda_0$, but may be such that $$(\lambda_0/4n_0) \times m - (\lambda_0/8n_0) \leq t_0 \leq (\lambda_0/4n_0) \times 2m + (\lambda_0/8n_0)$$

may be satisfied. Specifically, let the value of ¼ of the wavelength $\lambda_0$ of the light generated in the light emitting layer be "100," then the optical thickness $t_0$ of the mode loss action part 64 is preferably on the order of 25 to 250. With these configurations adopted, the phase difference between the laser light passing through the mode loss action part 64 and the laser light passing through the current injection region 61 can be changed (the phase difference can be controlled), control of oscillation mode loss can be performed with a higher degree of freedom, and the degree of freedom in designing the light emitting element can be further enhanced.

In Embodiment 15, the shape of a boundary between the current injection region 61 and the current non-injection inside region 62 was a circle (diameter: 8 µm), and the shape of a boundary between the current non-injection inside region 62 and the current non-injection outside region 63 was a circle (diameter: 15 µm). In other words, let the area of an orthogonal projection image of the current injection region be $S_1'$, and let the area of an orthogonal projection image of the current non-injection inside region 62 be $S_2'$, then $$0.01 \le S_1'/(S_1'+S_2') \le 0.7$$

is satisfied. Specifically, $$S_1'/(S_1'+S_2')=8^2/15^2=0.28.$$

In the light emitting element of Embodiment 15, let the optical distance from the active layer 23 in the current injection region 61 to the first surface of the first compound semiconductor layer 21 be $L_1'$ and let the optical distance from the active layer 23 in the mode loss action region 65 to a top surface (a surface opposite to the first electrode 31) of the mode loss action part 64 be $L_0'$, then $$L_0'>L_1'$$

is satisfied. Specifically, $$L_0'/L_1'=1.01.$$

The laser light having a higher order mode generated is dissipated by the mode loss action region 65 toward the outside of a resonator structure including the first light reflection layer 41 and the second light reflection layer 42, so that oscillation mode loss is increased. Specifically, light field intensities in a fundamental mode and a higher order mode generated are decreased more in going away from the Z axis in the orthogonal projection image of the mode loss action region 65 (see a conceptual diagram in (B) of FIG. 25) due to the presence of the mode loss action region 65 that acts on variation of oscillation mode loss; in this case, the decrease in the light field intensity in the higher order mode is greater than the decrease in the light field intensity in the fundamental mode, so that the fundamental mode can be more stabilized, a lowering in threshold current can be realized, and the relative light field intensity in the fundamental mode can be increased.

In the light emitting element of Embodiment 15, the current non-injection inside region 62 and the current non-injection outside region 63 are formed by ion injection into the stacked structure 20, as in Embodiment 10. As the ion species, for example, boron was selected, but the boron ion is not limitative.

A method for manufacturing the light emitting element of Embodiment 15 will be described below.

[Step-1500]

First, a step similar to [step-1000] of Embodiment 10 is conducted, whereby a stacked structure 20 can be obtained. Next, a step similar to [step-1010] of Embodiment 10 is performed, whereby a current non-injection inside region 62 and a current non-injection outside region 63 can be formed in the stacked structure 20.

[Step-1510]

Subsequently, a second electrode 32 is formed on a second surface 22b of a second compound semiconductor layer 22, based on a lift-off method, for example, and further a pad electrode 33 is formed based on a known method. Thereafter, a second light reflection layer 42 is formed ranging from a position on the second electrode 32 to a position on the pad electrode 33, based on a known method.

[Step-1520]

Thereafter, the second light reflection layer 42 is fixed to a support substrate 49 through a joining layer 48.

[Step-1530]

Next, a light emitting element production substrate 11 is removed, to expose a first surface 21a of a first compound semiconductor layer 21. Specifically, first, the light emitting element production substrate 11 is thinned based on a mechanical polishing method, and then the remainder of the light emitting element production substrate 11 is removed based on a CMP method. In this way, the first surface 21a of the first compound semiconductor layer 21 is exposed.

[Step-1540]

Thereafter, a mode loss action part (mode loss action layer) 64 including $SiO_2$ and having an opening 64A is formed on the first surface 21a of the first compound semiconductor layer 21, based on known method.

[Step-1150]

Next, a first light reflection layer 41 that includes a concave mirror section 43 including a base section 45F and a multilayer light reflection film 46 is formed on the first surface 21a of the first compound semiconductor layer 21 exposed at a bottom portion of the opening 64A in the mode loss action part 64, and, further, a first electrode 31 is formed. In this way, a light emitting element of Embodiment 15 having a structure depicted in FIG. 31 can be obtained.

[Step-1560]

Thereafter, what is generally called an element isolation is conducted to isolate the light emitting element, and a side surface and an exposed surface of the stacked structure are coated with an insulating film including $SiO_2$, for example. Then, packaging or sealing is conducted, to complete the light emitting element of Embodiment 15.

In the light emitting element of Embodiment 15, also, the stacked structure is formed with the current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other. Therefore, as a conceptual diagram is depicted in (B) of FIG. 25, a variation (specifically, an increase in Embodiment 15) in oscillation mode loss can be set into a desired state. Moreover, since control of oscillation mode loss and control of the light emitting state of the light emitting element can be performed independently, the degree of freedom in control and the degree of freedom in designing the light emitting element can be enhanced. Specifically, with the current injection region, the current non-injection region, and the mode loss action region set in the aforementioned predetermined layout relation, the magnitude relation between oscillation mode losses given respectively to a fundamental mode and a higher order mode by the mode loss action region can be controlled, and, by setting the oscillation mode loss given to the higher order mode relatively greater than the oscillation mode loss given to the fundamental mode, the fundamental mode can be more stabilized. In addition, a reduction in the influence of an inverse lens effect can be realized. Moreover, since the light emitting element of Embodiment 15 has the concave mirror section 43, generation of diffraction loss can be restrained more securely.

In Embodiment 15, also, as in Embodiment 11, the current non-injection inside region 62 and the current non-injection outside region 63 can be formed by irradiation with plasma of the second surface of the second compound semiconductor layer 22, or an ashing treatment of the second surface of the second compound semiconductor layer 22, or a reactive ion etching (RIE) treatment of the second surface of the second compound semiconductor layer 22 (light emitting element of the (3-B)th configuration). With the current non-injection inside region 62 and the current non-injection outside region 63 thus exposed to plasma particles, deterioration is generated in conductivity of the second compound semiconductor layer 22, and the current non-injection inside region 62 and the current non-injection outside region 63 are put into a high resistance state. In other words, the current non-injection inside region 62 and the current non-injection outside region 63 are formed by exposure of the second surface 22b of the second compound semiconductor layer 22 to plasma particles.

In addition, as in Embodiment 12, the second light reflection layer 42 may have a region that reflects or scatters the light from the first light reflection layer 41 toward an outside of a resonator structure including the first light reflection layer 41 and the second light reflection layer 42 (i.e., toward the mode loss action region) (light emitting element of the (3-C)th configuration). Alternatively, as in Embodiment 14, in forming the first light reflection layer 41 on the first surface 12a of the first compound semiconductor layer 21, the first compound semiconductor layer 21 may be etched to form the first surface 21a of the first compound semiconductor layer 21 with a recess, the first light reflection layer 41 may be formed in this recess, and, in this case, a side wall of the recess may be formed in a normally tapered shape.

Besides, as in Embodiment 13, a projected portion may be formed on the first surface 21a side of the first compound semiconductor layer 21, and the mode loss action part (mode loss action layer) 64 may be formed on that region of the first surface 21a of the first compound semiconductor layer 21 which surrounds the projected portion (light emitting element of the (3-D)th configuration). The mode loss action part (mode loss action layer) 64 is only required to form on that region of the first surface 21a of the first compound semiconductor layer 21 which surrounds the projected portion. The projected portion occupies the current injection region 61, the current injection region 61, and the current non-injection inside region 62. As a result, laser light having a higher order mode generated is confined in the current injection region 61 and the current non-injection inside region 62 by the mode loss action region 65, whereby oscillation mode loss is reduced. In other words, light field intensities in a fundamental mode and a higher order mode generated are increased in orthogonal projection images of current injection region 61 and the current non-injection inside region 62, by the presence of the mode loss action region 65 that acts on variation in oscillation mode loss. In the modification of the light emitting element of Embodiment 15 having such a configuration, also, oscillation mode losses given to various modes by the mode loss action region 65 can be restrained, a transverse mode can be put into multi-mode oscillation, and a threshold for laser oscillation can be reduced. In addition, as a conceptual diagram is depicted in (C) of FIG. 25, the light field intensities in the fundamental mode and the higher order mode generated can be increased in the orthogonal projection images of the current injection region and the current non-injection inside region, by the presence of the mode loss action region 65 that acts on a variation (specifically, a decrease in the modification of the light emitting element of Embodiment 15) in oscillation mode loss.

In some cases, a projected portion (mesa structure) may be formed on the first surface 21a side of the first compound semiconductor layer 21, and that region of the first compound semiconductor layer 21 which surrounds the projected portion may be made to be a mode loss action region (mode loss action part). That is, in this case, formation of a mode loss action layer may be omitted, and the mode loss action part may be made to include that region of the first compound semiconductor layer which surrounds the projected portion. Then, the first light reflection layer 41 is only required to form on a top surface of the projected portion. The projected portion occupies the current injection region 61, the current injection region 61 and the current non-injection inside region 62. As a result of this, also, laser light having a higher order mode generated is confined in the current injection region 61 and the current non-injection inside region 62 by the mode loss action region, whereby oscillation mode loss is reduced. In other words, light field intensities in a fundamental mode and a higher order mode generated are increased in orthogonal projection images of the current injection region 61 and the current non-injection inside region 62, by the presence of the mode loss action region that acts on variation in oscillation mode loss. In the modification of the light emitting element of Embodiment 15 having such a configuration, also, oscillation mode losses given to various modes by the mode loss action region can be restrained, a transverse mode can be put into multi-mode oscillation, and a threshold for laser oscillation can be reduced. In addition, as a conceptual diagram is depicted in (C) of FIG. 25, the light field intensities in the fundamental mode and the higher order mode generated can be increased in the orthogonal projection images of the current injection region and the current non-injection inside region, by the presence of the mode loss action region that acts on a variation (specifically, a decrease in the modification of the light emitting element of Embodiment 15) in oscillation mode loss.

Embodiment 16

Embodiment 16 is a modification of Embodiments 1 to 15, and relates to the light emitting element of the fourth configuration.

Incidentally, the cavity length Um in a stacked structure including two DBR layers and a stacked structure formed between them is represented by $$L=(m\cdot\lambda_0)/(2\cdot n_{eq})$$

where $n_{eq}$ is the equivalent refractive index of the whole body of the stacked structure, and $\lambda_0$ is the wavelength of laser light to be emitted from a surface emitting laser element (light emitting element). Here, m is a positive integer. In the surface emitting laser element (light emitting element), the wavelength that can be oscillated is determined by the cavity length $L_{OR}$. The individual oscillation modes that can be oscillated are called longitudinal modes. Of the longitudinal modes, those conforming to a gain spectrum determined by the active layer can be realized in laser oscillation. Let an effective refractive index be $n_{eff}$, then a gap $\Delta\lambda$ of the longitudinal modes is represented by $$\lambda_0^2/(2n_{eff}L).$$

In other words, as the cavity length $L_{OR}$ is longer, the gap $\Delta\lambda$ of the longitudinal modes is narrower. Therefore, in the case where the cavity length $L_{OR}$ is long, a plurality of longitudinal modes can exist in the gain spectrum, so that a plurality of longitudinal modes can be oscillated. Let the oscillation wavelength be $\lambda_0$, then the following relationship exists between the equivalent refractive index $n_{eq}$ and the effective refractive index $n_{eff}$.

$$n_{eff} = n_{eq} - \lambda_0 \cdot (dn_{eq}/d\lambda_0)$$

Figure 39A:
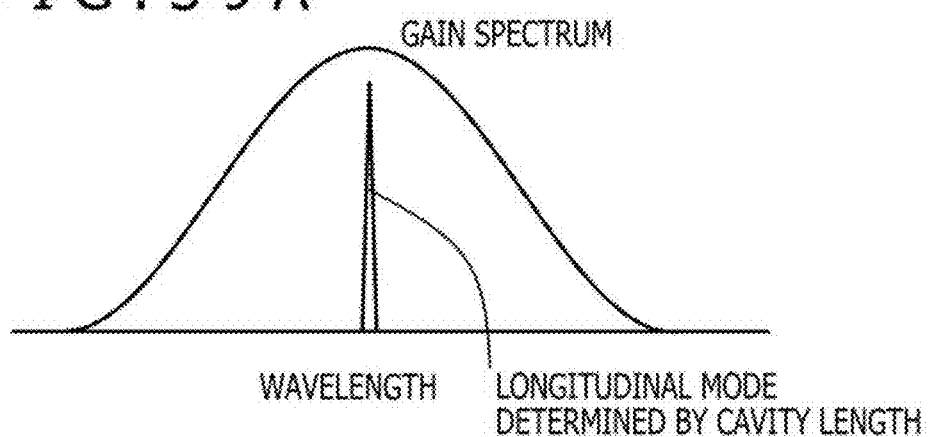
FIGS. 39A and 39B are conceptual diagrams depicting schematically vertical modes present in a gain spectrum determined by an active layer.
Figure 39B:
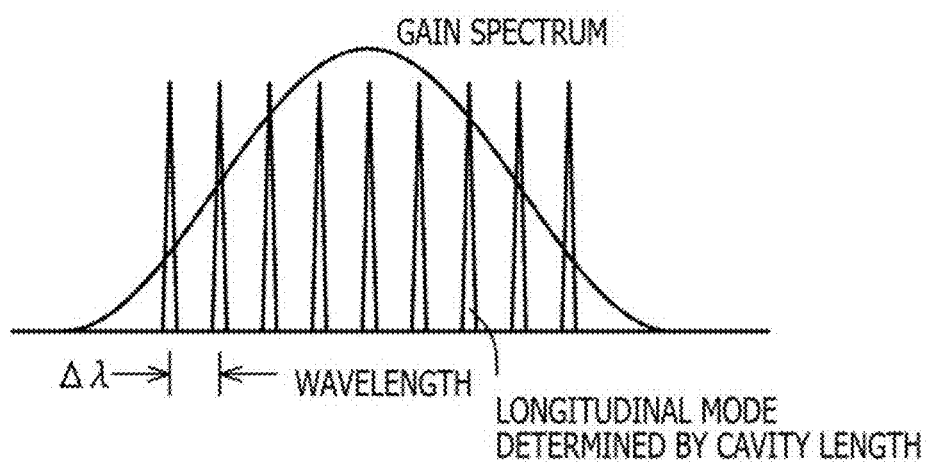

Here, in the case where the stacked structure includes GaAs-based compound semiconductor layers, the cavity length $L_{OR}$ is normally as short as 1 μm or less, and the laser light in longitudinal mode emitted from the surface emitting laser element is of one kind (one wavelength) (see a conceptual diagram in FIG. 39A). Therefore, the oscillation wavelength of the laser light in longitudinal mode emitted from the surface emitting laser element can be controlled accurately. On the other hand, in the case where the stacked structure includes GaN-based compound semiconductor layers, the cavity length $L_{OR}$ is normally as long as a several times the wavelength of the laser light emitted from the surface emitting laser element. Therefore, a plurality of kinds of laser light would be emittable from the surface emitting laser element (see a conceptual diagram in FIG. 39B), so that it is difficult to accurately control the oscillation wavelength of the laser light emitted from the surface emitting laser element.

Figure 32:
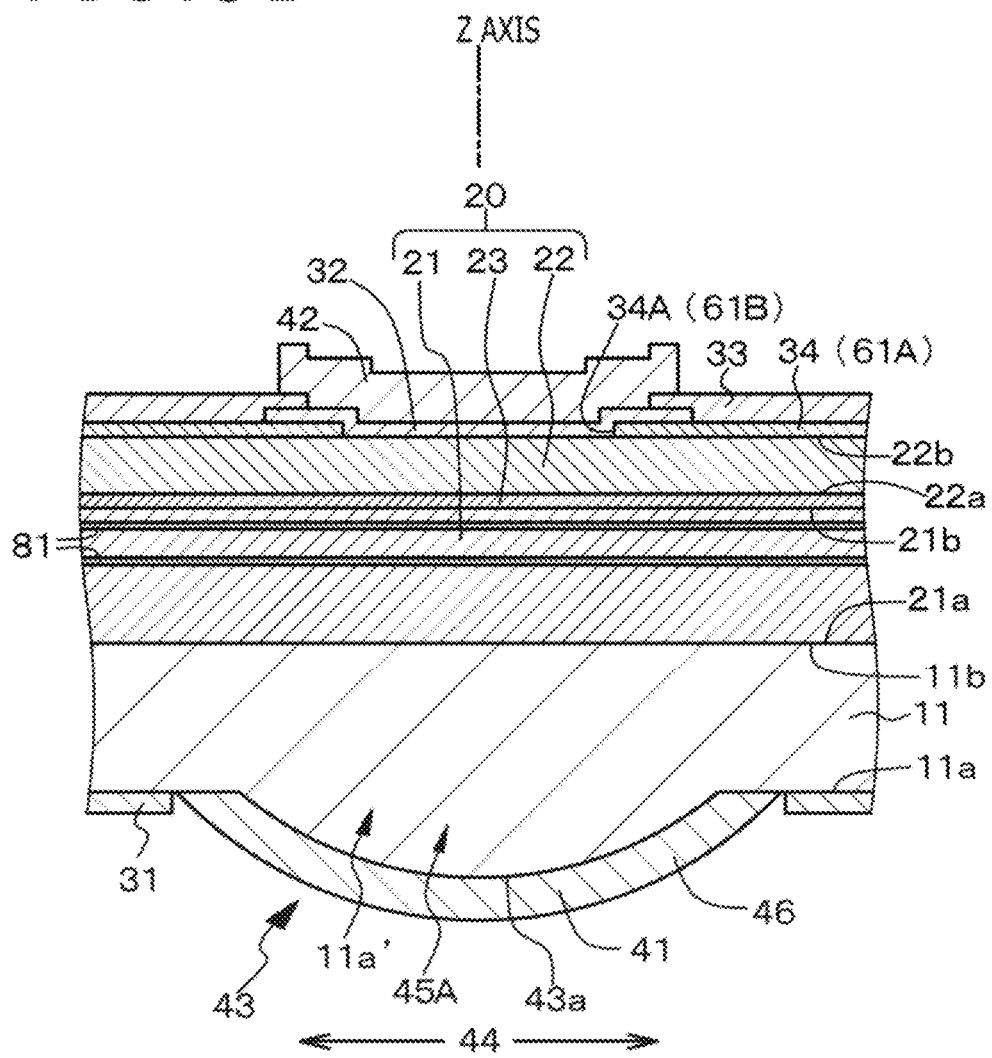
FIG. 32 is a schematic partial sectional view of a light emitting element of Embodiment 16.

As a schematic partial sectional view is depicted in FIG. 32, in the light emitting element of Embodiment 16, or in the light emitting elements of Embodiments 17 to 19 described later, a stacked structure 20 including a second electrode 32 is formed with, specifically, twenty light absorbing material layers 81, in Embodiment 16, in parallel to a virtual plane occupied by an active layer 23. Note that only two light absorbing material layers 81 are depicted in the drawing, for simplification of the drawing. Of these light absorbing material layers 81, one or two or plural light absorbing material layers located on the most outer side may be made to function as the aforementioned low-resistance layers 71, 71A, and 71B, or one or two or plural light absorbing material layers located on the most inner side (active layer side) may be made to function as the aforementioned low-resistance layers 71, 71A, and 71B.

In Embodiment 16, the oscillation wavelength (a desired oscillation wavelength to be emitted from the light emitting element) $\lambda_0$ is 450 nm. The twenty light absorbing material layers 81 include a compound semiconductor material narrower in bandgap than the compound semiconductor constituting the stacked structure 20, specifically include n-In$_{0.2}$Ga$_{0.8}$N, and are formed in the inside of the first compound semiconductor layer 21. The thickness of the light absorbing material layer 81 is equal to or less than $\lambda_0/(4 \cdot n_{eq})$, and is specifically 3 nm. In addition, the light absorption coefficient of the light absorbing material layers 81 is equal to or more than 2 times, and is specifically $1 \times 10^3$ times, the light absorption coefficient of the first compound semiconductor layer 21 including the n-GaN layers.

In addition, the light absorbing material layers 81 are located at a minimum amplitude portion generated in a standing wave of light formed inside the stacked structure, and the active layer 23 is located at a maximum amplitude portion generated in the standing wave of light formed inside the stacked structure. The distance between a thickness directional center of the active layer 23 and a thickness directional center of the light absorbing material layer 81 adjacent to the active layer 23 is 46.5 nm. Further, let the equivalent refractive index of the whole body of the two light absorbing material layers 81 and that part of the stacked structure which is located between the light absorbing material layer 81 and the light absorbing material layer 81 (specifically, the first compound semiconductor layer 21 in Embodiment 16) be $n_{eq}$, and let the distance between the light absorbing material layer 81 and the light absorbing material layer 81 be $L_{Abs}$, then $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied. Here, m is 1, or is 2 or more any integer including 1. It is to be noted that in Embodiment 16, a setting that m=1 was adopted. Therefore, the distance between the adjacent light absorbing material layers 81 satisfies $$0.9 \times \{\lambda_0/(2 \cdot n_{eq})\} \leq L_{Abs} \leq 1.1 \times \{\lambda_0/(2 \cdot n_{eq})\}$$

for all the plurality of light absorbing material layers 81 (twenty light absorbing material layers 81). The value of the equivalent refractive index $n_{eq}$ is specifically 2.42, and, when m=1, specifically, $$L_{Abs} = 1 \times 450/(2 \times 2.42).$$
$$= 93.0 \text{ nm}$$

Note that, in some light absorbing material layers 81 of the twenty light absorbing material layers 81, m may be two or more any integer.

In manufacturing the light emitting element of Embodiment 16, the stacked structure 20 is formed in a step similar to [step-100] of Embodiment 1; in this instance, twenty light absorbing material layers 81 are simultaneously formed inside the first compound semiconductor layer 21. In other points than this point, the light emitting element of Embodiment 16 can be manufactured based on a method similar to that for the light emitting element of Embodiment 1.

Figure 33:
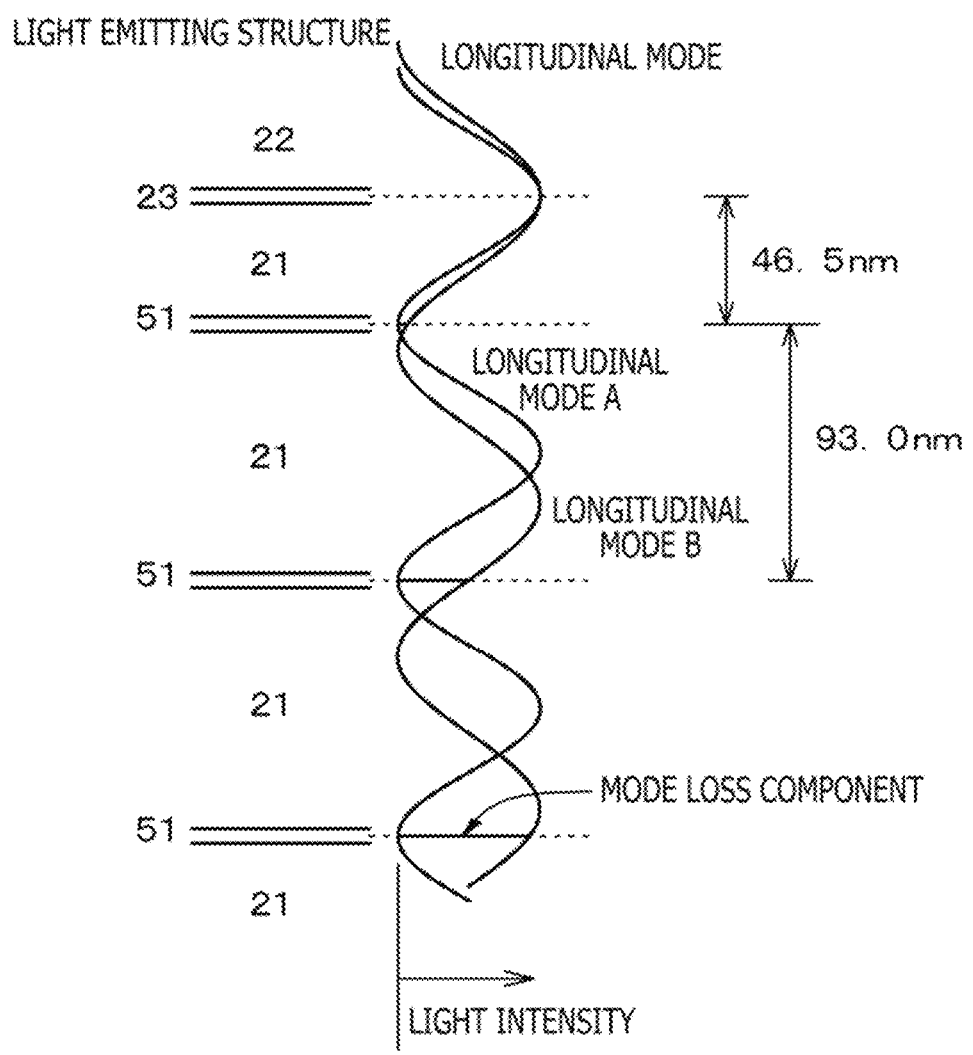
FIG. 33 is a diagram obtained by superimposing a schematic partial sectional view of the light emitting element of Embodiment 16 on two vertical modes of a vertical mode A and a vertical mode B.

In the case where a plurality of longitudinal modes is generated in a gain spectrum determined by the active layer 23, this may be schematically depicted as in FIG. 33. Note that, in FIG. 33, two longitudinal modes consisting of a longitudinal mode A and a longitudinal mode B are illustrated. In this case, it is assumed that the light absorbing material layers 81 are located at a minimum amplitude portion of the longitudinal mode A, and are not located at a minimum amplitude portion of the longitudinal mode B. Then, the mode loss of the longitudinal mode A is minimized, but the mode loss of the longitudinal mode B is large. In FIG. 33, the mode loss component of the longitudinal mode B is depicted schematically in solid line. Therefore, the longitudinal mode A is easier to oscillate than the longitudinal mode B. For this reason, by use of such a structure, that is, by controlling the position of the light absorbing material layers 81 and period, a specific longitudinal mode can be stabilized, and oscillation can be facilitated. On the other hand, mode losses for other, undesired longitudinal modes can be increased, and, therefore, oscillation of the other, undesired longitudinal modes can be restrained.

As above-described, in the light emitting element of Embodiment 16, the light absorbing material layers are formed inside the stacked structure, and, therefore, oscillation of laser light in an undesired longitudinal mode, of laser light in a plurality of kinds of longitudinal modes that can be emitted from the surface emitting laser element, can be restrained. As a result, the oscillation wavelength of the laser light to be emitted can be controlled accurately. Moreover, since the light emitting element of Embodiment 16 has the concave mirror section 43, generation of diffraction loss can be restrained securely.

Embodiment 17

Embodiment 17 is a modification of Embodiment 16. In Embodiment 16, the light absorbing material layers 81 including a compound semiconductor material narrower in bandgap than the compound semiconductor constituting the stacked structure 20. On the other hand, in Embodiment 17, ten light absorbing material layers 81 including an impurity-doped compound semiconductor material, specifically, a compound semiconductor material (specifically, n-GaN:Si) having an impurity concentration (impurity: Si) of $1 \times 10^{19}/\text{cm}^3$. Besides, in Embodiment 17, the oscillation wavelength $\lambda_0$ was 515 nm. The composition of the active layer 23 is $\text{In}_{0.3}\text{Ga}_{0.7}\text{N}$. In Embodiment 17, m=1, the value of $L_{Abs}$ is 107 nm, the distance between a thickness directional center of the active layer 23 and a thickness directional center of the light absorbing material layer 81 adjacent to the active layer 23 is 53.5 nm, and the thickness of the light absorbing material layer 81 is 3 nm. In other points than these points, the configuration and structure of the light emitting element of Embodiment 17 may be similar to the configuration and structure of the light emitting element of Embodiment 16, and, therefore, detailed description thereof is omitted. In some light absorbing material layers 81, of the ten light absorbing material layers 81, m may be two or more any integer.

Embodiment 8

Embodiment 18 is also a modification of Embodiment 16. In Embodiment 18, five light absorbing material layers (referred to as "first light absorbing material layers" for convenience' sake) including a material similar to the material constituting the light absorbing material layers 81 in Embodiment 16, that is, including n-$\text{In}_{0.3}\text{Ga}_{0.7}\text{N}$. Further, in Embodiment 18, one light absorbing material layer (referred to as a "second light absorbing material layer" for convenience' sake) including a transparent conductive material. Specifically, the second light absorbing material layer was made to function also as a second electrode 32 including ITO. In Embodiment 18, the oscillation wavelength $\lambda_0$ was 450 nm. In addition, m=1 and 2. In the case of m=1, the value of $L_{Abs}$ is 93.0 nm, the distance between a thickness directional center of the active layer 23 and a thickness directional center of the first light absorbing material layer adjacent to the active layer 23 is 46.5 nm, and the thickness of the five first light absorbing material layers is 3 nm. In other words, in the five first light absorbing material layers, $$0.9 \times \{\lambda_0/(2 \cdot n_{eq})\} \le L_{Abs} \le 1.1 \times \{\lambda_0/(2 \cdot n_{eq})\}$$

is satisfied. In addition, for the first light absorbing material layer adjacent to the active layer 23 and the second light absorbing material layer, a setting of m=2 was adopted. In other words, $$0.9 \times \{(2 \cdot \lambda_0)/(2 \cdot n_{eq})\} \le L_{Abs} \le 1.1 \times \{(2 \cdot \lambda_0)/(2 \cdot n_{eq})\}$$

is satisfied. The one second light absorbing material layer functioning also as the second electrode 32 has a light absorption coefficient of 2,000 cm$^{-1}$, and a thickness of 30 nm, and the distance from the active layer 23 to the second light absorbing material layer is 139.5 nm. In other points than these points, the configuration and structure of the light emitting element of Embodiment 18 may be similar to the configuration and structure of the light emitting element of Embodiment 16, and, therefore, detailed description thereof is omitted. In some first light absorbing material layers, of the five first light absorbing material layers, m may be two or more any integer. Unlike in Embodiment 16, the number of the light absorbing material layers 81 may be one. In this case, also, for example, the positional relation between the second light absorbing material layer functioning also as the second electrode 32 and the light absorbing material layer 81 should satisfy the following formula.

$$0.9 \times \{(m \cdot \lambda_0)/(2 \cdot n_{eq})\} \le L_{Abs} \le 1.1 \times \{(m \cdot \lambda_0)/(2 \cdot n_{eq})\}$$

Embodiment 19

Embodiment 19 is a modification of Embodiments 16 to 18. More specifically, a light emitting element of Embodiment 19 includes a surface emitting laser element (vertical cavity laser, VCSEL) that emits laser light from a top surface of a first compound semiconductor layer 21 via a first light reflection layer 41.

Figure 34:
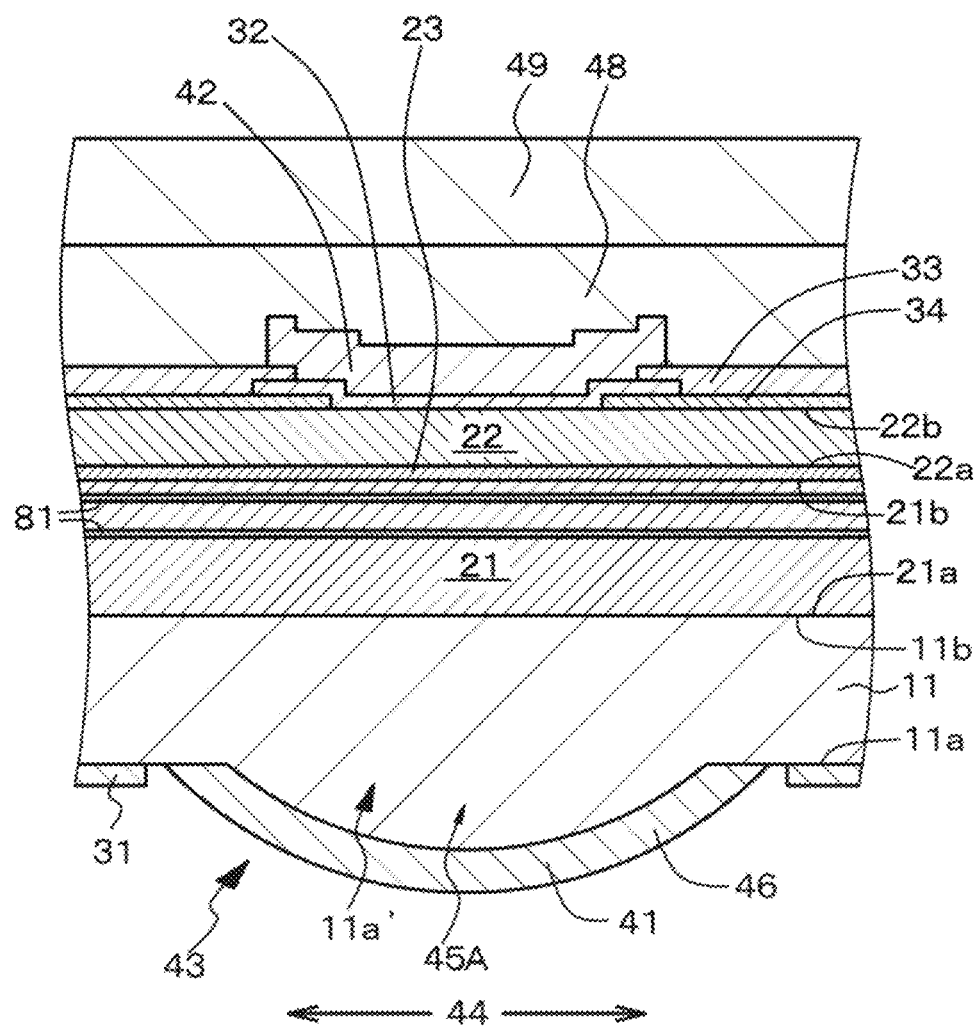
FIG. 34 is a schematic partial sectional view of a light emitting element of Embodiment 19.

In the light emitting element of Embodiment 19, as a schematic partial sectional view is depicted in FIG. 34, on the basis of the solder joining method, a second light reflection layer 42 is fixed to a support substrate 49, including a silicon semiconductor substrate, through a joining layer 48 including a gold (Au) layer or a solder layer containing tin (Sn).

The light emitting element of Embodiment 19 can be manufactured by a method similar to that for the light emitting element of Embodiment 1, except that twenty light absorbing material layers 81 are formed together in the inside of a first compound semiconductor layer 21, and except that a support substrate 49 is not removed.

While the present disclosure has been described above based on preferred embodiments, the present disclosure is not limited to these embodiments. The configurations and structures described in the embodiments are merely illustrative and can be modified, as required, and the method for manufacturing the light emitting element can also be modified, as required. In some cases, by suitably selecting the joining layer and the support substrate, it is possible to realize a surface emitting laser element that emits light from a top surface of a second compound semiconductor layer via a second light reflection layer.

Note that the present disclosure may take the following configurations.

[A01] «Light Emitting Element . . . First Mode»
A light emitting element including:
a compound semiconductor substrate;
a stacked structure including a GaN-based compound semiconductor;
a first light reflection layer; and
a second light reflection layer,
in which the stacked structure includes, in a stacked state
a first compound semiconductor layer that is formed on the compound semiconductor substrate and that has a first surface and a second surface opposite to the first surface,
an active layer facing the second surface of the first compound semiconductor layer, and
a second compound semiconductor layer that has a first surface facing the active layer and a second surface opposite to the first surface,
the first light reflection layer is disposed on the compound semiconductor substrate and has a concave mirror section,
the second light reflection layer is disposed on the second surface side of the second compound semiconductor layer and has a flat shape, and
the compound semiconductor substrate includes a low impurity concentration compound semiconductor substrate or a semi-insulating compound semiconductor substrate.

[A02]

The light emitting element according to [A01], in which the low impurity concentration compound semiconductor substrate has an impurity concentration of equal to or less than $5 \times 10^{17}/cm^3$.

[A03]

The light emitting element according to [A01] or [A02], in which the low impurity concentration compound semiconductor substrate includes a GaN substrate.

[A04]

The light emitting element according to any one of [A01] to [A03], in which the first compound semiconductor layer has an impurity concentration of equal to or less than $5 \times 10^{17}/cm^3$.

[A05]

The light emitting element according to any one of [A01] to [A03], in which an average impurity concentration of the impurity concentration of the low impurity concentration compound semiconductor substrate and the impurity concentration of the first compound semiconductor layer is equal to or less than $5 \times 10^{17}/cm^3$.

[A06]

The light emitting element according to any one of [A01] to [A05], in which let a sheet resistance of the first compound semiconductor layer be $R_1$, let a sheet resistance of the second compound semiconductor layer be $R_2$, and let a sheet resistance of a second electrode be $R_{EL-2}$, then $R_1 < R_2$ and $R_{EL-2} < R_2$ are satisfied.

[A07]

The light emitting element according to any one of [A01] to [A06], in which the second compound semiconductor layer has a thickness of equal to or less than $1 \times 10^{-5}$ m, and the second compound semiconductor layer has an impurity concentration of equal to or more than $5 \times 10^{17}/cm^3$.

[A08]

The light emitting element according to [A07], in which the second compound semiconductor layer is doped with at least one impurity selected from the group consisting of magnesium and zinc.

[A09]

The light emitting element according to any one of [A01] to [A08], in which the first compound semiconductor layer is doped with at least one impurity selected from the group consisting of silicon, germanium, oxygen, and carbon.

[B01] «Light Emitting Element . . . Second Mode»

A light emitting element including:

a stacked structure including a GaN-based compound semiconductor;

a first light reflection layer; and a second light reflection layer, in which the stacked structure includes, in a stacked state a first compound semiconductor layer that has a first surface and a second surface opposite to the second surface, an active layer facing the second surface of the first compound semiconductor layer, and a second compound semiconductor layer that has a first surface facing the active layer and a second surface opposite to the first surface, the first light reflection layer is disposed on the first surface of the first compound semiconductor layer and has a concave mirror section, the second light reflection layer is disposed on the second surface side of the second compound semiconductor layer and has a flat shape, and the first compound semiconductor layer has an impurity concentration of equal to or less than $5 \times 10^{17}/cm^3$.

[B02]

The light emitting element according to [B01], in which let a sheet resistance of the first compound semiconductor layer be $R_1$, let a sheet resistance of the second compound semiconductor layer be $R_2$, and let a sheet resistance of the second electrode be $R_{EL-2}$, then $R_1 < R_2$ and $R_{EL-2} < R_2$ are satisfied.

[B03]

The light emitting element according to [B01] or [B02], in which the first compound semiconductor layer has a thickness of equal to or more than $1 \times 10^{-5}$ m.

[B04]

The light emitting element according to any one of [B01] to [B03], in which the second compound semiconductor layer has a thickness of equal to or less than $1 \times 10^{-5}$ m, and the second compound semiconductor layer has an impurity concentration of equal to or more than $5 \times 10^{17}/cm^3$.

[B05]

The light emitting element according to [B04], in which the second compound semiconductor layer is doped with at least one impurity selected from the group consisting of magnesium and zinc.

[B06]

The light emitting element according to any one of [B01] to [B05], in which the first compound semiconductor layer is doped with at least one impurity selected from the group consisting of silicon, germanium, oxygen, and carbon.

A light emitting element according to a third mode of the present disclosure for achieving the above object is:

[C01] «Light Emitting Element . . . Third Mode»

A light emitting element including:

a stacked structure including a GaN-based compound semiconductor;

a first light reflection layer; and a second light reflection layer, in which the stacked structure includes, in a stacked state a first compound semiconductor layer that has a first surface and a second surface opposite to the first surface, an active layer facing the second surface of the first compound semiconductor layer, and a second compound semiconductor layer that has a first surface facing the active layer and a second surface opposite to the first surface, the first light reflection layer is disposed on the first surface side of the first compound semiconductor layer and has a concave mirror section, the second light reflection layer is disposed on the second surface side of the second compound semiconductor layer and has a flat shape, and the first compound semiconductor layer is formed with at least one low-resistance layer in parallel to a virtual plane occupied by the active layer.

[C02]

The light emitting element according to [C01], further including:

a first electrode and a second electrode, in which the second electrode is formed between the second light reflection layer and the second light reflection layer, the first compound semiconductor layer is formed with an opening that reaches the low-resistance layer, and the first electrode in contact with the low-resistance layer is formed in the opening.

[C03]

The light emitting element according to [C02], in which the first electrode is in contact with the low-resistance layer at a bottom portion of the opening, the bottom portion of the opening has a rugged shape, and when a base line that connects an axis passing through a center point of the first light reflection layer and a center point of the second light reflection layer with a center point of the bottom portion of the opening is drawn on the low-resistance layer, an angle formed between the base line and a direction in which a recessed portion and a projected portion of the rugged shape extend is 0 to 45 degrees.

[C04]

The light emitting element according to any one of [C01] to [C03], in which the low-resistance layer has a thickness of equal to or less than $1 \times 10^{-5}$ m.

[C05]

The light emitting element according to any one of [C01] to [C04], in which the impurity concentration of the low-resistance layer is higher than the impurity concentration of the first compound semiconductor layer.

[C06]

The light emitting element according to any one of [C01] to [C05], in which the low-resistance layer has an impurity concentration of equal to or more than $1 \times 10^{18}/cm^3$, and the first compound semiconductor layer has an impurity concentration of equal to or less than $5 \times 10^{17}/cm^3$.

[C07]

The light emitting element according to any one of [C01] to [C06], in which the low-resistance layer is doped with at least one impurity selected from the group consisting of silicon, germanium, oxygen, and carbon.

[C08]

The light emitting element according to any one of [C01] to [C04], in which the first compound semiconductor layer is formed on a compound semiconductor substrate, and the impurity concentration of the low-resistance layer is higher than the average impurity concentration of the first compound semiconductor layer and the compound semiconductor substrate.

[C09]

The light emitting element according to [C08], in which the low-resistance layer has an impurity concentration of equal to or more than $1 \times 10^{18}/cm^3$, and the first compound semiconductor layer and the compound semiconductor substrate have an average impurity concentration of equal to or less than $5 \times 10^{17}/cm^3$.

[C10]

The light emitting element according to [C08] or [C09], in which the low-resistance layer, the first compound semiconductor layer, and the compound semiconductor substrate are doped with at least one impurity selected from the group consisting of silicon, germanium, oxygen, and carbon.

[C11]

The light emitting element according to any one of [C01] to [C10], in which the low-resistance layer includes a GaN-based compound semiconductor material, and the GaN-based compound semiconductor material constituting the first compound semiconductor layer and the GaN-based compound semiconductor material constituting the low-resistance layer are different in composition.

[C12]

The light emitting element according to [C11], in which bandgap of the GaN-based compound semiconductor material constituting the low-resistance layer is narrower than bandgap of the GaN-based compound semiconductor material constituting the first compound semiconductor layer.

[C13]

The light emitting element according to any one of [C01] to [C12], in which the low-resistance layer is located at a minimum amplitude portion generated in a standing wave of light formed inside the stacked structure.

[C14]

The light emitting element according to any one of [C04] to [C13], in which an active layer is located at a maximum amplitude portion generated in a standing wave of light formed inside the stacked structure.

[C15]

The light emitting element according to [C01], further including:

a first electrode and a second electrode, in which the first compound semiconductor layer is formed with at least two low-resistance layers, the first compound semiconductor layer is formed with an opening ranging over the at least two low-resistance layers, and the first electrode in contact with the at least two low-resistance layers is formed in the opening.

[C16]

The light emitting element according to [C15], in which the first electrode is in contact with one layer of the low-resistance layers at a bottom portion of the opening, the first electrode is in contact with other layer of the low-resistance layers at a side surface of the opening, the bottom portion of the opening has a rugged shape, and when a base line that connects an axis passing through a center point of the first light reflection layer and a center point of the second light reflection layer with a center point of the bottom portion of the opening is drawn on the low-resistance layer, the angle formed between the base line and a direction in which a recessed portion and a projected portion of the rugged shape extend is 0 to 45 degrees.

[C17]

The light emitting element according to [C15] or [C16], in which let an oscillation wavelength be $\lambda_0$, let an equivalent refractive index of the plurality of low-resistance layers and that part of the first compound semiconductor layer which is located between the low-resistance layer and the low-resistance layer be $n_{1\text{-}eq}$, then the thickness of the low-resistance layer is equal to or less than $\lambda_0/(4 \cdot n_{1\text{-}eq})$.

[C18]

The light emitting element according to any one of [C15] to [C17], in which let a distance between the low-resistance layer and the low-resistance layer be $L_{HCL}$, then $$0.9 \times \{(m \cdot \lambda_0)/(2 \cdot n_{1\text{-}eq})\} \le L_{HCL} \le 1.1 \times \{(m \cdot \lambda_0)/(2 \cdot n_{1\text{-}eq})\}$$

is satisfied, where m is 1, or 2 or more any integer including 1.

[C19]

The light emitting element according to any one of [C15] to [C18], in which the low-resistance layer has a thickness of equal to or less than $1 \times 10^{-5}$ m.

[C20]

The light emitting element according to any one of [C15] to [C19], in which the impurity concentration of the low-resistance layer is higher than the impurity concentration of the first compound semiconductor layer.

[C21]

The light emitting element according to any one of [C15] to [C20], in which the low-resistance layer has an impurity concentration of equal to or more than $1\times10^{18}/cm^3$, and the first compound semiconductor layer has an impurity concentration of equal to or less than $5\times10^{17}/cm^3$.

[C22]

The light emitting element according to [C20] or [C21], in which the low-resistance layer is doped with at least one impurity selected from the group consisting of silicon, germanium, oxygen, and carbon.

[C23]

The light emitting element according to any one of [C15] to [C19], in which the first compound semiconductor layer is formed on a compound semiconductor substrate, and the impurity concentration of the low-resistance layer is higher than the average impurity concentration of the first compound semiconductor layer and the compound semiconductor substrate.

[C24]

The light emitting element according to [C23], in which the low-resistance layer has an impurity concentration of equal to or more than $1\times10^{18}/cm^3$, and the first compound semiconductor layer and the compound semiconductor substrate have an average impurity concentration of equal to or less than $5\times10^{17}/cm^3$.

[C25]

The light emitting element according to [C23] or [C24], in which the low-resistance layer, the first compound semiconductor layer, and the compound semiconductor substrate are doped with at least one impurity selected from the group consisting of silicon, germanium, oxygen, and carbon.

[C26]

The light emitting element according to any one of [C15] to [C25], in which the low-resistance layer includes a GaN-based compound semiconductor material, and the GaN-based compound semiconductor material constituting the first compound semiconductor layer and the GaN-based compound semiconductor material constituting the low-resistance layer are different in composition.

[C27]

The light emitting element according to [C26], in which the bandgap of the GaN-based compound semiconductor material constituting the low-resistance layer is narrower than the bandgap of the GaN-based compound semiconductor material constituting the first compound semiconductor layer.

[C28]

The light emitting element according to any one of [C15] to [C27], in which the low-resistance layer is located at a minimum amplitude portion generated in a standing wave of light formed inside the stacked structure.

[C29]

The light emitting element according to any one of [C15] to [C28], in which the active layer is located at a maximum amplitude portion generated in a standing wave of light formed inside the stacked structure.

[D01]

The light emitting element according to any one of [C01] to [C29], in which the stacked structure including the GaN-based compound semiconductor is formed on a compound semiconductor substrate, and the compound semiconductor substrate includes a low impurity concentration compound semiconductor substrate or a semi-insulating compound semiconductor substrate.

[D02]

The light emitting element according to [D01], in which the low impurity concentration compound semiconductor substrate has an impurity concentration of equal to or less than $5\times10^{17}/cm^3$.

[D03]

The light emitting element according to [D01] or [D02], in which the low impurity concentration compound semiconductor substrate includes a GaN substrate.

[D04]

The light emitting element according to any one of [D01] to [D03], in which the first compound semiconductor layer has an impurity concentration of equal to or less than $5\times10^{17}/cm^3$.

[D05]

The light emitting element according to any one of [D01] to [D03], in which an average impurity concentration of the impurity concentration of the low impurity concentration compound semiconductor substrate and the impurity concentration of the first compound semiconductor layer is equal to or less than $5\times10^{17}/cm^3$.

[D06]

The light emitting element according to any one of [D01] to [D05], in which let a sheet resistance of the first compound semiconductor layer be $R_1$, let a sheet resistance of the second compound semiconductor layer be $R_2$, and let a sheet resistance of the second electrode be $R_{EL-2}$, then $R_1 < R_2$ and $R_{EL-2} < R_2$ are satisfied.

[D07]

The light emitting element according to any one of [D01] to [D06], in which the first compound semiconductor layer has a thickness of equal to or more than $1\times10^{-5}$ m.

[D08]

The light emitting element according to any one of [D01] to [D07], in which the second compound semiconductor layer has a thickness of equal to or less than $1\times10^{-5}$ m, and the second compound semiconductor layer has an impurity concentration of equal to or more than $5\times10^{17}/cm^3$.

[D09]

The light emitting element according to [D08], in which the second compound semiconductor layer is doped with at least one impurity selected from the group consisting of magnesium and zinc.

[D10]

The light emitting element according to any one of [D01] to [D09], in which the first compound semiconductor layer is doped with at least one impurity selected from the group consisting of silicon, germanium, oxygen, and carbon.

[D11]

The light emitting element according to any one of [C01] to [C29], in which the first compound semiconductor layer has an impurity concentration of equal to or less than $5\times10^{17}/cm^3$.

[D12]

The light emitting element according to [D11], in which let a sheet resistance of the first compound semiconductor layer be $R_1$, let a sheet resistance of the second compound semiconductor layer be $R_2$, and let a sheet resistance of the second electrode be $R_{EL-2}$, then $R_1 < R_2$ and $R_{EL-2} < R_2$ are satisfied.

[D13]

The light emitting element according to [D11] or [D12], in which the first compound semiconductor layer has a thickness of equal to or more than $1\times10^{-5}$ m.

[D14]

The light emitting element according to any one of [D11] to [D13], in which the second compound semiconductor layer has a thickness of equal to or less than $1\times10^{-5}$ m, and the second compound semiconductor layer has an impurity concentration of equal to or more than $5\times10^{17}/cm^3$.

[D15]

The light emitting element according to [D14], in which the second compound semiconductor layer is doped with at least one impurity selected from the group consisting of magnesium and zinc.

[D16]

The light emitting element according to any one of [D11] to [D15], in which the first compound semiconductor layer is doped with at least one impurity selected from the group consisting of silicon, germanium, oxygen, and carbon.

[E01]

The light emitting element according to any one of [A01] to [D16], in which let a cavity length be $L_{OR}$, then $1\times10^{-5}$ m$\leq L_{OR}$ is satisfied.

[E02]

The light emitting element according to any one of [A01] to [E01], in which a figure drawn by an interface, facing the stacked structure (specifically, the first compound semiconductor layer), of a part of the concave mirror section of the first light reflection layer when the first light reflection layer is cut along a virtual plane including the stacking direction of the stacked structure, is a part of a circle or a part of a parabola.

[E03]

The light emitting element according to any one of [A01] to [E02], in which the second compound semiconductor layer is provided with a current injection region and a current non-injection region surrounding the current injection region, and a shortest distance $D_{CI}$ from an area center of gravity of the current injection region to a boundary between the current injection region and the current non-injection region satisfies the following formula:

$$D_{CI} \geq \omega_0/2$$

provided that $$\omega_0^2 = (\lambda_0/\pi)\{L_{OR}(R_{DBR}-L_{OR})\}^{1/2}$$

where $\lambda_0$: wavelength of light mainly emitted from light emitting element $L_{OR}$: cavity length $R_{DBR}$: radius of curvature of concave mirror section of first light reflection layer.

[E04]

The light emitting element according to [E03], further including:

a mode loss action part that is provided on the second surface of the second compound semiconductor layer and that constitutes a mode loss action region acting on variation in oscillation mode loss;

a second electrode formed over a range of a position on the second surface of the second compound semiconductor layer to a position on the mode loss action part; and a first electrode electrically connected to the first compound semiconductor layer, in which the second light reflection layer is formed on the second electrode, the stacked structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

[E05]

The light emitting element according to [E03], in which a radius $r'_{DBR}$ of an effective region in the concave mirror section of the first light reflection layer satisfies $$\omega_0 \leq r'_{DBR} \leq 20\cdot\omega_0.$$

[E06]

The light emitting element according to [E03], in which $D_{CI} \geq \omega_0$ is satisfied.

[E07]

The light emitting element according to [E03], in which $R_{DBR} \leq 1\times10^{-3}$ m is satisfied.

[E08] «Light Emitting Element of Second Configuration»

The light emitting element according to any one of [A01] to [E02], further including:

a mode loss action part that is provided on the second surface of the second compound semiconductor layer and that constitutes a mode loss action region acting on variation in oscillation mode loss;

a second electrode formed over a range of a position on the second surface of the second compound semiconductor layer to a position on the mode loss action part; and a first electrode electrically connected to the first compound semiconductor layer, in which the second light reflection layer is formed on the second electrode, the stacked structure is formed with a current injection region, a current non-injection inside region surrounding the current injection region, and a current non-injection outside region surrounding the current non-injection inside region, and an orthogonal projection image of the mode loss action region and an orthogonal projection image of the current non-injection outside region overlap with each other.

[E09]

The light emitting element according to [E08], in which the current non-injection outside region is located on a lower side of the mode loss action region.

[E10]

The light emitting element according to [E08] or [E09], in which let an area of the orthogonal projection image of the current injection region be $S_1$ and let an area of the orthogonal projection image of the current non-injection inside region be $S_2$, then $$0.01 \leq S_1/(S_1+S_2) \leq 0.7$$

is satisfied.

[E11]

The light emitting element according to any one of [E08] to [E10], in which the current non-injection inside region and the current non-injection outside region are formed by ion injection into the stacked structure.

[E12]

The light emitting element according to [E11], in which ion species is at least one kind of ion selected from the group consisting of boron, proton, phosphorus, arsenide, carbon, nitrogen, fluorine, oxygen, germanium, and silicon.

[E13] «Light Emitting Element of (2-B)th Configuration»

The light emitting element according to any one of [E08] to [E12], in which the current non-injection inside region and the current non-injection outside region are formed by irradiation with plasma of the second surface of the second compound semiconductor layer, or an ashing treatment of the second surface of the second compound semiconductor layer, or a reactive ion etching treatment of the second surface of the second compound semiconductor layer.

[E14] «Light Emitting Element of (2-C)th Configuration»

The light emitting element according to any one of [E08] to [E13], in which the second light reflection layer has a region that reflects or scatters the light from the first light reflection layer toward an outside of a resonator structure including the first light reflection layer and the second light reflection layer.

[E15]

The light emitting element according to any one of [E11] to [E14], in which let an optical distance from the active layer in the current injection region to the second surface of the second compound semiconductor layer be $L_2$ and let an optical distance from the active layer in the mode loss action region to a top surface of the mode loss action part be $L_0$, then $$L_0 > L_2$$

is satisfied.

[E16]

The light emitting element according to any one of [E11] to [E15], in which light having a higher order mode generated is dissipated by the mode loss action region toward the outside of the resonator structure including the first light reflection layer and the second light reflection layer, whereby oscillation mode loss is increased.

[E17]

The light emitting element according to any one of [E11] to [E16], in which the mode loss action part includes a dielectric material, a metallic material, or an alloy material.

[E18]

The light emitting element according to [E17],
in which the mode loss action part includes a dielectric material, and
an optical thickness of the mode loss action part is deviated from an integer times of ¼ of the wavelength of the light generated in the light emitting element.

[E19]

The light emitting element according to [E17],
in which the mode loss action part includes a dielectric material, and
an optical thickness of the mode loss action part is an integer times of ¼ of the wavelength of the light generated in the light emitting element.

[E20] «Light Emitting Element of (2-D)th Configuration»

The light emitting element according to any one of [E08] to [E10],
in which a projected portion is formed on the second surface side of the second compound semiconductor layer, and
the mode loss action part is formed on that region of the second surface of the second compound semiconductor layer which surrounds the projected portion.

[E21]

The light emitting element according to [E20], in which let an optical distance from the active layer in the current injection region to the second surface of the second compound semiconductor layer be $L_2$ and let an optical distance from the active layer in the mode loss action region to a top surface of the mode loss action part be $L_0$, then $$L_0 < L_2$$

is satisfied.

[E22]

The light emitting element according to [E20] or [E21], in which light having a higher order mode generated is confined in the current injection region and the current non-injection inside region by the mode loss action region, whereby oscillation mode loss is reduced.

[E23]

The light emitting element according to any one of [E20] to [E22], in which the mode loss action part includes a dielectric material, a metallic material, or an alloy material.

[E24]

The light emitting element according to any one of [E08] to [E23], in which the second electrode includes a transparent conductive material.

[E25] «Light Emitting Element of Third Configuration»

The light emitting element according to any one of [A01] to [E02], further including:
a second electrode formed on the second surface of the second compound semiconductor layer;
a second light reflection layer formed on the second electrode;
a mode loss action part that is provided on the first surface of the first compound semiconductor layer and that constitutes a mode loss action region acting on variation in oscillation mode loss; and
a first electrode electrically connected to the first compound semiconductor layer,
in which the first light reflection layer is formed over a range of a position on the first surface of the first compound semiconductor layer to a position on the mode loss action part,
the stacked structure is formed with a current injection region, a current non-injection inside region surrounding the current injection region, and a current non-injection outside region surrounding the current non-injection inside region, and
an orthogonal projection image of the mode loss action region and an orthogonal projection image of the current non-injection outside region overlap with each other.

[E26]

The light emitting element according to [E25], in which let an area of the orthogonal projection image of the current injection region be $S_1$ and let an area of the orthogonal projection image of the current non-injection inside region be $S_2$, then $$0.01 \leq S_1'/(S_1'+S_2') \leq 0.7$$

is satisfied.

[E27] «Light Emitting Element of (3-A)th Configuration»

The light emitting element according to [E25] or [E26], in which the current non-injection inside region and the current non-injection outside region are formed by ion injection into the stacked structure.

[E28]

The light emitting element according to [E27], in which the species is at least one kind of ion selected from the group consisting of boron, proton, phosphorus, arsenide, carbon, nitrogen, fluorine, oxygen, germanium, and silicon.

[E29] «Light Emitting Element of (3-B)th Configuration»

The light emitting element according to any one of [E25] to [E28], in which the current non-injection inside region and the current non-injection outside region are formed by irradiation with plasma of the second surface of the second compound semiconductor layer, or an ashing treatment of the second surface of the second compound semiconductor layer, or a reactive ion etching treatment of the second surface of the second compound semiconductor layer.

[E30] «Light Emitting Element of (3-C)th Configuration»

The light emitting element according to any of [E25] to [E29], in which the second light reflection layer has a region that reflects or scatters the light from the first light reflection layer toward an outside of a resonator structure including the first light reflection layer and the second light reflection layer. [E31]

The light emitting element according to any one of [E27] to [E30], in which let an optical distance from the active layer in the current injection region to the first surface of the first compound semiconductor layer be $L_1'$ and let an optical distance from the active layer in the mode loss action region to a top surface of the mode loss action part be $L_0'$, then $$L_0' > L_1'$$

is satisfied.

[E32]

The light emitting element according to any one of [E27] to [E31], in which light having a higher order mode generated is dissipated by the mode loss action region toward the outside of the resonator structure including the first light reflection layer and the second light reflection layer, whereby oscillation mode loss is increased.

[E33]

The light emitting element according to any one of [E27] to [E32], in which the mode loss action part includes a dielectric material, a metallic material, or an alloy material.

[E34]

The light emitting element according to [E33], in which the mode loss action part includes a dielectric material, and an optical thickness of the mode loss action part is deviated from an integer times of ¼ of the wavelength of the light generated in the light emitting element.

[E35]

The light emitting element according to [E33], in which the mode loss action part may include a dielectric material, and an optical thickness of the mode loss action part is an integer times of ¼ of the wavelength of the light generated in the light emitting element.

[E36] «Light Emitting Element of (3-D)th Configuration»

The light emitting element according to [E25] or [E26], in which a projected portion is formed on the first surface side of the first compound semiconductor layer, and the mode loss action part is formed on that region of the first surface of the first compound semiconductor layer which surrounds the projected portion.

[E37]

The light emitting element according to [E36], in which let an optical distance from the active layer in the current injection region to the first surface of the first compound semiconductor layer be $L_1'$ and let an optical distance from the active layer in the mode loss action region to a top surface of the mode loss action part be $L_0'$, then $$L_0' < L_1'$$

is satisfied.

[E38]

The light emitting element according to [E25] or [E26], in which a projected portion is formed on the first surface side of the first compound semiconductor layer, and the mode loss action part includes that region of the first surface of the first compound semiconductor layer which surrounds the projected portion.

[E39]

The light emitting element according to any one of [E36] to [E38], in which light having a higher order mode generated is confined in the current injection region and the current non-injection inside region by the mode loss action region, whereby oscillation mode loss is reduced.

[E40]

The light emitting element according to any one of [E36] to [E39], in which the mode loss action part includes a dielectric material, a metallic material, or an alloy material.

[E41]

The light emitting element according to any one of [E25] to [E40], in which the second electrode includes a transparent conductive material.

[E42] «Light Emitting Element of Fourth Configuration»

The light emitting element according to any one of [A01] to [E41], in which the stacked structure including a second electrode is formed with at least two light absorbing material layers in parallel to a virtual plane occupied by the active layer.

[E43]

The light emitting element according to [E42], in which at least four light absorbing material layers are formed.

[E44]

The light emitting element according to [E42] or [E43], in which let an oscillation wavelength be $\lambda_0$, let an equivalent refractive index of the whole body of the two light absorbing material layers and that part of the stacked structure which is located between the light absorbing material layer and the light absorbing material layer be $n_{eq}$, and let a distance between the light absorbing material layer and the light absorbing material layer be $L_{Abs}$, then $$0.9 \times \{(m \cdot \lambda_0)/(2 \cdot n_{eq})\} \leq L_{Abs} \leq 1.1 \times \{(m \cdot \lambda_0)/(2 \cdot n_{eq})\}$$

is satisfied, where m is 1, or is 2 or more any integer including 1.

[E45]

The light emitting element according to any one of [E42] to [E44], in which a thickness of the light absorbing material layer is equal to or less than $\lambda_0/(4 \cdot n_{eq})$.

[E46]

The light emitting element according to any one of [E42] to [E45], in which the light absorbing material layers are located at a minimum amplitude portion generated in a standing wave of light formed inside the stacked structure.

[E47]

The light emitting element according to any one of [E42] to [E46], in which the active layer is located at a maximum amplitude portion generated in a standing wave of light formed inside the stacked structure.

[E48]

The light emitting element according to any one of [E42] to [E47], in which the light absorbing material layer has a light absorption coefficient of equal to or more than two times the light absorption coefficient of the compound semiconductor constituting the stacked structure.

[E49]

The light emitting element according to any one of [E42] to [E48], in which the light absorbing material layer includes at least one material selected from the group consisting of a compound semiconductor material narrower in bandgap than the compound semiconductor constituting the stacked structure, a compound semiconductor material doped with an impurity, a transparent conductive material, and a light reflection layer constituent material having a light absorbing characteristic.

[E50]

The light emitting element according to any one of [A01] to [E49], in which a compound semiconductor substrate is disposed between the first surface of the first compound semiconductor layer and the first light reflection layer.

[E51]

The light emitting element according to [E50], in which the compound semiconductor substrate includes a GaN substrate.

[E52]

The light emitting element according to any one of [A01] to [E51], in which the concave mirror section of the first light reflection layer includes a base section including a projected portion of the compound semiconductor substrate, and a multilayer light reflection film formed on a surface of at least a part of the base section.

[E53]

The light emitting element according to any one of [A01] to [E51], in which the concave mirror section of the first light reflection layer includes a base section formed on the compound semiconductor substrate, and a multilayer light reflection film formed on a surface of at least a part of the base section.

[E54]

The light emitting element according to any one of [A01] to [E49], in which the first light reflection layer is formed on the first surface of the first compound semiconductor layer.

[E55]

The light emitting element according to any one of [A01] to [E54], in which a value of thermal conductivity of the stacked structure is higher than a value of thermal conductivity of the first light reflection layer.

[E56]

The light emitting element according to any one of [A01] to [E55], in which let the radius of curvature of the concave mirror section of the light emitting element be $R_{DBR}$, then $R_{DBR} \leq 1 \times 10^{-3}$ m is satisfied.

[E57]

The light emitting element according to any one of [A01] to [E56], in which a protuberant portion is formed in a periphery of the first light reflection layer, and the first light reflection layer does not protrude from the protuberant portion.

REFERENCE SIGNS LIST

11 . . . Compound semiconductor substrate (Light emitting element production substrate), 11$a$ . . . First surface of compound semiconductor substrate (light emitting element production substrate) that faces first compound semiconductor layer, 11$a'$ . . . Projected portion of first surface of compound semiconductor substrate, 11$a''$ . . . Recess, 11$b$ . . . Second surface of compound semiconductor substrate (light emitting element production substrate) that faces first compound semiconductor layer, 11A . . . Protuberant portion, 20 . . . Stacked structure, 21 . . . First compound semiconductor layer, 21$a$ . . . First surface of first compound semiconductor layer, 21$b$ . . . Second surface of first compound semiconductor layer, 21$d$, 21$e$ . . . Projected portion of first surface of first compound semiconductor layer, 22 . . . Second compound semiconductor layer, 22$a$ . . . First surface of second compound semiconductor layer, 22$b$ . . . Second surface of second compound semiconductor layer, 23 . . . Active layer (Light emitting layer), 31, 131 . . . First electrode, 131' . . . First electrode extension section, 32, 132 . . . Second electrode, 33 . . . Pad electrode, 34 . . . Insulating layer (Current constriction layer), 34A . . . Opening provided in insulating layer (current constriction layer), 41 . . . First light reflection layer, 42 . . . Second light reflection layer, 42A . . . Normally tapered inclined section formed in second light reflection layer, 43 . . . Concave mirror section, 43A . . . Recess, 43$a$ . . . Interface, facing stacked structure, of effective region in concave mirror section of first light reflection layer, 44 . . . Effective region in concave mirror section of first light reflection layer, 45A, 45B, 45D, 45E, 45F . . . Base section, 45$c$ . . . Projected portion, 46 . . . Multilayer light reflection film, 47 . . . Planarization film, 48 . . . Joining layer, 49 . . . Support substrate, 51, 61 . . . Current injection region, 52, 62 . . . Current non-injection inside region, 53, 63 . . . Current non-injection outside region, 54, 64 . . . Mode loss action part (Mode loss action layer), 54A, 54B, 64A . . . Opening formed in mode loss action part, 55, 65 . . . Mode loss action region, 71, 71A, 71B . . . Low-resistance layer, 72 . . . Opening, 73 . . . Bottom portion of opening, 81 . . . Light absorbing material layer

The invention claimed is:

1. A light emitting element comprising:
a compound semiconductor substrate;
a stacked structure including a GaN-based compound semiconductor;
a first light reflection layer; and
a second light reflection layer,
wherein the stacked structure includes, in a stacked state
a first compound semiconductor layer that is formed on the compound semiconductor substrate and that has a first surface and a second surface opposite to the first surface,
an active layer facing the second surface of the first compound semiconductor layer, and
a second compound semiconductor layer that has a first surface facing the active layer and a second surface opposite to the first surface,
the first light reflection layer is disposed on the compound semiconductor substrate and has a concave mirror section,
the second light reflection layer is disposed on the second surface side of the second compound semiconductor layer and has a flat shape, and
the compound semiconductor substrate includes a low impurity concentration compound semiconductor substrate or a semi-insulating compound semiconductor substrate,
wherein the second compound semiconductor layer is provided with a current injection region and a current non-injection region surrounding the current injection region, and
a shortest distance $D_{CI}$ from an area center of gravity of the current injection region to a boundary between the current injection region and the current non-injection region satisfies the following formula:

$D_{CI} \geq \omega_0/2$ provided that $\omega_0^2 = (\lambda_0/\pi)\{L_{OR}(R_{DBR}-L_{OR})\}^{1/2}$ where $\lambda_0$: wavelength of light mainly emitted from light emitting element $L_{OR}$: cavity length $R_{DBR}$: radius of curvature of concave mirror section of first light reflection layer.

2. The light emitting element according to claim 1, wherein the low impurity concentration compound semiconductor substrate has an impurity concentration of equal to or less than $5 \times 10^{17}/\text{cm}^3$.

3. The light emitting element according to claim 1, wherein the semi-insulating compound semiconductor substrate includes an indium-phosphorus substrate that contains iron atoms.

4. The light emitting element according to claim 1, further comprising:
   a mode loss action part that is provided on the second surface of the second compound semiconductor layer and that constitutes a mode loss action region acting on variation in oscillation mode loss;
   a second electrode formed over a range of a position on the second surface of the second compound semiconductor layer to a position on the mode loss action part; and
   a first electrode electrically connected to the first compound semiconductor layer,
   wherein the second light reflection layer is formed on the second electrode,
   the stacked structure is formed with a current injection region, a current non-injection inside region surrounding the current injection region, and a current non-injection outside region surrounding the current non-injection inside region, and
   an orthogonal projection image of the mode loss action region and an orthogonal projection image of the current non-injection outside region overlap with each other.

5. A light emitting element comprising:
   a stacked structure including a GaN-based compound semiconductor;
   a first light reflection layer; and
   a second light reflection layer,
   wherein the stacked structure includes, in a stacked state
      a first compound semiconductor layer that has a first surface and a second surface opposite to the second surface,
      an active layer facing the second surface of the first compound semiconductor layer, and
      a second compound semiconductor layer that has a first surface facing the active layer and a second surface opposite to the first surface,
   the first light reflection layer is disposed on the first surface of the first compound semiconductor layer and has a concave mirror section,
   the second light reflection layer is disposed on the second surface side of the second compound semiconductor layer and has a flat shape, and
   the first compound semiconductor layer has an impurity concentration of equal to or less than $5 \times 10^{17}/\text{cm}^3$, wherein let a sheet resistance of the first compound semiconductor layer be $R_1$, let a sheet resistance of the second compound semiconductor layer be $R_2$, and let a sheet resistance of a second electrode be $R_{EL\text{-}2}$, then $R_1 < R_2$ and $R_{EL\text{-}2} < R_2$ are satisfied.

6. The light emitting element according to claim 5, wherein the first compound semiconductor layer has a thickness of equal to or less than $1 \times 10^{-5}$ m.

7. The light emitting element according to claim 5,
   wherein the second compound semiconductor layer has a thickness of equal to or less than $1 \times 10^{-5}$ m, and
   the second compound semiconductor layer has an impurity concentration of equal to or more than $5 \times 10^{17}/\text{cm}^3$.

8. A light emitting element comprising:
   a compound semiconductor substrate;
   a stacked structure including a GaN-based compound semiconductor;
   a first light reflection layer; and
   a second light reflection layer,
   wherein the stacked structure includes, in a stacked state
      a first compound semiconductor layer that is formed on the compound semiconductor substrate and that has a first surface and a second surface opposite to the first surface,
      an active layer facing the second surface of the first compound semiconductor layer, and
      a second compound semiconductor layer that has a first surface facing the active layer and a second surface opposite to the first surface,
   the first light reflection layer is disposed on the compound semiconductor substrate and has a concave mirror section,
   the second light reflection layer is disposed on the second surface side of the second compound semiconductor layer and has a flat shape, and
   the compound semiconductor substrate includes a low impurity concentration compound semiconductor substrate or a semi-insulating compound semiconductor substrate, wherein the light emitting element further comprising:
   a mode loss action part that is provided on the second surface of the second compound semiconductor layer and that constitutes a mode loss action region acting on variation in oscillation mode loss;
   a second electrode formed over a range of a position on the second surface of the second compound semiconductor layer to a position on the mode loss action part; and
   a first electrode electrically connected to the first compound semiconductor layer,
   wherein the second light reflection layer is formed on the second electrode,
   the stacked structure is formed with a current injection region, a current non-injection inside region surrounding the current injection region, and a current non-injection outside region surrounding the current non-injection inside region, and
   an orthogonal projection image of the mode loss action region and an orthogonal projection image of the current non-injection outside region overlap with each other.

* * * * *